(12) United States Patent
Almogy et al.

(10) Patent No.: US 9,353,973 B2
(45) Date of Patent: May 31, 2016

(54) CONCENTRATING PHOTOVOLTAIC-THERMAL SOLAR ENERGY COLLECTOR

(71) Applicant: Cogenra Solar, Inc., Mountain View, CA (US)

(72) Inventors: Gilad Almogy, Palo Alto, CA (US); Ratson Morad, Palo Alto, CA (US); Radu Constantin Raduta, Mountain View, CA (US); Brian Edward Atchley, Oakland, CA (US); Joseph Isaac Lichy, San Jose, CA (US); Amir Arie Weiss, Sunnyvale, CA (US)

(73) Assignee: SunPower Corporation, San Jose, CA (US)

(*) Notice: Subject to any disclaimer, the term of this patent is extended or adjusted under 35 U.S.C. 154(b) by 313 days.

(21) Appl. No.: 14/252,374

(22) Filed: Apr. 14, 2014

(65) Prior Publication Data

US 2014/0216523 A1 Aug. 7, 2014

Related U.S. Application Data

(63) Continuation of application No. 12/774,436, filed on May 5, 2010, now abandoned.

(51) Int. Cl.
*H01L 31/00* (2006.01)
*F24J 2/48* (2006.01)
(Continued)

(52) U.S. Cl.
CPC .. *F24J 2/485* (2013.01); *F24J 2/07* (2013.01); *F24J 2/1047* (2013.01); *F24J 2/202* (2013.01); *F24J 2/38* (2013.01); *F24J 2/4647* (2013.01); *F24J 2/51* (2013.01); *H01L 31/02013* (2013.01); *H01L 31/042* (2013.01); *H01L 31/044* (2014.12); *H01L 31/0521* (2013.01); *H01L 31/0525* (2013.01); *H01L 31/0547* (2014.12); *H02S 40/34* (2014.12); *F24J 2002/0092* (2013.01); *F24J 2002/4669* (2013.01);
(Continued)

(58) Field of Classification Search
CPC ........... F24J 2/14; F24J 2/5242; F24J 2/5233; F24J 2/541; H01L 31/0547; H01L 31/0521; H01L 31/0525; G02B 7/1822; Y02E 10/45; Y02E 10/52; Y02E 10/47
See application file for complete search history.

(56) References Cited

U.S. PATENT DOCUMENTS 3,490,950 A 1/1970 Myer
3,769,091 A 10/1973 Leinkram et al.
(Continued)

FOREIGN PATENT DOCUMENTS

WO 99-42765 8/1999
WO 03022578 A1 3/2003
(Continued)

OTHER PUBLICATIONS

SkyTrough Parabolic Trough Concentrator, (brochure), 2009, 2 pgs., www.SkyFuel.com.
(Continued)

*Primary Examiner* — Matthew Martin
(74) *Attorney, Agent, or Firm* — Innovation Counsel LLP

(57) ABSTRACT

Systems, methods, and apparatus by which solar energy may be collected to provide electricity or a combination of heat and electricity are disclosed herein. Examples of solar energy receivers are disclosed that may be used to collect concentrated solar radiation.

22 Claims, 30 Drawing Sheets

(51) Int. Cl.

| | | |
|---|---|---|
| *F24J 2/07* | (2006.01) | |
| *F24J 2/10* | (2006.01) | |
| *F24J 2/20* | (2006.01) | |
| *F24J 2/46* | (2006.01) | |
| *F24J 2/51* | (2006.01) | |
| *H01L 31/02* | (2006.01) | |
| *H01L 31/042* | (2014.01) | |
| *H01L 31/052* | (2014.01) | |
| *F24J 2/38* | (2014.01) | |
| *H01L 31/054* | (2014.01) | |
| *H02S 40/34* | (2014.01) | |
| *H01L 31/044* | (2014.01) | |
| *F24J 2/00* | (2014.01) | |

(52) U.S. Cl.
CPC  *Y02E10/41* (2013.01); *Y02E 10/44* (2013.01); *Y02E 10/52* (2013.01)

(56) References Cited

U.S. PATENT DOCUMENTS

| | | | |
|---|---|---|---|
| 3,988,166 A | | 10/1976 | Beam |
| 4,002,031 A | | 1/1977 | Bell |
| 4,078,544 A | | 3/1978 | Hollands et al. |
| 4,097,309 A | | 6/1978 | Horne |
| 4,178,913 A | | 12/1979 | Hutchison |
| 4,180,414 A | | 12/1979 | Diamond et al. |
| 4,243,019 A | | 1/1981 | Severson |
| 4,249,514 A | | 2/1981 | Jones |
| 4,281,900 A | | 8/1981 | Lewis, Jr. |
| 4,296,737 A | | 10/1981 | Silk |
| 4,332,238 A | | 6/1982 | Garcia, Jr. |
| 4,337,758 A | | 7/1982 | Meinel et al. |
| 4,351,319 A | | 9/1982 | Robbins, Jr. |
| 4,361,717 A | | 11/1982 | Gilmore et al. |
| 4,386,600 A | | 6/1983 | Eggert, Jr. |
| 4,388,481 A | | 6/1983 | Uroshevich |
| 4,422,443 A | | 12/1983 | Arendt |
| 4,422,893 A | | 12/1983 | Duchateau et al. |
| 4,427,838 A | | 1/1984 | Goldman |
| 4,435,043 A | | 3/1984 | Mertens et al. |
| 4,454,371 A | * | 6/1984 | Folino .................. F24J 2/1047 126/689 |
| 4,719,904 A | | 1/1988 | O'Neill |
| 4,771,764 A | | 9/1988 | Cluff |
| 4,846,151 A | | 7/1989 | Simko, Jr. |
| 4,877,959 A | | 10/1989 | Page |
| 5,054,466 A | | 10/1991 | White et al. |
| 5,191,876 A | | 3/1993 | Atchley |
| 5,232,519 A | | 8/1993 | Glatfelter et al. |
| 5,253,637 A | | 10/1993 | Maiden |
| 5,344,497 A | | 9/1994 | Fraas et al. |
| 5,401,329 A | | 3/1995 | Fraas et al. |
| 5,498,297 A | | 3/1996 | O'Neill et al. |
| 5,505,789 A | | 4/1996 | Fraas et al. |
| 5,505,917 A | | 4/1996 | Collier, Jr. |
| 5,542,409 A | | 8/1996 | Sampayo |
| 5,616,185 A | | 4/1997 | Kukulka |
| 5,994,641 A | | 11/1999 | Kardauskas et al. |
| 6,020,555 A | | 2/2000 | Garboushian et al. |
| 6,080,927 A | * | 6/2000 | Johnson .................. F24J 2/07 126/562 |
| 6,082,353 A | | 7/2000 | Van Doorn |
| 6,123,067 A | | 9/2000 | Warrick |
| 6,218,605 B1 | | 4/2001 | Daily et al. |
| 6,232,545 B1 | | 5/2001 | Samaras et al. |
| 6,276,359 B1 | | 8/2001 | Frazier |
| 6,303,853 B1 | | 10/2001 | Fraas et al. |
| 6,946,081 B2 | | 9/2005 | Voutchkov |
| 7,388,146 B2 | | 6/2008 | Fraas et al. |
| 7,709,730 B2 | | 5/2010 | Johnson et al. |
| 7,772,484 B2 | | 8/2010 | Li et al. |
| 7,820,906 B2 | | 10/2010 | Johnson et al. |
| 7,825,327 B2 | | 11/2010 | Johnson et al. |
| 7,926,480 B2 | | 4/2011 | LeLievre |
| 7,932,461 B2 | | 4/2011 | Johnson et al. |
| 7,952,057 B2 | | 5/2011 | Finot et al. |
| 7,968,791 B2 | | 6/2011 | Do et al. |
| 8,039,777 B2 | | 10/2011 | Lance et al. |
| 8,049,150 B2 | | 11/2011 | Johnson et al. |
| 8,071,930 B2 | | 12/2011 | Wylie et al. |
| 8,083,362 B2 | | 12/2011 | Finot et al. |
| 8,134,104 B2 | | 3/2012 | Finot et al. |
| 8,410,351 B1 | | 4/2013 | Gu |
| 2001/0017154 A1 | | 8/2001 | Washioi |
| 2003/0024802 A1 | | 2/2003 | Burgos |
| 2003/0201008 A1 | | 10/2003 | Lawheed |
| 2004/0055594 A1 | | 3/2004 | Hochberg et al. |
| 2004/0093965 A1 | | 5/2004 | Hardcastle, III |
| 2005/0081910 A1 | | 4/2005 | Danielson et al. |
| 2005/0133082 A1 | | 6/2005 | Konold et al. |
| 2006/0150967 A1 | | 7/2006 | Hoelle et al. |
| 2006/0162772 A1 | | 7/2006 | Presher et al. |
| 2006/0231133 A1 | | 10/2006 | Fork et al. |
| 2006/0249143 A1 | | 11/2006 | Straka |
| 2007/0034207 A1 | | 2/2007 | Niedermeyer |
| 2007/0056579 A1 | | 3/2007 | Straka |
| 2007/0068162 A1 | | 3/2007 | Komura et al. |
| 2007/0089775 A1 | | 4/2007 | Lasich |
| 2007/0175871 A1 | | 8/2007 | Brezni et al. |
| 2007/0186922 A1 | * | 8/2007 | Guenter .................. F24J 2/202 126/651 |
| 2007/0251569 A1 | | 11/2007 | Shan et al. |
| 2008/0053701 A1 | | 3/2008 | Antaya et al. |
| 2008/0127967 A1 | | 6/2008 | Kimura et al. |
| 2008/0271776 A1 | | 11/2008 | Morgan |
| 2008/0302357 A1 | | 12/2008 | DeNault |
| 2008/0302405 A1 | * | 12/2008 | Intrieri .................. H02S 40/44 136/246 |
| 2008/0302418 A1 | | 12/2008 | Buller et al. |
| 2008/0308094 A1 | | 12/2008 | Johnston |
| 2009/0000662 A1 | | 1/2009 | Harwood et al. |
| 2009/0014058 A1 | | 1/2009 | Croft et al. |
| 2009/0056698 A1 | | 3/2009 | Johnson et al. |
| 2009/0056785 A1 | | 3/2009 | Johnson et al. |
| 2009/0056786 A1 | | 3/2009 | Johnson et al. |
| 2009/0056787 A1 | | 3/2009 | Johnson et al. |
| 2009/0065045 A1 | | 3/2009 | Tsadka et al. |
| 2009/0114261 A1 | | 5/2009 | Stancel et al. |
| 2009/0114281 A1 | | 5/2009 | Gobel |
| 2009/0126774 A1 | | 5/2009 | Taylor et al. |
| 2009/0173375 A1 | | 7/2009 | Frazier et al. |
| 2009/0178704 A1 | | 7/2009 | Kalejs et al. |
| 2009/0183731 A1 | | 7/2009 | Capan |
| 2009/0211644 A1 | | 8/2009 | Wylie et al. |
| 2009/0308379 A1 | | 12/2009 | Capan |
| 2009/0314283 A1 | | 12/2009 | Kimura et al. |
| 2010/0000165 A1 | | 1/2010 | Koller |
| 2010/0031991 A1 | | 2/2010 | Mochizuki et al. |
| 2010/0089435 A1 | | 4/2010 | Lockenhoff |
| 2010/0126554 A1 | | 5/2010 | Morgan et al. |
| 2010/0132776 A1 | | 6/2010 | Nakata |
| 2010/0147347 A1 | | 6/2010 | Dyreby et al. |
| 2010/0163014 A1 | | 7/2010 | Johnson et al. |
| 2010/0170501 A1 | | 7/2010 | Albritton |
| 2010/0193014 A1 | | 8/2010 | Johnson et al. |
| 2010/0207951 A1 | | 8/2010 | Plaisted et al. |
| 2010/0218807 A1 | | 9/2010 | Arbore et al. |
| 2010/0236626 A1 | | 9/2010 | Finot et al. |
| 2010/0288332 A1 | | 11/2010 | O'Neill et al. |
| 2010/0294336 A1 | | 11/2010 | Johnson et al. |
| 2010/0319684 A1 | | 12/2010 | Almogy et al. |
| 2011/0017267 A1 | | 1/2011 | Lichy et al. |
| 2011/0036345 A1 | | 2/2011 | Almogy et al. |
| 2011/0061719 A1 | | 3/2011 | Tsadka et al. |
| 2011/0108090 A1 | | 5/2011 | Lance et al. |
| 2011/0114154 A1 | | 5/2011 | Lichy et al. |
| 2011/0132457 A1 | | 6/2011 | Finot |
| 2011/0162692 A1 | | 7/2011 | Giacalone et al. |
| 2011/0168161 A1 | | 7/2011 | Capan |
| 2011/0226309 A1 | | 9/2011 | Do et al. |
| 2011/0226310 A1 | | 9/2011 | Johnson et al. |
| 2011/0265869 A1 | | 11/2011 | Finot et al. |

(56) References Cited

U.S. PATENT DOCUMENTS

| | | |
|---|---|---|
| 2011/0279918 A1 | 11/2011 | Almogy et al. |
| 2011/0284055 A1 | 11/2011 | Almogy et al. |
| 2012/0042932 A1 | 2/2012 | Wylie et al. |
| 2012/0318318 A1 | 12/2012 | Metin et al. |
| 2012/0318319 A1 | 12/2012 | Pinarbasi et al. |
| 2012/0325282 A1 | 12/2012 | Snow et al. |

FOREIGN PATENT DOCUMENTS

| | | |
|---|---|---|
| WO | 2005-057092 A1 | 6/2005 |
| WO | 2005-090873 A1 | 9/2005 |
| WO | 2006-000834 A1 | 1/2006 |
| WO | 2006-120475 A1 | 11/2006 |
| WO | 2007-022756 A2 | 3/2007 |
| WO | 2007-087680 A1 | 8/2007 |
| WO | 2007-109900 A1 | 10/2007 |
| WO | 2007-110713 A1 | 10/2007 |
| WO | 2007-129146 A1 | 11/2007 |
| WO | 2008-105913 A2 | 9/2008 |
| WO | 2008-112180 A9 | 9/2008 |
| WO | 2008-143482 A2 | 11/2008 |
| WO | 2009-002350 A1 | 12/2008 |
| WO | 2009-011013 | 1/2009 |
| WO | 2009-029275 A2 | 3/2009 |
| WO | 2009-032917 A2 | 3/2009 |
| WO | 2009-032920 A2 | 3/2009 |
| WO | 2009-034573 A2 | 3/2009 |
| WO | 2009-061495 A1 | 5/2009 |
| WO | 2009-076740 A1 | 6/2009 |
| WO | 2009-090538 A2 | 7/2009 |
| WO | 2009-096754 A2 | 8/2009 |
| WO | 2009-103077 A2 | 8/2009 |
| WO | 2009-137864 A1 | 11/2009 |
| WO | 2009-146215 A2 | 12/2009 |
| WO | 2010-004420 A2 | 1/2010 |
| WO | 2010-017422 A2 | 2/2010 |
| WO | 2010-035064 A1 | 4/2010 |
| WO | 2010-047656 A1 | 4/2010 |
| WO | 2010-048677 A1 | 5/2010 |
| WO | 2010-096001 A1 | 8/2010 |
| WO | 2010-099236 A1 | 9/2010 |
| WO | 2010-108141 A2 | 9/2010 |
| WO | 2010-132312 A1 | 11/2010 |
| WO | 2010-138606 A1 | 12/2010 |
| WO | 2010-138606 A2 | 12/2010 |
| WO | 2011-014690 A2 | 2/2011 |
| WO | 2011-062902 A1 | 5/2011 |
| WO | 2011-069079 A2 | 6/2011 |
| WO | 2011-134759 A2 | 11/2011 |
| WO | 2011-139494 A1 | 11/2011 |
| WO | 2011-139852 A2 | 11/2011 |
| WO | 2011-141198 A2 | 11/2011 |
| WO | 2011-146177 A1 | 11/2011 |
| WO | 2011-149589 A1 | 12/2011 |
| WO | 2012-005747 A1 | 1/2012 |
| WO | 2012-113478 A1 | 8/2012 |

OTHER PUBLICATIONS

Weatherby, Clive, Solar CPV—a great opportunity for traditional manufacturing Industry, CPV Today Concentrated Photovoltaic Summit USA, Feb. 3-4, 2009, pp. 1-33.
Meydbray, Y., et al., Solder Joint Degradation in High Efficiency All Back Contact Solar Cells, Proceedings of the 22nd European Photovoltaic Solar Energy Conference, 2007, 5 pgs.
Sala, G., et al., Test, Rating and Specification of PV Concentrator Components and Systems, Book 1, Classification of PV Concentrators, Chapter 3—History of Concentrators, Jan. 31, 2002, pp. 1, 13-57.
Morvillo, Pasquale, The ENEA c-Si high efficiency solar cell, Tutorial on PV—Concentrators Technology, 2007, 32 pgs.
Swanson, Richard M., The Promise of Concentrators, Progress in Photovoltalcs: Research and Applications, 2000, pp. 93-111, John Wiley & Sons, Ltd.
Coventry, Franklin J., et al., Thermal and electrical performance of a concentrating PV/Thermal collector: results from the ANU CHAPS collector, 2002, 6 pgs., ANZSES Solar Energy Conference, Newcastle, Australia.
Van Kessel, Theodore, Thermal Management for CPV at 2000 Suns, CPV Today 2nd Concentrated Photovoltaic Summit—US, Feb. 2-3, 2010, 36 pgs.
Lee, B., et al., Thermally conductive and electrically Insulating EVA composite encapsulants for solar photovoltaic (PV) cell, Express Polymer Letters, 2008, pp. 357-363, vol. 2, No. 5.
Youssef, Cherif, Utility's Perspective to Concentrated Solar . . . , CPV Today 2nd Annual Concentrated Photovoltaic Summit USA, Feb. 2, 2010, 28 pgs.
Non-Final Office Action dated Nov. 23, 2010 (U.S. Appl. No. 12/622,416) 14 pages.
International Search Report and Written Opinion for PCT/US/1 0/56847, Mar. 3, 2011; 11 pages.
International Search Report PCT/US/10/25280, May 2, 2010; 2 pages.
EP107249385 Response to Written Opinion 161/162 filed Jul. 23, 2012.
PCT/US/2010/56847 International Preliminary Report and Written Opinion mailing date May 31, 2012.
PCT/US2010/036220 International Preliminary Report on Patentability and Written Opinion mailing Nov. 29, 2011; 8 pp.
PCT/US2011/031117 International Preliminary Report on Patentability and Written Opinion mailing date Nov. 27, 2012; 17 pp.
PCT/US2011/032163 International Preliminary Report on Patentability and Written Opinion mailing date Nov. 6, 2012; 13 pp.
PCT/US2011/032169 International Preliminary Report on Patentability and Written Opinion mailing date Nov. 20, 2012; 17 pp.
U.S. Appl. No. 12/622,416 RCE and Amendment filed Dec. 21, 2011.
U.S. Appl. No. 12/712,122 Interview Summary mailed Apr. 9, 2013.
U.S. Appl. No. 12/712,122 Office Action mailed Nov. 30, 2012.
U.S. Appl. No. 12/781,706 Office Action dated Apr. 25, 2013.
U.S. Appl. No. 12/788,048 Amendment filed Jun. 18, 2012.
U.S. Appl. No. 12/788,048 Office Action mailed Jan. 18, 2012.
U.S. Appl. No. 12/788,048 Office Action mailed Nov. 8, 2012.
U.S. Appl. No. 12/788,048 RCE and Amendment filed May 8, 2013.
U.S. Appl. No. 12/887,958 Office Action mailed Mar. 14, 2012.
U.S. Appl. No. 12/912,177 Amendment filed Jul. 13, 2012.
U.S. Appl. No. 12/912,177 Amendment filed Jun. 18, 2012.
U.S. Appl. No. 12/912,177 Office Action mailed Jan. 17, 2012.
U.S. Appl. No. 12/912,177 Office Action mailed Jun. 25, 2012.
U.S. Appl. No. 13/079,193 Office Action dated May 1, 2013.
Hittite Solar Energy; Pages from http://www.hittitesolarenergy.com; Accessed on Feb. 7, 2013; 6 pp.
Laila S. Mattos, et al; New Module Efficiency Record: 23.5% under 1-Sun Illumination Using Thin-film Single-junction GaAs Solar Cells; 38th IEEE PVSC Jun. 3-8, 2012; Alta Devices, Inc., Santa Clara, CA USA; pp. 003187-003190.
Mathur, S. S., et al.; Geometrical Designs and Performance Analysis of a Linear Fresnel Reflector Solar Con Centra Tor With a Flat Horizontal Absorber; International Journal of Energy Research, vol. 4, pp. 107-124; 1990; Jan. 18, 1989, John Wiley & Sons, Ltd.
U.S. Appl. No. 13/763,412 Office Action dated May 21, 2013.
U.S. Appl. No. 13/763,429 Office Action dated May 23, 2013.
PCT/US2010/036220 International Search Report and Written Opinion mailing date Jun. 20, 2011; 12pp.
PCT/US20111032153 International Search Report and Written Opinion mailing date Jun. 27, 2011; 21 pp.
PCT/US2011/032169 International Search Report and Written Opinion mailing date Jul. 5, 2011; 24 pp.
PCTIUS/201 0/025280 International Preliminary Report and Written Opinion, mailing date May 3, 2010; 5 pp.
PCTIUS2010/025280 International Search Report and Written Opinion, mailing date May 3, 2010; 6 pp.
PCT/US2011/031117 International Search Report 4 pp. and Written Opinion 16 pg; mailing date Jun. 20, 2011; 20 pp.
Bunea, Marius M. , et al., Simulation and Characterization of High Efficiency Back Contact Cells for Low-Concentration Photovoltaics; Photovoltaic Specialists Conference (PVSC), 2010 35th IEEE; Jun.

(56) References Cited

OTHER PUBLICATIONS 20-25, 2010; pp. 000873-000876, ISSN: 0160-8371 ; Print ISBN: 978-1-4244-5890-S; Honolulu, HI.
Judkins, Zachary S., et al.; Performance Results of a Low-Concentration Photovoltaic System Based on High Efficiency Back Contact Cells; 25th European Photovoltalc Solar Energy Conference and Exhibition I 5th World Conference on Photovoltaic Energy Conversion; Sep. 6-10, 2010; pp. 123-127; Valencia, Spain.
U.S. Appl. No. 12/522,416 Final Office Action mailing date Jun. 21, 2011, 15 pp.
Smeltink, J.F.H., et al., 40kW PV Thermal Roof Mounted Concentrator System, Conference Record of the 2006 IEEE 4th World Conference on Photovoltaic Energy Conversion, May 2006, pp. 636-639.
Sala, G. , et al., 480 kW peak EUCLIDES Concentrator Power Plant Using Parabolic Troughs, 2nd World Conference and Exhibition PVSEC, 1998, pp. 1963-1968.
Smeltink, J.F.H, et al., A 40Kw Roof Mounted PV Thermal Concentrator System, 20th EC PV Solar Energy Conference, Mar. 27, 2006, 4 pgs.
Smeltink, J., et al., A hybrid pv-thermal linear microconcentrator for domestic application, 22nd EU PVSEC, 2007, 4 pgs.
Chow, T.T., A review on photovoltalc/thermal hybrid solar technology, Applied Energy, Feb. 2010, pp. 365-379, available online Jul. 25, 2009.
Kempe, M.D., et al., Accelerated Stress Testing of Hydrocarbon-Based Encapsulants for Medium-Concentration CPV Applications, 34th IEEE Photovoltaic Specialists Conference (PVSC), Jun. 7-12, 2009, pp. 1826-1831.
Mason, N.B. et al., Advanced Laser Processing for Industrial Solar Cell Manufacturing, 2006, 62 pgs, Department of Trade and Industry (United Kingdom).
Price, Hank, et al., Advances in Parabolic Trough Solar Power Technology, Journal of Solar Energy Engineering, May 2002 , pp. 109-125, vol. 124.
Miller, D.C., et al., Analysis of Transmitted Optical Spectrum Enabling Accelerated Testing of CPV Designs, SPIE 2009 Solar Energy+ Technology Conference, Aug. 2-6, 2009, Jul. 2009 preprint, 15 pgs.
Le Lievre, Peter, Chromasun Photovoltaic; Heating-Cooling; Daylighting—all in a single panel, Cleantech Showcase—Abu Dhabi, Jan. 21, 2009, 21 pgs.
Combined Heat and Power Solar (CHAPS), brochure, Nov. 2004, 2 pgs., Australian National University Centre for Sustainable Energy Systems.
Crowley, Mark, Commercialization of CPV in 2010—Toward the First 100 MW, CPV Today 2nd Concentrated Photovoltaic Summit US, Feb. 2-3, 2010, 17 pgs.
Fraas, Lewis, Concentrated Photovoltaics (CPV): Path to Affordable Solar Electric Power, Southeast Solar Summit, Nov. 2007, 22 pgs.
Grama, Sorin , et al., Concentrating Solar Power- Technology, Cost, and Markets, 2008 Industry Report, 2008, 149 pgs, Prometheus institute for Sustainable Development and Greentech Media.
Royne, Anja, et al. , Cooling of Photovoltaic cells under concentrated illumination: a critical review, Solar Energy Materials & Solar Cells, 2005, pp. 451-483, vol. 86, Elsevier.
Boehm, Robert, CPV—Competing and Beating Other Solar Technologies, CPV Today 2nd Concentrated Photovoitaic Summit USA, Feb. 2-3, 2010, 62 pgs.
Skumanich, Andy, CPV: Market Considerations for 2010 and Beyond, CPV Conference Feb. 3, 2010, 31 pgs.
Shisler, Bill, CPV Qualification and Safety Testing, CPV Today 2"d Concentrated Photovoltaic Summit—US, Feb. 3, 2010, 19 pgs.
Lerchenmuller, Hansjorg, CPV Super Panel—The CPV Landscape, CPV Today 2"d Concentrated Photovoltaic Summit—US, Feb. 2, 2010, 21 pgs.
CPV Systems: The Road to Successful Deployments, CPV Today 2"d Concentrated Photovoltaic Summit—US, Feb. 2-3, 2010, 11 pgs.
Plesniak, Adam, Deployment and Performance of Boeing HCPV Modules and Arrays, CPV Today 2nd Concentrated Photovoltaic Summit—US, Feb. 3, 2010, 18 pgs.
Etzkorn, Edward V. , DOE Outlook and Opportunities for CPV, CPV Today 2"d Concentrated Photovoitaic Summit—US, Feb. 2, 2010, 33 pgs.
Fraas, Dr. Lewis, Economic Comparisons of the Various PV Options, CPV Today Concentrated Photovoltaics Summit USA, Feb. 4, 2009, 21 pgs.
Kempe, M.D., et al., Ethylene-Vinyl Acetate Potential Problems for Photovoltaic Packaging, 2006 IEEE 4th World Conference on Photovoltaic Energy Conversion (WCPEC-4), May 7-12, 2006, 6 pgs.
Lupfert, Eckhard, Eurotrough Design Issues and Prototype Testing at PSA, Proceedings of the Solar Forum 2001, Solar Energy: The Power to Choose, Apr. 21-25, 2001 , 5 pgs.
O'Neill, Mark, Fifth-Generation 20X Linear Fresnel Lens Silicon Cell Concentrator Technology, Fifth International Conference on Solar Concentrators (ICSC-5), Nov. 19, 2006, pp. 1-23.
Cohen, Gilbert E., et al., Final Report on the Operation and Maintenance Improvement Program for Concentrating Solar Power Plants, Jun. 1999, pp. 1-166, issued by Sandia National Laboratories.
Zondag, Herbert, et al., Guidelines for performnance measurements of liquid-cooled non-concentrating PVT collectors using c-SI cells, 2006, pp. 1-41, issued by PV Catapult.
Tobias, Ignacio, et al. , Handbook of Photovoltaic Science and Engineering , Chapter 7—Crystalline Silicon Solar Cells and Modules, 2003, pp. 255-306, 2003 John Wiley & Sons, Ltd.
Anderson, William G., et al., Heat Pipe Cooling of Concentrating Photovoltaic (CPV) Systems, 6th International Energy Conversion Engineering Conference (IECEC), Jul. 28-30, 2006, pp. 1-9.
Neuhaus, Dirk-Holger, et al., Industrial Silicon Wafer Solar Cells, Advances in OptoElectronics, 2007, pp. 1-15, Hindawi Publishing Corporation.
Mirroxx Linear Fresnel Collector Technology, (brochure), 2009, 8 pgs.
Cohen, Gilbert, et al., Parabolic Trough Concentrator Development, USA Trough Third Annual Parabolic Trough Workshop, Jun. 18, 2000, pp. 1-1 3.
Smel Tink, J. et al., Performnance monitoring of a pv themal concentrator system, 22nd EU PVSEC, 2007, 4 pgs.
Birkmire, R. W., et al., Processing Materials, Devices and Diagnostics for Thin Film Photovoltaics: Fundamental and Manufacturability Issues, Annual Report to National Renewable Energy Laboratory by Institute of Energy Conversion University of Delaware, Apr. 1, 2007-Dec. 31, 2007, pp. 1-77.
Kaminar, N.R., et al., PVMaT Improvements in the Manufacturing of the PVI Powergrid, Final Technical Report, Oct. 1999, 77 pgs.
Affolter, Pascal, et al., PVT Roadmap, Accessed from the world wide web Jan. 3, 2010, 91 pgs.
Harwood, D., et al., Receiver Development for Rooftop Concentrator Applications, International Conference on Solar Concentrators (ICSC-4), 2007, 4 pgs.
Renewable Energy Technology Characterizations, Topical Report TR-1 09496 , Dec. 1997, 283 pgs, Office of Utility Technologies, Energy Efficiency and Renewable Energy, U.S. Department of Energy and Electric Power Research Institute.
Kennedy, Cheryl, Session CSP Advanced Systems: Optical Materials, 2008 Solar Annual Review Meeting, 27 pgs.
SkyFuel & SkyTrough Questions and Answers, (brochure), 2009, 6 pgs, www.SkyFuel.com.

\* cited by examiner

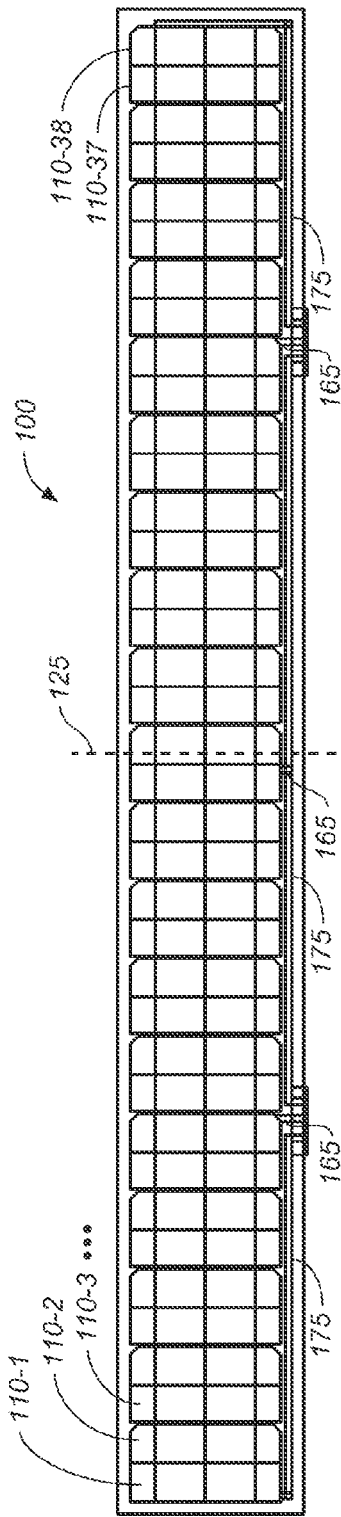
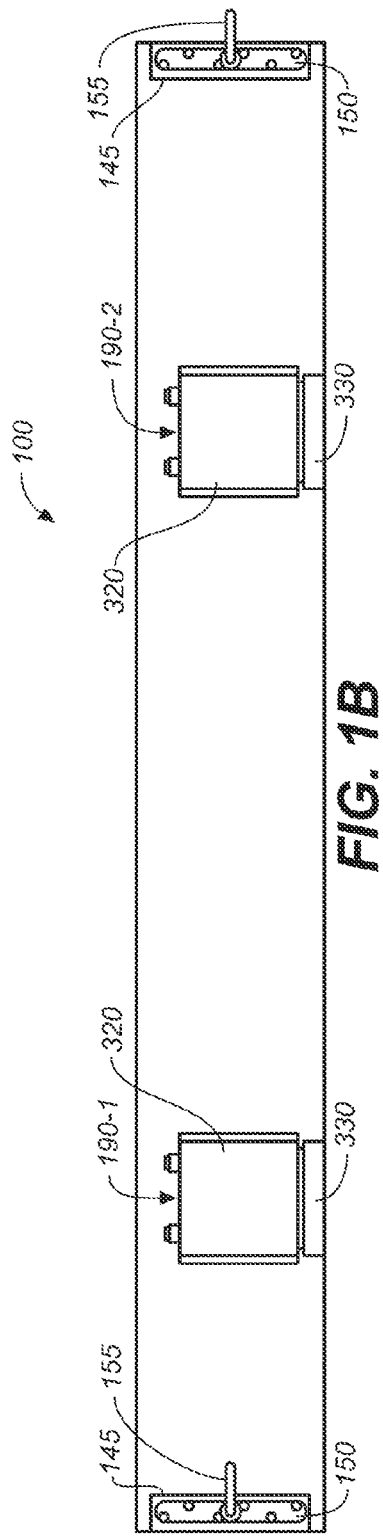

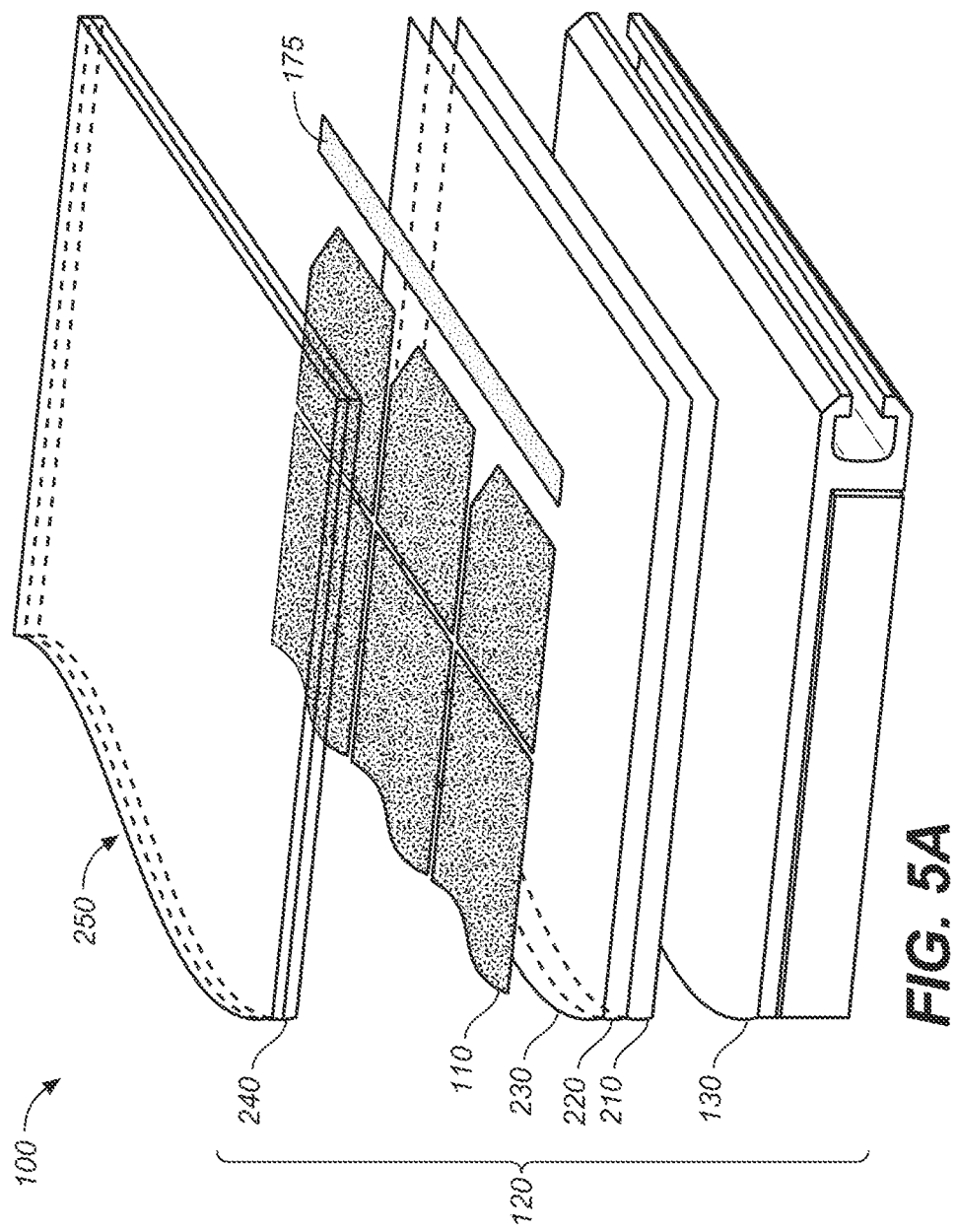

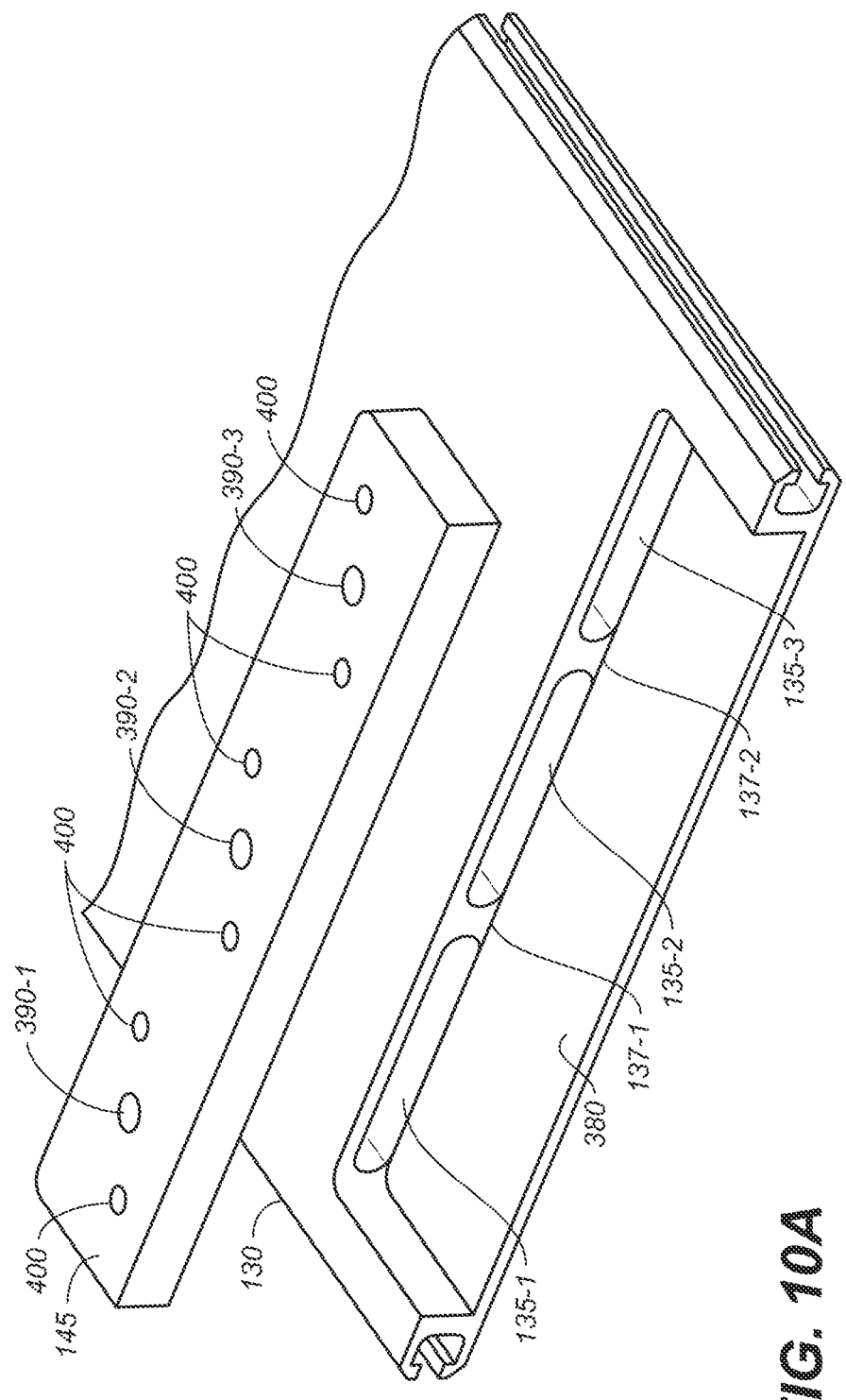

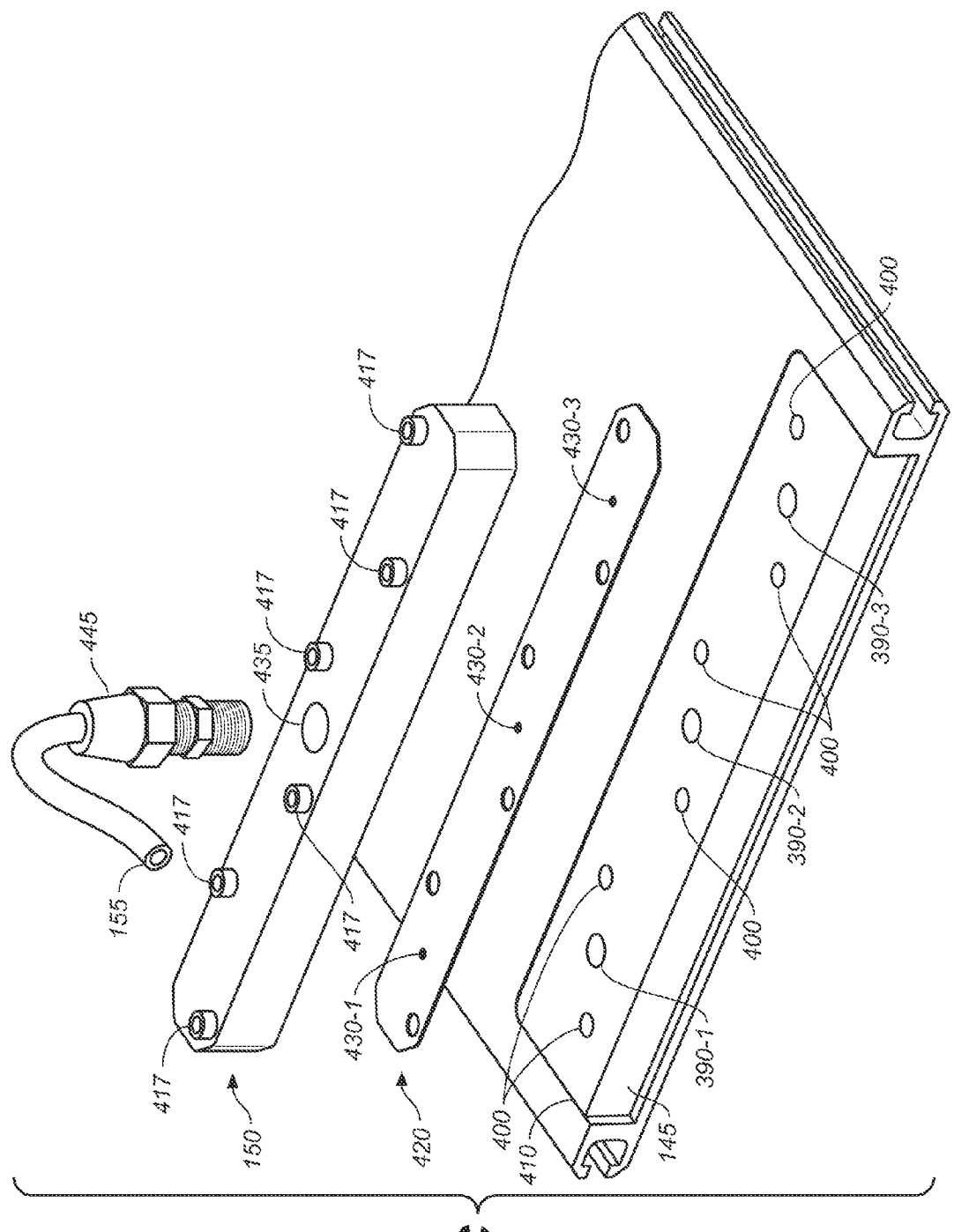

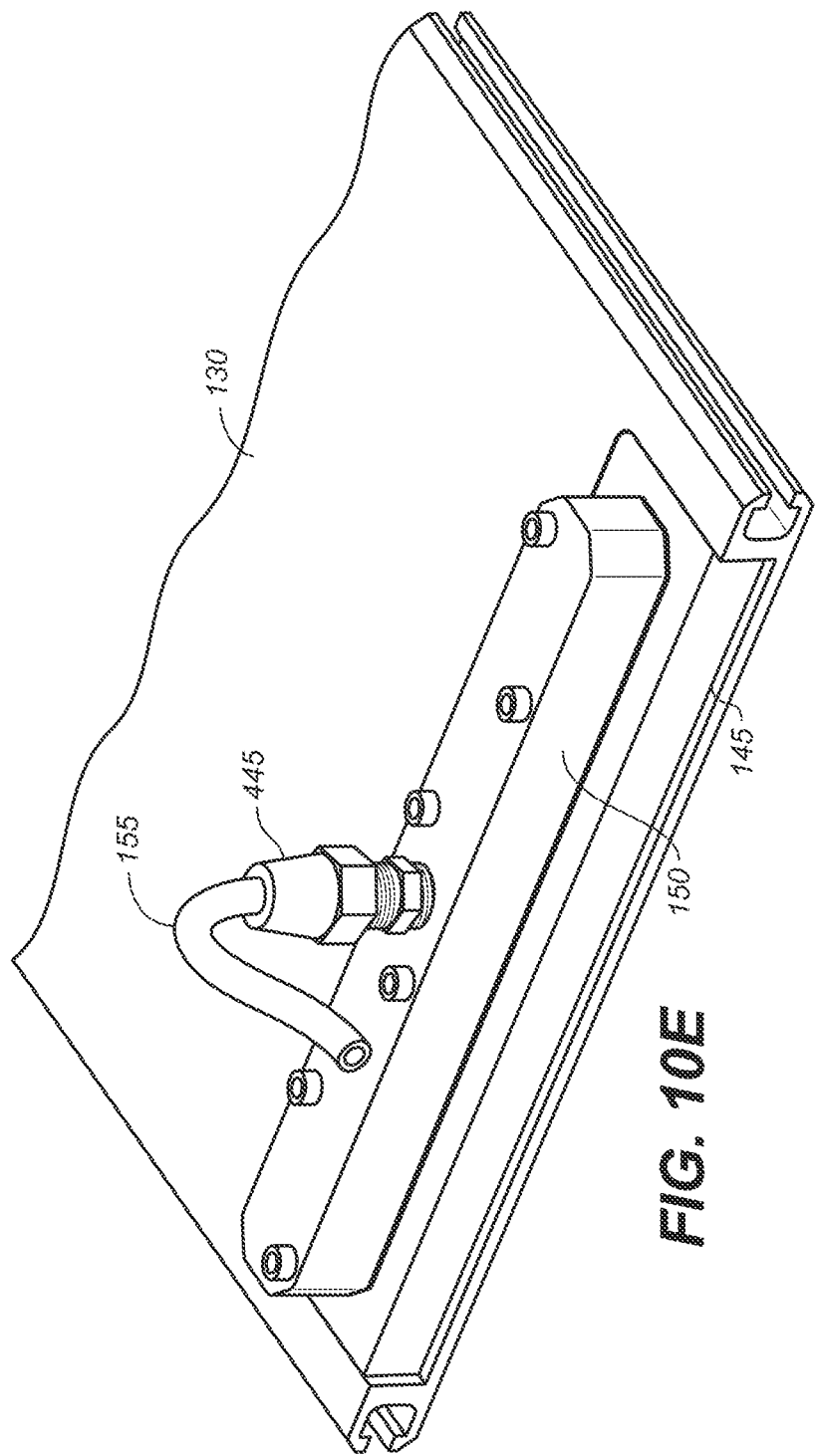

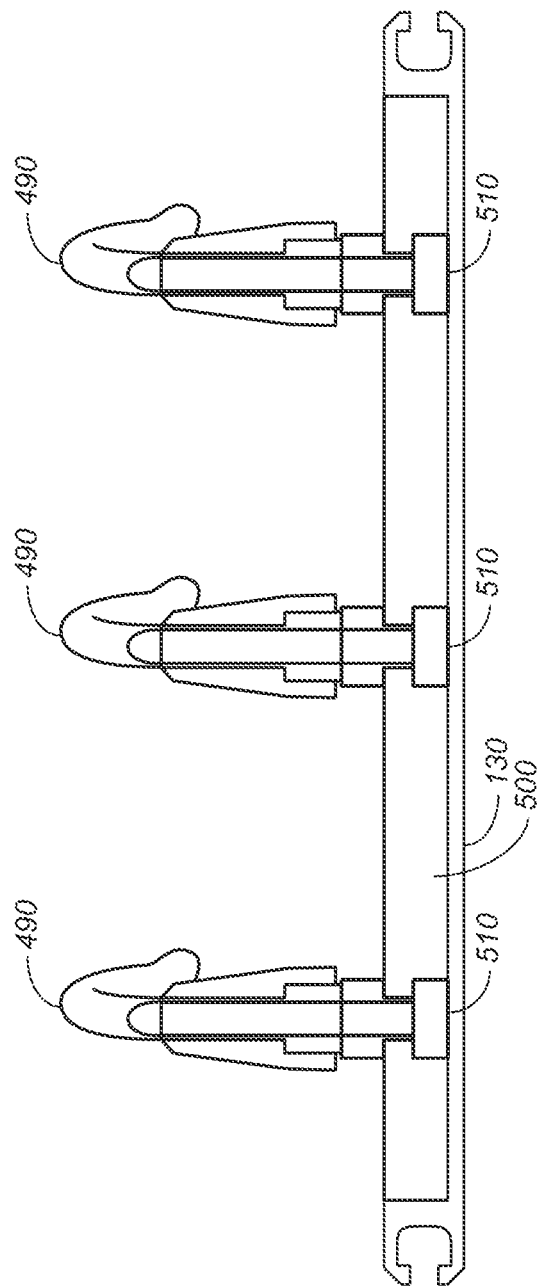

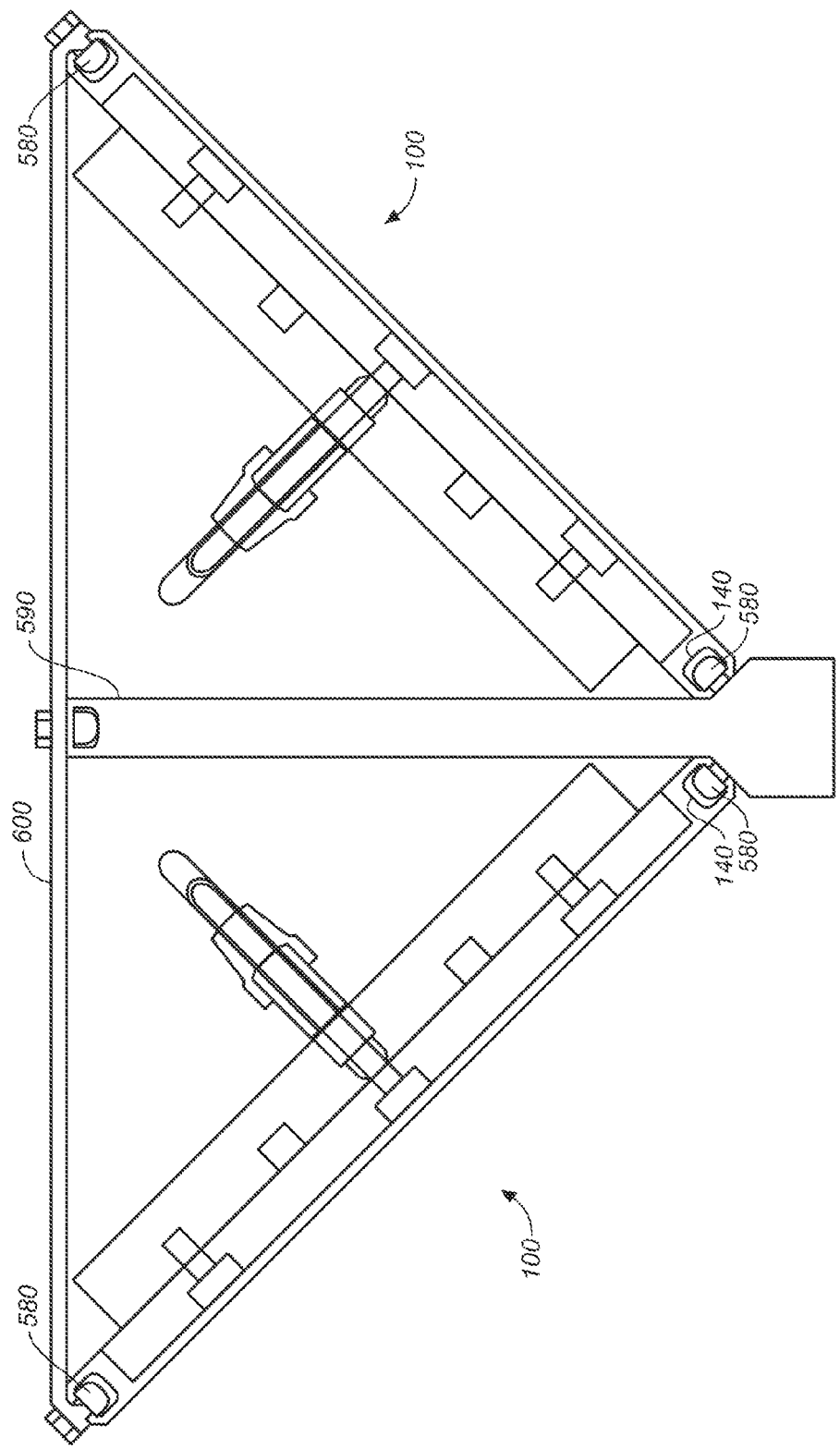

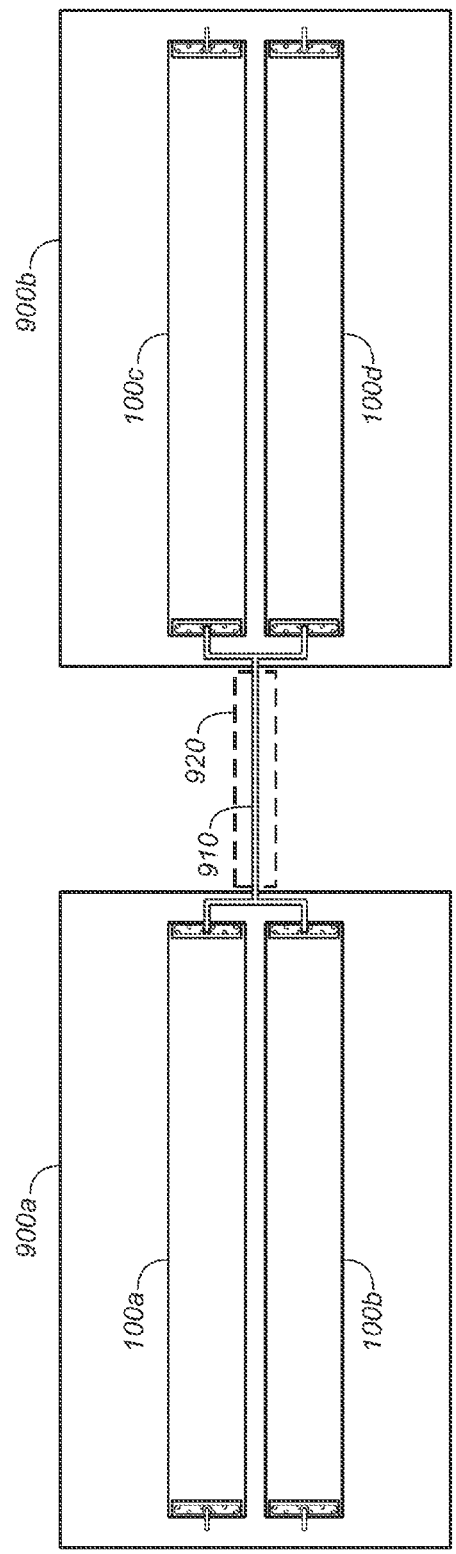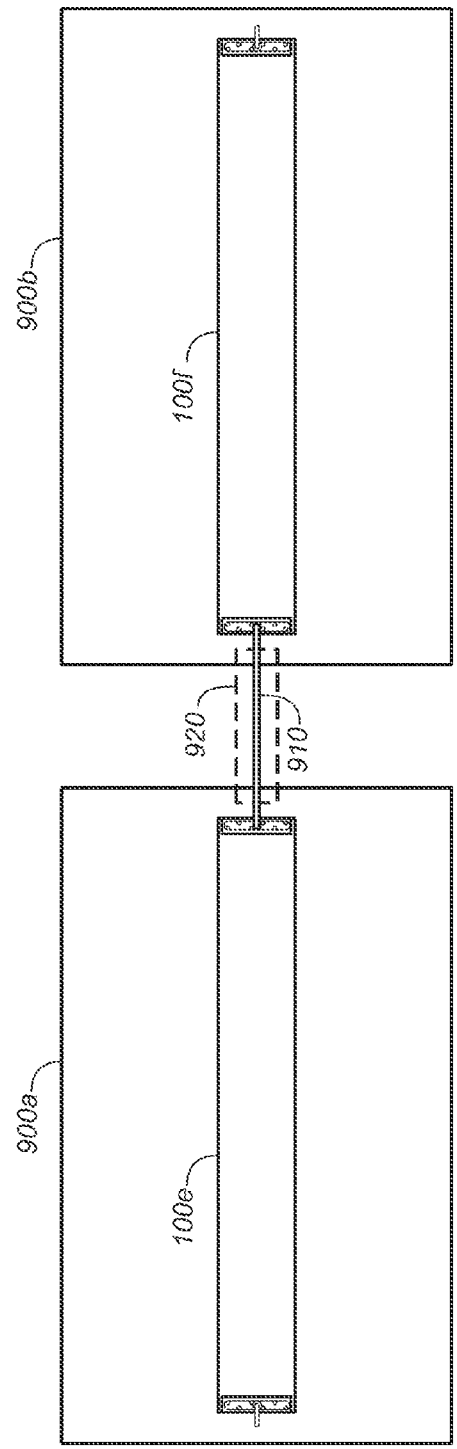
FIG. 21A
FIG. 21B

CONCENTRATING PHOTOVOLTAIC-THERMAL SOLAR ENERGY COLLECTOR

CROSS REFERENCE TO RELATED APPLICATIONS

This application is a continuation of U.S. patent application Ser. No. 12/774,436 filed May 5, 2010 and titled "Receiver For Concentrating Photovoltaic-Thermal System", which is incorporated herein by reference in its entirety.

FIELD OF THE INVENTION

The invention relates generally to the collection of solar energy to provide electric power or electric power and heat.

BACKGROUND

Alternate sources of energy are needed to satisfy ever increasing world-wide energy demands. Solar energy resources are sufficient in many geographical regions to satisfy such demands, in part, by provision of electric power and useful heat.

SUMMARY

Systems, methods, and apparatus by which solar energy may be collected to provide electricity or a combination of heat and electricity are disclosed herein.

In one aspect, a solar energy collector comprises first and second linearly extending receivers each comprising one or more coolant channels extending along its long axis. The first and second receivers are mechanically coupled to each other to form a V-shape with a long axis of the first receiver parallel to a long axis of the second receiver. Each receiver comprises a surface facing outward from the V-shape and an opposite surface facing into the V-shape. A linearly extending cover substantially parallel to the long axes of the first and second receivers is arranged above or between the first and second receivers to at least substantially close the opening at the upper end of the V-shape. Solar radiation may be concentrated on the outward facing surfaces of the receivers by any suitable reflector arrangement, for example.

In some variations of this aspect, the cover is not substantially transparent to solar radiation. The cover may be, for example, substantially opaque to solar radiation. In some of these variations, the solar energy collector comprises a first plurality of solar cells disposed on the outward facing surface of the first receiver, and a second plurality of solar cells disposed on the outward facing surface of the second receiver. In some other variations, the receivers do not comprise solar cells on their outward facing surfaces. In some variations, the outward facing surface of the first receiver comprises a plurality of solar cells, and the outward facing surface of the second receiver does not comprise solar cells. In some variations, at least a portion of the outward facing surfaces of the receivers does not comprise solar cells, and at least some of that portion is coated, painted, or otherwise treated to increase absorption of solar radiation. The solar energy collector of these variations, with or without solar cells, may comprise a layer of material substantially transparent to solar radiation disposed adjacent to the outward facing surface of the first receiver, and another layer of material substantially transparent to solar radiation disposed adjacent to the outward facing surface of the second receiver. The transparent layers may be spaced apart from the receiver surfaces to form insulating air gaps between the receiver surfaces and the transparent layers.

In any of the variations utilizing a cover not substantially transparent, the solar collector may, but need not, additionally comprise thermal insulation disposed on the inward facing surfaces of the first and second receivers. In any of the variations utilizing a cover not substantially transparent, the cover may, but need not, seal at least a portion of the V-shape to dust and/or moisture. In any of the variations utilizing a cover not substantially transparent, a surface of the cover facing outward from the V-shape may, but need not, be coated, painted, or otherwise treated to increase absorption of solar radiation.

In other variations of this aspect, the cover is substantially transparent to solar radiation. In some of these variations, the solar energy collector comprises a first plurality of solar cells disposed on the outward facing surface of the first receiver, and a second plurality of solar cells disposed on the outward facing surface of the second receiver. In some other variations, the receivers do not comprise solar cells on their outward facing surfaces. In some variations, the outward facing surface of the first receiver comprises a plurality of solar cells, and the outward facing surface of the second receiver does not comprise solar cells. In some variations, at least a portion of the outward facing surfaces of the receivers does not comprise solar cells, and at least some of that portion is coated, painted, or otherwise treated to increase absorption of solar radiation. The solar energy collector of these variations, with or without solar cells, may comprise a layer of material substantially transparent to solar radiation disposed adjacent to the outward facing surface of the first receiver, and another layer of material substantially transparent to solar radiation disposed adjacent to the outward facing surface of the second receiver. The transparent layers may be spaced apart from the receiver surfaces to form insulating air gaps between the receiver surfaces and the transparent layers.

In any of the variations utilizing a transparent cover, the solar energy collector may, but need not, comprise a third plurality of solar cells disposed on the inward facing surface of at least one of the receivers. In any of the variations utilizing a transparent cover, at least a portion of the inward facing surfaces of the receivers may, but need not, be coated, painted, or otherwise treated to increase absorption of solar radiation. In any of the variations utilizing a transparent cover, the solar energy collector may, but need not, comprise a layer of material substantially transparent to solar radiation disposed on or adjacent to the inward facing surface of the first receiver, and a layer of material substantially transparent to solar radiation disposed on or adjacent to the inward facing surface of the second receiver. These transparent layers may be spaced apart from the inward facing surfaces of the receivers to form insulating air gaps between the transparent layers and the inward facing surfaces. In any of the above variations utilizing a transparent cover, the cover may, but need not, seal at least a portion of the V-shape to dust and/or moisture.

In another aspect, a solar energy collector comprises first and second linearly extending receivers each comprising one or more coolant channels extending along its long axis. The first and second receivers are mechanically coupled to each other to form a V-shape with a long axis of the first receiver parallel to a long axis of the second receiver. Each receiver comprises a surface facing outward from the V-shape and an opposite surface facing into the V-shape. The solar energy collector further comprises a third linearly extending receiver extending substantially parallel to the long axes of the first and second receivers and arranged above or between the first and second receivers to at least substantially close the opening at the upper end of the V-shape. The third receiver may be, but need not be, identical, substantially identical, or similar to the first and second receivers. Solar radiation may be concentrated, for example, on the outward facing surfaces of the first and second receivers by any suitable reflector arrangement. Direct solar radiation may be incident on the third receiver, for example.

In some variations of this aspect, the solar energy collector comprises a first plurality of solar cells disposed on the outward facing surface of the first receiver, and a second plurality of solar cells disposed on the outward facing surface of the second receiver. In some other variations, the first and second receivers do not comprise solar cells on their outward facing surfaces. In some variations, the outward facing surface of the first receiver comprises a plurality of solar cells, and the outward facing surface of the second receiver does not comprise solar cells. In some variations, at least a portion of the outward facing surfaces of the first and second receivers does not comprise solar cells, and at least some of that portion is coated, painted, or otherwise treated to increase absorption of solar radiation. The solar energy collector of these variations, with or without solar cells on the first and second receivers, may comprise a layer of material substantially transparent to solar radiation disposed adjacent to the outward facing surface of the first receiver, and another layer of material substantially transparent to solar radiation disposed adjacent to the outward facing surface of the second receiver. The transparent layers may be spaced apart from the receiver surfaces to form insulating air gaps between the receiver surfaces and the transparent layers.

In any of the variations of this aspect, the third receiver may, but need not, comprise one or more coolant channels extending along its long axis. In any of the variations of this aspect, the solar energy collector may, but need not, comprise a third plurality of solar cells disposed on a surface of the third receiver facing outward from the V-shape. In any of the variations of this aspect, the solar energy collector may, but need not, comprise thermal insulation disposed on the inward facing surfaces of the first and second receivers. In any of the variations of this aspect, the third receiver may, but need not, seal at least a portion of the V-shape to dust and/or moisture.

In another aspect, a solar energy collector comprises first and second linearly extending receivers each comprising one or more coolant channels extending along its long axis. The first and second receivers are mechanically coupled to each other to form a V-shape with a long axis of the first receiver parallel to a long axis of the second receiver. Each receiver comprises a surface facing outward from the V-shape and an opposite surface facing into the V-shape. The outward facing surface of the first receiver comprises a plurality of solar cells, and the outward facing surface of the second receiver does not comprise solar cells. In some variations of this aspect, the one or more coolant channels of the first receiver are fluidly coupled to the one or more coolant channels of the second receiver.

In another aspect, a solar energy collector comprises first and second linearly extending receivers each comprising one or more coolant channels extending along its long axis. The first and second receivers are mechanically coupled to each other to form a V-shape with a long axis of the first receiver parallel to a long axis of the second receiver. Each receiver comprises a surface facing outward from the V-shape and an opposite surface facing into the V-shape. The majority of the outward facing surface of the first receiver and the majority of the outward facing surface of the second receiver do not comprise solar cells. In some variations, neither the outward facing surface of the first receiver nor the outward facing surface of the second receiver comprise solar cells.

In some variations of this aspect, the solar energy collector comprises a linearly extending cover substantially parallel to the long axes of the first and second receivers and arranged above or between the first and second receivers to at least substantially close the opening at the upper end of the V-shape. In other variations of this aspect, the solar energy collector comprises a third linearly extending receiver extending substantially parallel to the long axes of the first and second receivers and arranged above or between the first and second receivers to at least substantially close the opening at the upper end of the V-shape.

In another aspect, a solar energy receiver comprises a linearly extending substrate having first and second surfaces on opposite sides of the substrate, and one or more coolant channels extending through the substrate along its long axis. The receiver further comprises a plurality of solar cells disposed on the first surface of the substrate, and thermal insulation disposed on the second surface of the substrate.

In some variations of this aspect, a portion of the first surface does not comprise solar cells, and at least some of that portion is coated, painted, or otherwise treated to increase absorption of solar radiation. In any of the variations of this aspect, the receiver may, but need not, comprises a layer of material substantially transparent to solar radiation disposed on or adjacent to the first surface. The layer of substantially transparent material may be spaced apart from the first surface to form an insulating air gap.

In another aspect, a solar energy receiver comprises a linearly extending substrate having first and second surfaces on opposite sides of the substrate, and one or more coolant channels extending through the substrate along its long axis. The receiver further comprises a plurality of solar cells disposed on the first surface of the substrate, and a layer of material substantially transparent to solar radiation disposed on the second surface of the substrate. The layer of substantially transparent material may be spaced apart from the second surface to form an insulating air gap between the layer and the second surface.

In some variations of this aspect a portion of the first surface does not comprise solar cells, and at least some of that portion is coated, painted, or otherwise treated to increase absorption of solar radiation. In any of the variations of this aspect, the receiver may, but need not, comprises a layer of material substantially transparent to solar radiation disposed on or adjacent to the first surface. That layer may be spaced apart from the first surface to form an insulating air gap. In any of the variations of this aspect, the second surface of the receiver may, but need not, be coated, painted, or otherwise treated to increase absorption of solar radiation. In any of the variations of this aspect, the receiver may comprise a second plurality of solar cells disposed on the second surface.

In another aspect, a solar energy receiver comprises a linearly extending substrate having first and second surfaces on opposite sides of the substrate and one or more coolant channels extending through the substrate along its long axis. The receiver further comprises a plurality of solar cells disposed on the first surface of the substrate. The second surface is coated, painted, or otherwise treated to increase absorption of solar radiation.

In some variations of this aspect, a portion of the first surface does not comprise solar cells, and at least some of that portion is coated, painted, or otherwise treated to increase absorption of solar radiation. In any of the variations of this aspect, the receiver may, but need not, comprises a layer of material substantially transparent to solar radiation disposed on or adjacent to the first surface. That layer may be spaced apart from the first surface to form an insulating air gap.

In another aspect, a solar energy receiver comprises a linearly extending substrate having first and second surfaces on opposite sides of the substrate and one or more coolant channels extending through the substrate along its long axis. The receiver further comprises a plurality of solar cells disposed on the first surface of the substrate, and a second plurality of solar cells disposed on the second surface of the substrate.

In some variations of this aspect, a portion of the second surface does not comprise solar cells, and at least some of that portion is coated, painted, or otherwise treated to increase absorption of solar radiation. In some variations of this aspect, a portion of the first surface does not comprise solar cells, and at least some of that portion is coated, painted, or otherwise treated to increase absorption of solar radiation. In any of the variations of this aspect, the receiver may, but need not, comprises a layer of material substantially transparent to solar radiation disposed on or adjacent to the first surface. That layer may be spaced apart from the first surface to form an insulating air gap.

In another aspect, a solar energy receiver comprises a linearly extending substrate and one or more coolant channels extending through the substrate along its long axis. The receiver further comprises a plurality of solar cells disposed on a surface of the substrate, and a layer of material substantially transparent to solar radiation disposed on or adjacent to the surface. The transparent layer may be spaced apart from the first surface to form an insulating air gap. In some variations, a portion of the surface does not comprise solar cells, and at least some of that portion is coated, painted, or otherwise treated to increase absorption of solar radiation.

In another aspect, a solar energy receiver comprises a linearly extending substrate and one or more coolant channels extending through the substrate along its long axis. The receiver further comprises a plurality of solar cells disposed on a surface of the substrate. A portion of that surface does not comprise solar cells, and at least some of that portion is coated, painted, or otherwise treated to increase absorption of solar radiation. In some variations, the plurality of solar cells comprises a first string of solar cells and a second string of solar cells disposed on the surface with a gap between the first string and the second string, and at least a portion of the surface in the gap is coated, painted, or otherwise treated to increase absorption of solar radiation.

In another aspect, a solar energy collector comprises a first linearly extending reflector having a linear focus oriented in a substantially North-South direction and a first linearly extending receiver arranged parallel to the first reflector and located approximately at the focus of the first reflector. The first receiver comprises one or more coolant channels extending along its axis and a plurality of solar cells arranged to be illuminated by solar radiation focused by the first reflector. The collector also comprises a second linearly extending reflector having a linear focus approximately parallel to and in line with the linear focus of the first reflector, and a second linearly extending receiver arranged parallel to the second reflector and located approximately at the focus of the second reflector. The second reflector is spaced apart from the first reflector. The second receiver comprises one or more coolant channels extending along its axis and a plurality of solar cells arranged to be illuminated by solar radiation focused by the second reflector. The collector further comprises a straight conduit extending from the first receiver to the second receiver to fluidly couple the one or more coolant channels in the first receiver to the one or more coolant channels in the second receiver. During operation of the collector to collect solar radiation, the conduit is illuminated by solar radiation concentrated by the first reflector, the second reflector, or both.

In some variations of this aspect, a greater length of the conduit is illuminated by concentrated solar radiation during the winter than during the summer. In some variations of this aspect in which the first reflector is located closer than the second reflector to the earth's equator, during operation, as the angle of the sun above the earth's horizon decreases, solar radiation concentrated by the first reflector walks partially off of the first receiver and at least partially onto the conduit. In some variations of this aspect in which the first reflector is located closer to than the second reflector to the earth's equator, during operation, as the angle of the sun above the earth's horizon decreases, solar radiation concentrated by the first reflector, the second reflector, or both reflectors walks partially off of the conduit and onto the second receiver.

In another aspect, a method of operating a linearly extending concentrating solar energy receiver comprises flowing a coolant in a first direction along a first channel extending through the receiver substantially parallel to the receiver's long axis, flowing the coolant in a second direction substantially counter-parallel to the first direction in a second channel extending through the receiver substantially parallel to the receiver's long axis, and illuminating with concentrated solar radiation a surface of the receiver comprising solar cells in thermal contact with the coolant.

In some variations of this method, the concentrated solar radiation has an intensity greater on portions of the surface of the receiver near the first channel than on portions of the receiver near the second channel. In some of these variations, the coolant flows through the first channel prior to flowing through the second channel. In other of these variations, the coolant flow through the second channel prior to flowing through the first channel.

In another aspect, a method of operating a linearly extending concentrating solar energy receiver comprises flowing a coolant in a first direction along a first channel extending through the receiver substantially parallel to the receiver's long axis, flowing the coolant in a direction substantially parallel to the first direction in a second channel extending through the receiver substantially parallel to the receiver's long axis, flowing the coolant through a plurality of channels extending transverse to the receiver's long axis between the first channel and the second channel, and illuminating with concentrated solar radiation a surface of the receiver comprising solar cells in thermal contact with the coolant.

In another aspect, a solar energy receiver comprises a linearly extending substrate, and a plurality of solar cells disposed on a surface of the substrate and arranged in two or more rows. Each row is substantially parallel to a long axis of the substrate. Solar cells within each row are electrically connected in series and cells in different rows are not electrically connected in series.

In another aspect, a solar energy receiver comprises a plurality of solar cells arranged in at least one row substantially parallel to a long axis of the receiver. The receiver also comprises a plurality of bypass diodes each electrically coupled to a different solar cell or group of solar cells to bypass such solar cell or group of solar cells if a threshold current through such solar cell or group of solar cells is not exceeded. The length of the receiver, along its long axis, bypassed per diode is smaller near an end of the receiver than near a central portion of the receiver. In addition, or alternatively, the number of solar cells bypassed per diode is smaller near the end of the receiver than near the central portion of the receiver.

In some variations of this aspect, at least some of the bypass diodes are coupled in parallel to a same conductor. In some variations, all of the bypass diodes are coupled in parallel to a same conductor. In some variations, at least some of the bypass diodes are coupled to each other in series. In some variations, all of the bypass diodes are coupled to each other in series.

In another aspect, a solar energy receiver comprises a linearly extending substrate comprising one or more coolant channels, and a plurality of solar cells disposed on a surface of the substrate. The solar cells comprise electrical contacts on a front surface that is illuminated during use. Some or all of the electrical contacts are coated, painted, or otherwise treated to increase absorption of solar radiation, or formed from a material chosen to increase absorption of solar radiation.

In another aspect, a method of operating a solar energy collector comprises concentrating solar radiation to an approximately linear focus on a linear array of solar cells, with the linear focus approximately parallel to a long axis of the linear array of solar cells. The linear focus may be approximately centered in the linear array of solar cells. At least about 90%, or at least about 95% of the solar energy incident on the solar cells is concentrated on a central portion of the linear array of solar cells having a width, perpendicular to the long axis of the array of solar cells, of less than about 80% of the corresponding width of the linear array of solar cells. In some variations of this aspect, the solar radiation is concentrated on a front surface of the solar cells, and the solar cells comprise a bus bar located near an edge of the front surface outside of the central portion.

In another aspect, a method of operating a solar energy collector comprises concentrating solar radiation to an approximately linear focus on a front surface of a linear array of solar cells, with the linear focus approximately parallel to a long axis of the linear array of solar cells. The linear focus may be approximately centered in the linear array of solar cells. The solar cells comprise at lease one bus bar located near an edge of the front surface and oriented approximately parallel to the long axis of the linear array. The intensity of concentrated solar radiation incident on the bus bar is less than about 5%, less than about 10%, less than about 15%, less than about 20%, less than about 30%, less than about 40%, or less than about 50% of a peak intensity incident on the linear array of solar cells. The solar cells may comprise another bus bar located near an opposite edge of the front surface and oriented approximately parallel to the long axis of the linear array. The intensity of concentrated solar radiation incident on the other bus bar is also less than about 5%, less than about 10%, less than about 15%, less than about 20%, less than about 30%, less than about 40%, or less than about 50% of the peak intensity incident on the linear array of solar cells. In some variations, the intensity of concentrated solar radiation incident on each bus bar is less than about 5% of the peak intensity incident on the linear array of solar cells.

In another aspect, a solar energy collection system comprises first and second linearly extending receivers each comprising one or more coolant channels extending along its long axis. The first and second receivers are mechanically coupled to each other to form a V-shape with a long axis of the first receiver parallel to a long axis of the second receiver. Each receiver comprises a surface facing outward from the V-shape and an opposite surface facing into the V-shape. A first plurality of solar cells is disposed on the outward facing surface of the first receiver and a second plurality of solar cells is disposed on the outward facing surface of the second receiver. A first inverter is electrically coupled to the first plurality of solar cells but not to the second plurality of solar cells. A second inverter is electrically coupled to the second plurality of solar cells but not to the first plurality of solar cells. In some variations the first and second inverters are central inverters. Optionally, each of the central inverters may be electrically coupled to a different plurality of receivers.

Solar energy receivers as utilized or summarized above may comprise, for example, a linearly extending substrate comprising one or more coolant channels extending through the substrate along its long axis. The substrate may have, for example, a substantially rectangular cross section perpendicular to its long axis. Solar cells, where present, may be disposed on the substrate in a stack of two or more lamination layers, for example, and be in thermal contact with the substrate and coolant passing through the coolant channels. The substrate may be formed by an extrusion process from, for example, aluminum or an aluminum alloy.

The solar energy receivers of the various aspects summarized above may provide, for example, an electrical output, a heat output (in the form of heated coolant, for example), or both an electrical and a heat output. The receivers may be illuminated by concentrated radiation, for example, in a trough, linear Fresnel, or any other suitable solar energy collection system.

These and other embodiments, features and advantages of the present invention will become more apparent to those skilled in the art when taken with reference to the following more detailed description of the invention in conjunction with the accompanying drawings that are first briefly described.

BRIEF DESCRIPTION OF THE DRAWINGS

FIGS. 1A and 1B show, respectively, front and back views of an example solar energy receiver.

FIGS. 5A and 5B show exploded views of layers of an example lamination stack disposed on a substrate in a solar energy receiver and layers of a laminate structure electrical interconnect.

FIGS. 10A-10E show an example assembly that provides for flow of a coolant fluid into and through coolant channels in a substrate in a solar energy receiver.

FIG. 13 shows another example assembly that provides for flow of a coolant fluid into and through coolant channels in a substrate in a solar energy receiver.

FIGS. 16A-16C show an example of a solar energy receiver assembly comprising two receivers arranged to form a V shape.

FIGS. 21A and 21B show plan views of example arrangements of receivers associated with different solar energy collectors fluidly coupled in series.

DETAILED DESCRIPTION

Figure 2A:
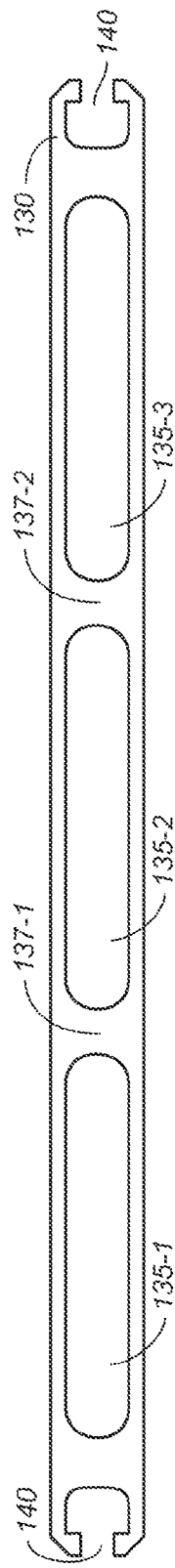
FIGS. 2A and 2B show cross sections of the example solar energy receiver of FIGS. 1A and 1B.

The following detailed description should be read with reference to the drawings, in which identical reference numbers refer to like elements throughout the different figures. The drawings, which are not necessarily to scale, depict selective embodiments and are not intended to limit the scope of the invention. The detailed description illustrates by way of example, not by way of limitation, the principles of the invention. This description will clearly enable one skilled in the art to make and use the invention, and describes several embodiments, adaptations, variations, alternatives and uses of the invention, including what is presently believed to be the best mode of carrying out the invention.

As used in this specification and the appended claims, the singular forms "a," "an," and "the" include plural referents unless the context clearly indicates otherwise. Also, the term "parallel" is intended to mean "substantially parallel" and to encompass minor deviations from parallel geometries rather than to require that parallel rows of reflectors or solar cells, for example, or any other parallel arrangements described herein be exactly parallel.

This specification discloses apparatus, systems, and methods by which solar energy may be collected to provide electricity or a combination of electricity and heat. Examples of solar energy receivers are disclosed that may be used, for example, in trough or linear Fresnel solar energy collectors in which one or more mirrors concentrate solar radiation onto such a receiver. Solar (e.g., photovoltaic) cells in the receivers provide an electrical output. The solar cells may, in some variations, be actively cooled by a coolant that flows through the receiver. In some variations, heat collected by the coolant may also be made available for use as an energy source.

Receivers as disclosed herein may be used, for example, in some variations of the methods, apparatus, and systems disclosed in U.S. Provisional Patent Application Ser. No. 61/249,151, incorporated herein by reference in its entirety.

Referring now to FIGS. 1A, 1B, 2A, and 2B, a solar energy receiver 100 comprises a plurality of solar cells 110 disposed in a lamination stack 120 on a top surface of a substrate 130. Solar cells 110 may be, for example, DelSolar D6G(3B) solar cells available from DelSolar Co., Ltd. of Hsinchu Taiwan, R.O.C., but any suitable solar cells may be used. Suitable solar cells may include, for example, conventional single or multi-crystalline silicon solar cells, thin film (e.g., amorphous silicon, cadmium telluride, or copper indium gallium selenide) solar cells, and III-V solar cells. In one example, solar cells 110 are DelSolar D6G(3B) solar cells diced in quarters of substantially even width and/or substantially equal areas normal to their 3 millimeter (mm) bus bar pads. In one example, solar cells 110 have dimensions of about 156 mm by about 29 mm, and are arranged on substrate 130 with their long axes perpendicular to the long axis of the substrate.

Although FIG. 1A shows a single string of 38 solar cells 110-1-110-38 arranged in a single row, in other variations more or fewer solar cells may be used, and they may be arranged in one (as shown), two, or more parallel rows along the substrate. In addition, two or more receivers 100 may be positioned end-to-end and electrically and fluidly coupled to provide a larger receiver.

In some variations in which solar cells are arranged in two or more parallel rows along the long axis of the substrate, cells within each such row are electrically connected in series, and cells in different such rows are not electrically connected in series. In these variations, all solar cells electrically connected in series may have approximately the same position as measured in a direction transverse (i.e., perpendicular) to the long axis of the receiver. Consequently, if the receiver is illuminated with a concentrated solar radiation intensity distribution that varies significantly in the transverse direction but does not vary significantly along the long axis of the receiver, then all solar cells electrically connected in series will be illuminated with approximately the same intensity of solar radiation.

FIG. 2A shows a cross section of an example substrate 130, taken perpendicular to the long axis of receiver 100 and substrate 130 along line 125 shown in FIG. 1A. In the illustrated example, substrate 130 comprises three coolant fluid flow channels 135-1, 135-2, 135-3 running the length of substrate 130 parallel to its long axis, separated from each other by ribs 137-1 and 137-2. More or fewer coolant channels (and separating ribs) may be used in other variations. Coolant channels may have an approximately (e.g., substantially) rectangular cross section, as shown in FIG. 2A, or any other suitable cross section. Substrate 130 shown in FIGS. 2A and 2B further comprises t-slots 140 located in the sides of substrate 130 and running parallel to its long axis. T-slots 140 may run the full length of substrate 130 or, alternatively, along only one or more portions of each side. T-slots 140 may be used to mechanically couple receiver 100 to other components of a solar energy collector and may be, for example, configured to be compatible with nuts, bolts, other fasteners, or features on other mechanical elements that can be fit into the slots to mechanically couple receiver 100 to brackets, support structure, and/or other mechanical elements (see, e.g., below).

T-slots 140 in the sides of substrate 130 are not required, and may be placed elsewhere or absent in some variations of receiver 100. For example, one or more t-slots similar or identical to t-slots 140 may be located on the back surface of substrate 130, and may run, for example parallel to the long axis of substrate 130. Such t-slots may run the full length of substrate 130 or, alternatively, only along one or more portions of substrate 130. In some variations in which the sides of substrate 130 are not (or not much) utilized for mechanical connections, lamination stack 120 may wrap around one or more sides of substrate 130 (e.g., one or both sides running parallel to the long axis) to reach and adhere to portions of the back side of substrate 130. Such wrapping of lamination stack 120 may run substantially the full length of substrate 130 or, alternatively, only along one or more portions of 130. In the latter case, portions of the sides of substrate 130 may remain available to be relatively easily utilized for mechanical connections.

Figure 2B:
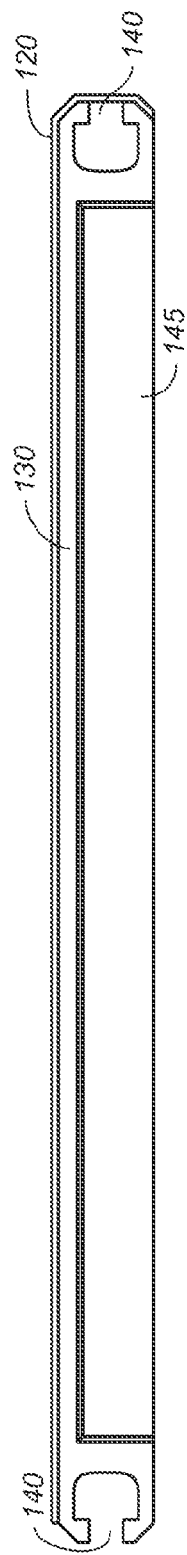

FIG. 2B shows another cross section of the example substrate 130 of FIG. 2A, perpendicular to its long axis, at or near an end of the substrate. In this example, an optional end cap 145 seals ends of coolant channels 135 (FIG. 2A). Referring now to FIG. 1B, which shows a back view of receiver 100, receiver 100 may further comprise optional coolant flow manifolds 150 attached to and fluidly coupled to end caps 145, and fluid interconnections 155 attached to manifolds 150. Coolant fluid flow paths, seals, and fluid interconnections between receivers 100 are discussed in greater detail below.

Substrate 130 (and hence receiver 100) may have, for example, a length of about 100 centimeters (cm) to about 400 cm, about 150 cm to about 350 cm, or about 275 cm to about 320 cm, a width of about 15 cm to about 25 cm, about 19 cm to about 22 cm, or about 20 cm to about 21 cm, and a thickness of about 1 cm to about 3 cm or about 1 cm to about 2 cm. In one example, substrate 130 has a length of about 160 centimeters (cm), a width of about 19.6 cm to about 20.8 cm, and a thickness of about 1.30 cm. In another example, substrate 130 has a length of about 275 cm, a width of about 19.6 cm to about 20.8 cm, and a thickness of about 1.30 cm. In another example, substrate 130 has length of about 320 cm, a width of about 19.6 cm to about 20.8 cm, and a thickness of about 1.30 cm.

In some variations, substrate 130 (comprising, e.g., t-slots and coolant fluid channels) is formed by an (e.g., conventional) extrusion process from, for example, aluminum or an aluminum alloy. Any other suitable material may also be used. In one example, substrate 130 is formed by an extrusion process from a 6063 aluminum alloy having a T-6 temper. One of ordinary skill in the art will recognize that extruded materials may be distinguished from cast materials, for example, by physical properties such as, for example, porosity, ductility, and/or permeability.

Solar cells 110 may be electrically connected in any suitable manner described herein or known to one of ordinary skill in the art. In some variations, all of solar cells 110 are electrically connected in series. In other variations, some of solar cells 110, or some groups of solar cells 110, are electrically connected in parallel. Diodes may be used to bypass solar cells, or groups of solar cells, that would otherwise limit the electrical current due, for example, to a fault in the cell or cells or to shadowing (or any other cause of uneven illumination) of the cell or cells.

Figure 3A:
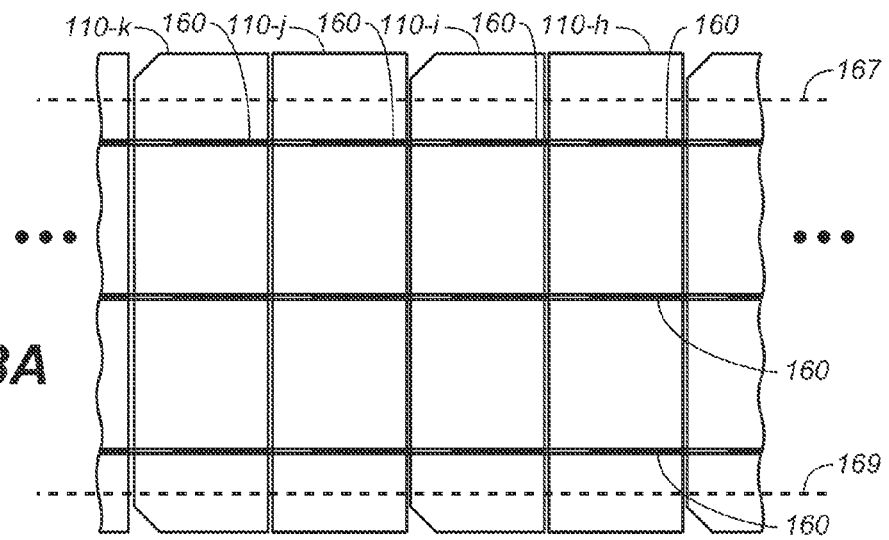
FIGS. 3A-3D show example wiring layouts on the front (FIG. 3A, FIG. 3D) and back (FIG. 3B, FIG. 3C) sides of a string of solar cells that may be used in solar energy receivers.
Figure 3B:
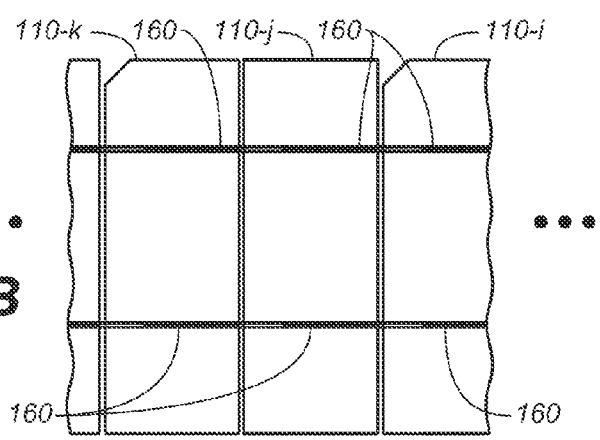
Figure 3C:
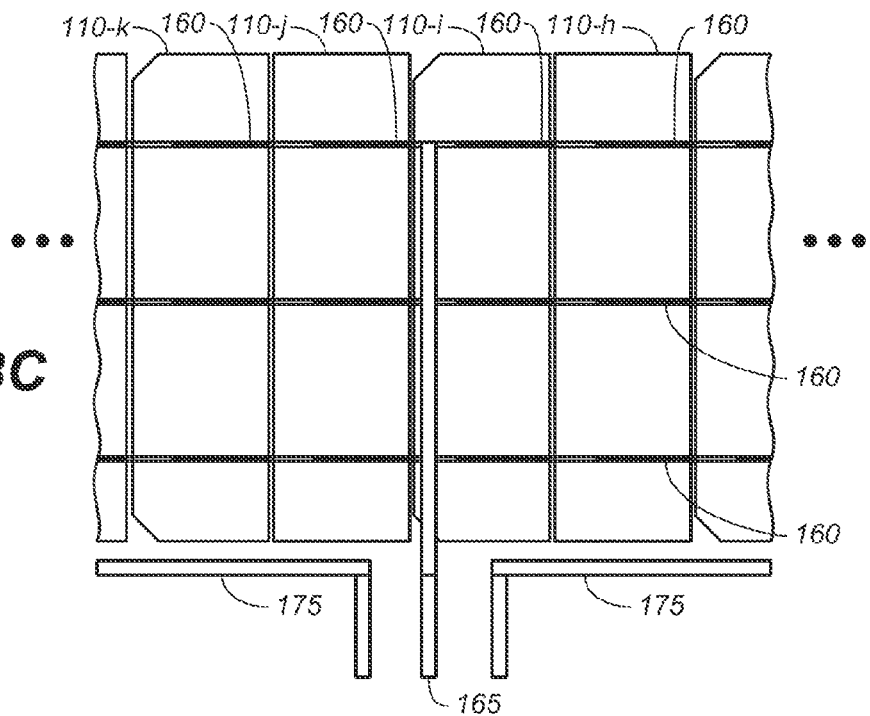

FIGS. 3A-3C show a portion of an example physical and wiring layout for solar cells 110. In the illustrated example, solar cells 110 (e.g., 110-h-110-k) are connected in series by electrical leads 160 (also referred to herein as tabs) that couple the front (illuminated side) of a cell to the back (unilluminated side) of an adjacent cell. For example, three tabs 160 electrically connect the front side of solar cell 110-i to the back side of solar cell 110-j. In the illustrated example, tabs 160 have a length selected to allow them to cross the entire width of the front sides of cells 110, as shown in FIG. 3A, but to cross only a portion (less than the entire width) of the back sides of the adjacent solar cells, as shown in FIG. 3B and FIG. 3C. This leaves an untabbed portion on the back of, and near the edge of, each of solar cells 110 that may be used to connect cells 110 to one or more bus bars (e.g., bus bar 165 in FIG. 3C) on the back side of solar cells 110. This also allows use of uniform tab lengths for tabs 160, the lengths of which might otherwise vary depending on the presence or absence of a bus bar beneath a particular cell. Solar cells 110 may be spaced apart from their neighbors by gaps of, for example, about 1 mm, about 1.5 mm, about 1.5 to about 2 mm, about 2 mm, about 3 mm, or more than about 3 mm.

Conventionally, electric contacts (e.g., tabs, bus bars, fingers) on the illuminated side of a solar cell are highly reflective to solar radiation. Such highly reflective contacts reflect solar radiation that might otherwise be converted to electricity, and also reduce collection of heat by the solar cells.

In some variations, some or all of the electric contacts on the illuminated side of a solar cell are coated, painted, treated, or formed from materials chosen to increase their absorption of solar energy. For example, ribbons used to tab solar cells (conventionally, tinned copper ribbons) may be coated, painted (e.g., black), or treated (e.g., chemically) to provide a black surface or otherwise increase their absorption of solar radiation. As another example, conductive pastes (conventionally comprising silver, for example) with which electric contacts (e.g., bus bars, fingers) are printed onto a solar cell may be filled with carbon particles or other materials that increase the contacts' absorption of solar radiation. The use of such highly absorbing (e.g., black) contacts may increase the collection of heat by, for example, about 5%, about 10%, or more than about 10% without reducing the surface area of the solar cell available to convert solar radiation to electricity.

In some variations, in use, a receiver is illuminated by concentrated solar radiation that under-fills the receiver. Referring again to FIGS. 1A and 3A, for example, (imaginary) lines 167 and 169 approximately define the edges of the linearly extending focus of the concentrated solar radiation incident on the receiver. In some variations, more than about 80%, more than about 85%, more than about 90%, or more than about 95% of the energy of the concentrated solar radiation is incident on the receiver between focus edges 167 and 169. In these variations, the width of the receiver between focus edges 167 and 169 may be about 75%, about 80%, about 85%, about 90%, or about 95% of the overall width of the receiver, or of that portion of the receiver comprising solar cells. In some variations at least about 90%, or at least about 95% of the solar energy incident on the solar cells is concentrated on a central portion of the linear array of solar cells having a width, perpendicular to the long axis of the array of solar cells, of less than about 80% of the corresponding width of the linear array of solar cells. Under-filling the receiver in this manner may increase the efficiency with which concentrated solar radiation is collected and converted to useful electricity or heat.

Figure 3D:
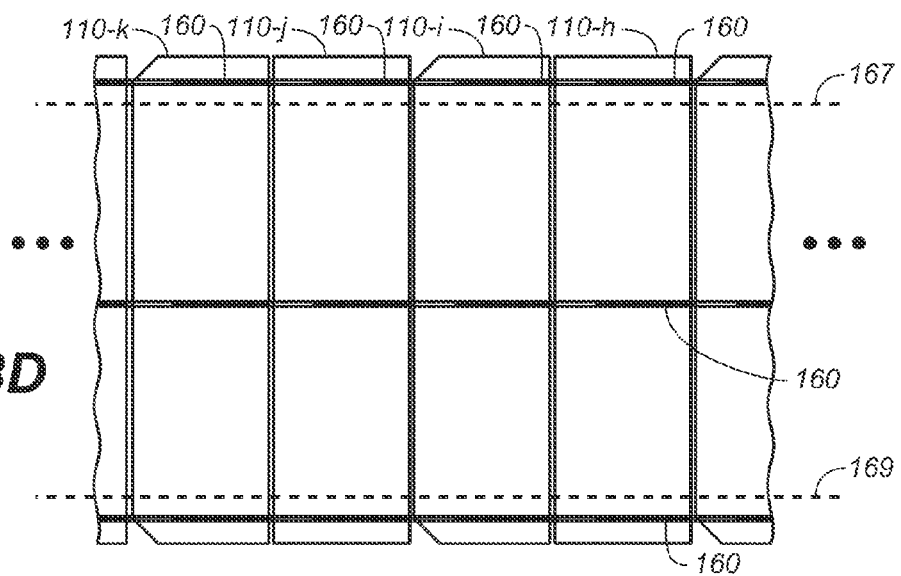

Under-filling the receiver also provides an opportunity to move reflective electrical contacts on the surface of the solar cells to peripheral portions of the receiver upon which the intensity of the concentrated solar radiation is low, relative to that incident on the central portion of the receiver. This may reduce the amount of solar radiation lost by reflection from those contacts. In some variations, electrical contacts (e.g., 160 in FIGS. 3A-3D) on the illuminated surface of solar cells and running approximately parallel to the long axis of the receiver are located at outer edges of the receiver at which, during operation, the intensity of the concentrated solar radiation is less than about 5%, less than about 10%, or less than about 15% of the peak intensity of concentrated solar radiation incident on the receiver. For example, in the variation illustrated in FIG. 3D, the two outer tabs 160 (and, e.g., solar cell bus bars underlying them) are positioned closer to the outer edges of the solar cells than in the variation illustrated in FIG. 3A, and outside of the approximate edges 167, 169 of the linear focus of solar radiation concentrated onto the receiver.

Figure 4A:
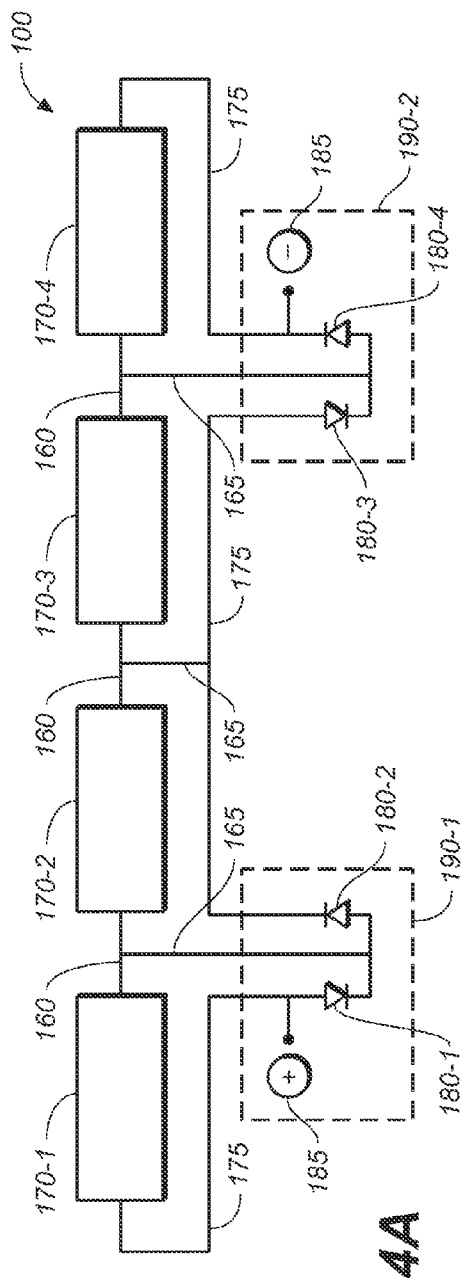
FIGS. 4A and 4B show example circuit diagrams for solar energy receivers.

FIG. 4A shows an example circuit diagram for receiver 100. Groups 170-1-170-4 of solar cells 110 (not individually shown) are connected in series with each other, and also in parallel (via bus bars 175) with bypass diodes 180-1-180-4. Electrical sockets 185, providing an electrical output from receiver 100, may be used to interconnect one or more receivers 100 (in series or parallel) or to allow connection of receiver 100 to an electrical load. If one or more solar cells in a group (e.g., group 170-1) limits current through that group to below a threshold value, the corresponding bypass diode (e.g., bypass diode 180-1) will be forward biased and consequently turn on to allow current to bypass the underperforming group. In some variations, bypass diodes and electrical sockets are housed in junction/diode boxes (e.g., 190-1, 190-2) which may be located, for example, on a bottom (unilluminated) side of receiver 100 (see, e.g., FIG. 1B).

Referring again to FIG. 4A, groups 170 may include one or more solar cells, and may include equal or differing numbers of solar cells. Groups may include, for example, about 5 solar cells, about 10 solar cells, about 15 solar cells, or about 20 solar cells. Although in the example of FIG. 4A solar cells are grouped into four groups, each of which may be bypassed, any suitable number of bypassable groups, and any suitable number of cells per group, may also be used. Referring now to FIGS. 1A and 4A together, in the illustrated example group 170-1 includes solar cells 110-1-110-10, group 170-2 includes cells 110-11-110-19, group 170-3 includes cells 110-20-110-30, and group 170-4 includes cells 110-31-110-38.

Figure 4B:
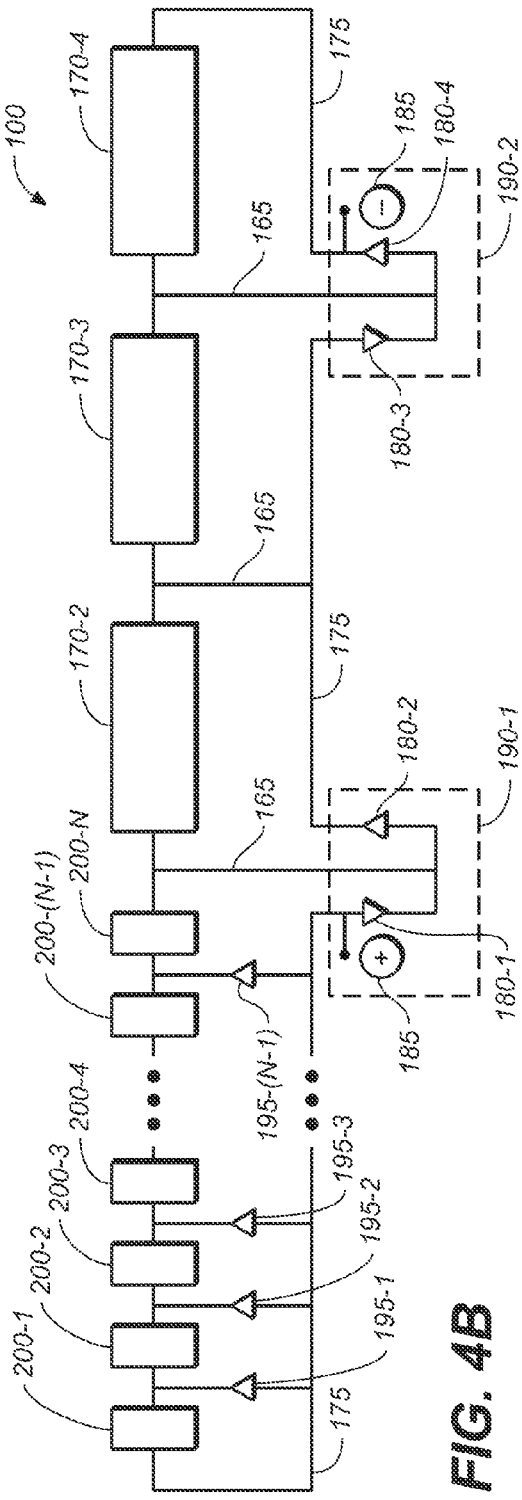

FIG. 4B shows another example circuit diagram for receiver 100. This circuit is substantially similar to that of FIG. 4A, except that series connected solar cell groups 200-1-200-N have been substituted for solar cell group 170-1 of FIG. 4, and that additional bypass diodes 195-1-195-(N−1) have been placed each in parallel with a corresponding one of solar cell groups 200-1-200-(N−1). Bypass diodes 195 are electrically connected between a shared bus bar 175 and different ones of solar cell groups 200 and thus, unlike bypass diodes 180-1-180-4, are not in series with each other.

If one or more solar cells in one of groups 200 (e.g., group 200-3) limits current through that group to below a threshold value, the corresponding diode (e.g., diode 195-3) will turn on. Current will consequently bypass the limiting solar cell group (e.g., 200-3), as well as all other solar cell groups (e.g., 200-1 and 200-2) located earlier in the circuit. This arrangement provides the flexibility of allowing either a single (e.g. 200-1) or multiple solar cell groups to be bypassed with only a single diode voltage drop. In contrast, to bypass both of groups 170-2 and 170-3 requires two diode drops (across diodes 180-1 and 180-2). If, for example, during the course of a day (or a season) the edge of a shadow walks along receiver 100 from solar cell group 200-1 toward group 200-N, as these groups progressively join the shaded region of the receiver their corresponding diodes will turn on to bypass all shaded solar cell groups at the cost of a single diode drop.

Groups 200 may include one or more solar cells, and may include equal or differing numbers of solar cells. Groups 200 may include, for example, about 2 solar cells, about 5 solar cells, about 10 solar cells, about 15 solar cells, or about 20 solar cells. Any suitable number of groups 200 may be used. Diodes 195 may be, for example, incorporated into the solar cell circuit during manufacture of the solar cells, or be incorporated into or otherwise attached to substrate 130. Any suitable mounting of diodes 195, described herein or known to one of ordinary skill in the art, may be used.

In some variations, a receiver 100 is oriented (e.g., North-South) such that, over time (e.g., during the course of a day or a year), solar radiation concentrated onto the receiver by reflectors, for example, walks along and off the length of receiver 100 and hence leaves a progressively lengthening portion of one end (e.g., an end nearest the earth's equator) of receiver 100 unilluminated. This can occur, for example, as the angle of the sun above the horizon varies during the course of a day or a year. In such variations, the receiver 100 may include, at and/or near the end portion of the receiver experiencing the varying illumination, solar cell groups and diodes arranged as or similarly to groups 200 and diodes 195 in FIG. 4B.

In some variations, a receiver comprises bypass diodes electrically connected to solar cells arranged along the long axis of a receiver such that the number of solar cells (and the corresponding length of the receiver) bypassed per diode is smaller near an end of the receiver than at some other (e.g., more central) portions of the receiver along the long axis. Referring again to FIG. 4A, this could be accomplished, for example, by having fewer solar cells in group 170-1, or in each of groups 170-1 and 170-2, than in other groups further along the receiver. Similarly, referring again to FIG. 4B, there may be fewer solar cells in group 200-1, or in each of groups 200-1 and group 200-2, than in other groups further along the receiver. Receivers in these variations may be oriented (e.g., North-South) in use such that solar radiation concentrated on the receiver by reflectors walks off an (e.g., equatorial) end of the receiver having fewer solar cells per bypass diode toward a central portion of the receiver having a greater number of solar cells per bypass diode. Such an arrangement may reduce the drop in electric generation efficiency of the receiver resulting from the varying illumination, or reduce the cost of the receiver while achieving approximately the same efficiency, compared to a receiver in which the number of solar cells per bypass diode is constant along the length of the receiver.

Any suitable diodes may be used for diodes 180 and diodes 195. In some variations, diodes 180 and/or diodes 195 may be Vishay diodes having part number G1756 or Motorola diodes having part number MR756.

As noted earlier with respect to FIGS. 1A, 1B, 2A, and 2B, solar cells 110 are disposed in a lamination stack 120 on a top surface of substrate 130. Referring now to FIG. 5A, in one variation lamination stack 120 comprises an adhesive layer 210 disposed on substrate 130, an electrically insulating (i.e., dielectric) layer 220 disposed on adhesive layer 210, a second adhesive layer 230 disposed on electrically insulating layer 220, solar cells 110 (and associated electrical interconnects, such as bus bar 175 for example) disposed on second adhesive layer 230, third adhesive layer 240 disposed on solar cells 110, and transparent front sheet 250 disposed on third adhesive layer 240.

The adhesive layers adhere to adjacent surfaces to hold stack 120 together and to attach it to substrate 130. Electrically insulating layer 220 electrically isolates solar cells 110 from substrate 130. Front sheet 250 provides a flat surface and protects solar cells 110 from the ambient environment. The layers between substrate 130 and solar cells 110 also accommodate mismatches in thermal expansion between the solar cells and the substrate, and conduct heat from the solar cells to the substrate.

In some variations, the width (the dimension in the plane of substrate 130 perpendicular to the long axis of the substrate) of the solar cells is less than that of some or all other layers in stack 120. This provides gaps between the edges of the solar cells and the edges of stack 120 that deter migration of moisture from the ambient environment through the edges of stack 120 to the solar cells. In some variations, one or more such gaps have widths greater than about 5 mm, greater than about 8 mm, greater than about 12 mm, or greater than about 15 mm. In some variations, one or more such gaps have widths greater than or equal to about 12.7 mm. In some variations, the solar cells have widths approximately equal to that of the substrate, and other layers of stack 120 extend beyond an edge or edges of substrate 130 to accommodate a gap as described above. In some other variations, stack 120 has a width approximately equal to that of the substrate, and solar cells 110 have widths less than that of the substrate to accommodate a gap as described above.

In one variation, adhesive layer 210 has a thickness of about 200 microns (μm) to about 500 μm and is or includes an EVA (ethyl vinyl acetate) based adhesive such as, for example, 15420P/UF adhesive available from STR Inc.; electrically insulating layer 220 has a thickness of about 100 μm to about 150 μm and is or includes a PET (polyethylene terephthalate) such as, for example, Melinex 648 or Melinex 6430, available from Dupont Teijin Films; second adhesive layer 230 has a thickness of about 200 μm to about 500 μm and is or includes an EVA based adhesive such as, for example, 15420P/UF adhesive available from STR Inc; solar cells 110 have a thickness of about 180 μm to about 240 μm (e.g., 180±30 μm or 210±30 μm); third adhesive layer 240 has a thickness of about 200 μm to about 500 μm and is or includes an EVA based adhesive such as, for example, 15420P/UF adhesive available from STR Inc; and front sheet 250 has a thickness of about 50 μm to about 400 μm, or about 50 μm to about 125 μm, or about 100 μm to about 400 μm and is or includes an ETFE (ethylene-tetrafluoroethylene) fluoropolymer such as, for example, Tefzel® available from Dupont™.

In other variations stack 120 may include additional or fewer layers or may substitute different materials and/or thicknesses for one or more of the layers. For example, in some variations adhesive layer 210 and/or adhesive layer 230 may be or include a filled EVA adhesive. In some variations, insulating layer 220 is or includes a PET which is dyed, filled, or in some other manner colored white. In other variations, adhesive layer 210 is about 50 μm thick, and electrically insulating layer 220 is or includes a PFV (polyvinyl fluoride film) such as, for example, a Tedlar® PVF film available from Dupont™. In some variations front sheet 250 is or includes a PET (polyethylene terephthalate) such as, for example, Melinex 6430 available from Dupont Teijin Films, and has a thickness of about 50 μm to about 125 μm. In other variations, front sheet 250 is or includes a silicate (e.g., low-iron) glass sheet, such as for example a sheet of Solar Diamant glass available from Saint Gobain Glass and having a thickness of about 2.5 mm to about 4 mm.

In some variations, solar cells 110 are surrounded by a suitable silicone gel, available for example from Dow Corning, that replaces layers 210, 220, 230, and 240, and front sheet 250 is or includes a low-iron glass sheet. The silicone gel, or portions thereof, may be a filled silicone gel. The silicone gel may have a thickness, for example, of about 200 μm to about 1000 μm.

Tabbing and electrical interconnects (e.g., bus bar 175) associated with solar cells 110 may be formed, for example, from copper ribbon conventionally tinned with solder.

Filled EVA, PET, and silicone materials suitable for use in stack 120 may include materials filled, for example, with particles of MgO, $Al_2O_3$, ZnO, BN, and/or carbon, or a mixture of particles of any thereof.

In some variations, surfaces of substrate 130 to which stack 120 is to be attached are treated with a (e.g., chemical) conversion coating process to provide a conversion coating on substrate 130 to which a bottom layer of stack 120 will more strongly adhere and/or to improve corrosion resistance of substrate 130. Suitable conversion coating processes include, but are not limited to, conventional chromate, phosphate, and oxide conversion coating processes. In one variation, conversion coating is performed according to Mil Spec MIL-C-5541 class 1a. In other variations, surfaces of substrate 130 to which stack 120 is to be attached may be sand or bead blasted to promote adhesion.

In variations in which front sheet 250 is or includes an ETFE (ethylene-tetrafluoroethylene) fluoropolymer such as, for example, Tefzel®, the surface of front sheet 250 to be bonded to adhesive layer 240 may be pre-treated with a conventional corona etching process to promote adhesion.

Stack 120 may be formed, for example, by stacking the layers on substrate 130 in the order as described above and then heating them in a conventional thermal laminator apparatus. Other methods of forming stack 120 may also be used.

In some variations, the surface of substrate 130 to which solar cells 110 are attached is curved in the directions perpendicular to the long axis of receiver 100 so that the centerline of that surface running parallel to the long axis is higher than the outer portions of that surface. The surface may have a radius of curvature of, for example, about 5 meters to about 100 meters. In such variations, stack 120 (including solar cells 110) laminated to such a curved surface adopts a comparable curvature, which may reduce strain in solar cells 110 resulting from thermal expansion. Also, in some variations some or all of solar cells 110 are scored or scribed (e.g., using for example, laser scribing or mechanical scoring or scribing) on their unilluminated surface to guide cracking that might occur in solar cells 110 along directions that preserve electrical connections to cracked portions of the cells. For example, a solar cell may be scribed or scored in the direction parallel to the long axis of receiver 100, with a single scribed or scored line located between each pair of parallel tabs along the cell. Other suitable arrangements of scribing or scoring may also be used. Lasers suitable for scribing solar cells in this manner may include, for example, pulsed lasers lasing at 1064 nanometers. Suitable lasers may be available, for example, from ROFIN or from Epilog Laser.

In some variations, one or more wiring channels run within substrate 130 substantially parallel its long axis for the length of, or portions of the length of, receiver 100. The wiring channels comprise wires or other conductors electrically coupled to solar cells 110 by, for example, additional wires or conductors electrically connected to the solar cells (e.g., to bus bars in lamination stack 120 electrically connected to the solar cells) via holes passing from the wiring channel or channels through substrate 130 to the surface on which lamination stack 120 is disposed. In some variations, this arrangement allows electrical interconnection of two or more receivers through their ends via the wiring channel or channels. In some variations, bypass diodes electrically connected to the solar cells as described above, for example, are also located in the wiring channels. In other variations, such bypass diodes are located in other channels or cavities in substrate 130 and electrically connected by additional wires or conductors to the solar cells, or to conductors in the wiring channel, via additional holes in substrate 130.

In some other variations receiver 100 comprises electrically insulated interconnects (e.g., insulated wires or insulated conducting ribbons) that pass through holes in the substrate or wrap around one or more edges of the substrate to electrically connect solar cells on a front surface of the receiver to one or more junction/diode boxes (e.g., including bypass diodes and/or sockets as described above) on a rear surface of the receiver. Such electrically insulated interconnects may have a laminate structure, in some variations.

Figure 5B:
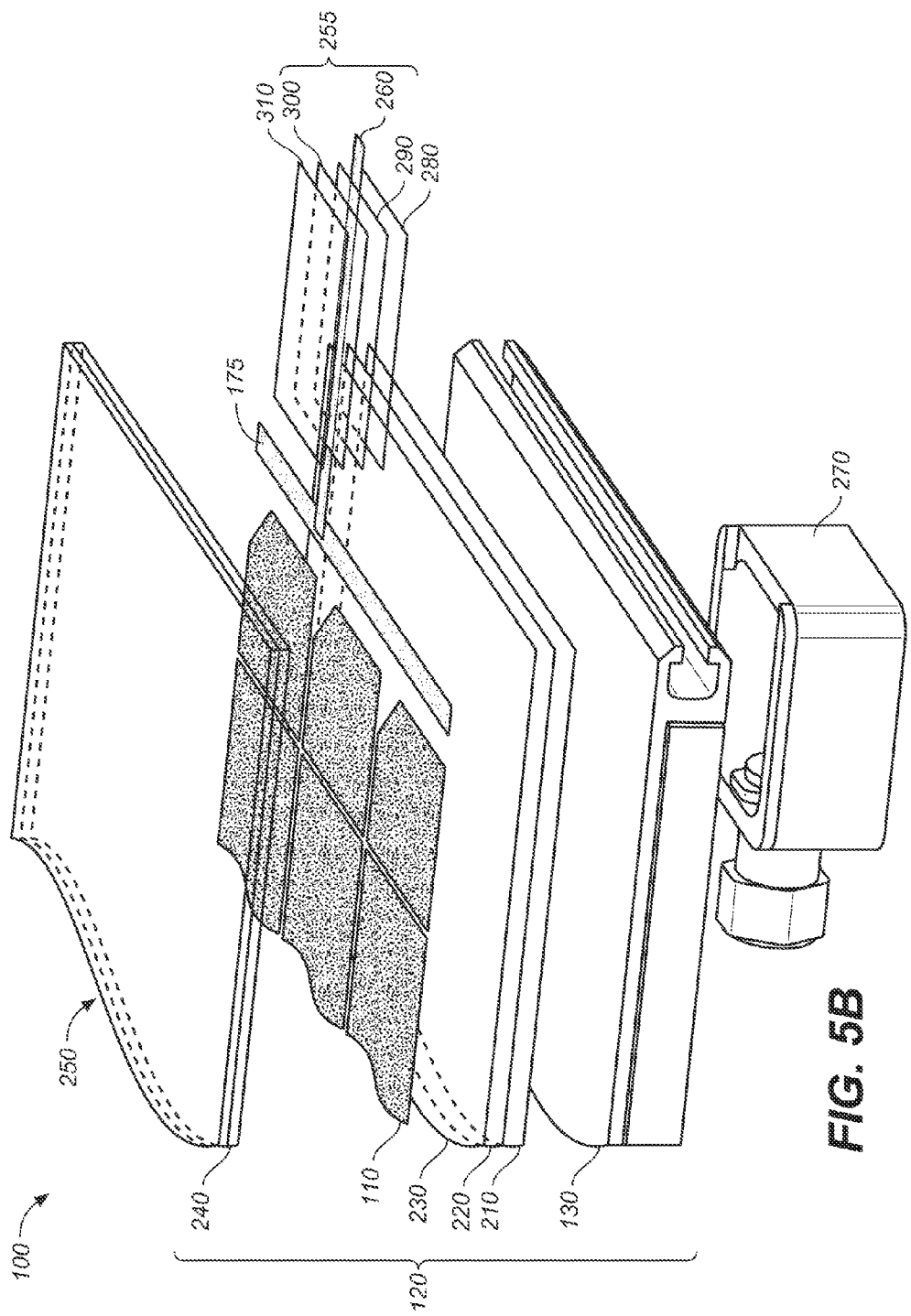
Figure 6A:
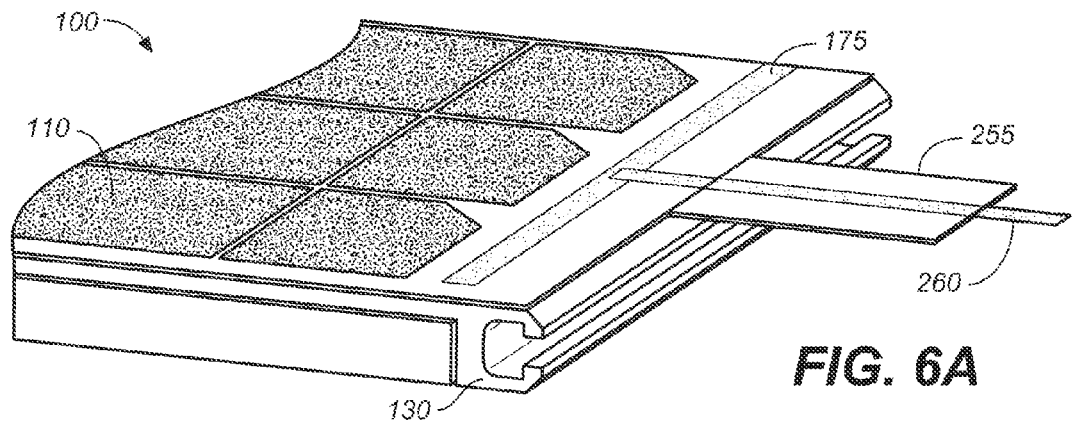
FIGS. 6A-6C show a structure allowing electrical interconnection of solar cells on one face of a solar energy receiver with (e.g., a junction and/or diode box positioned on) an opposite face of the solar energy receiver.
Figure 6B:
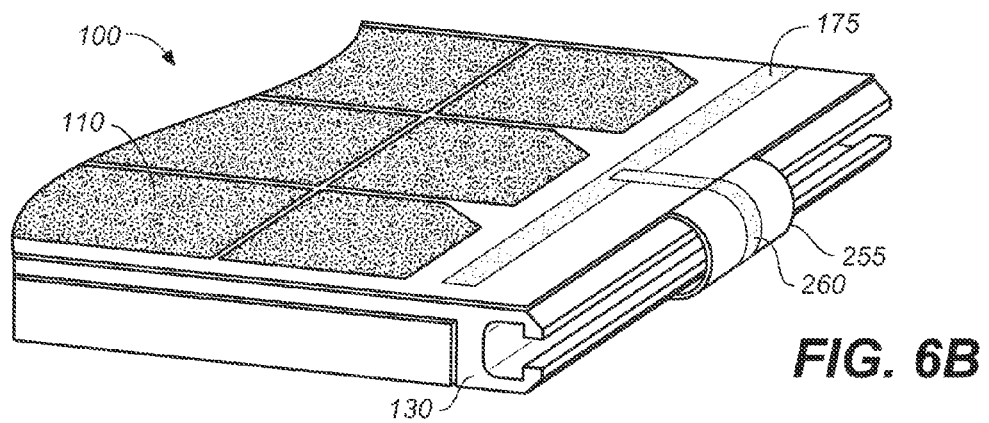
Figure 6C:
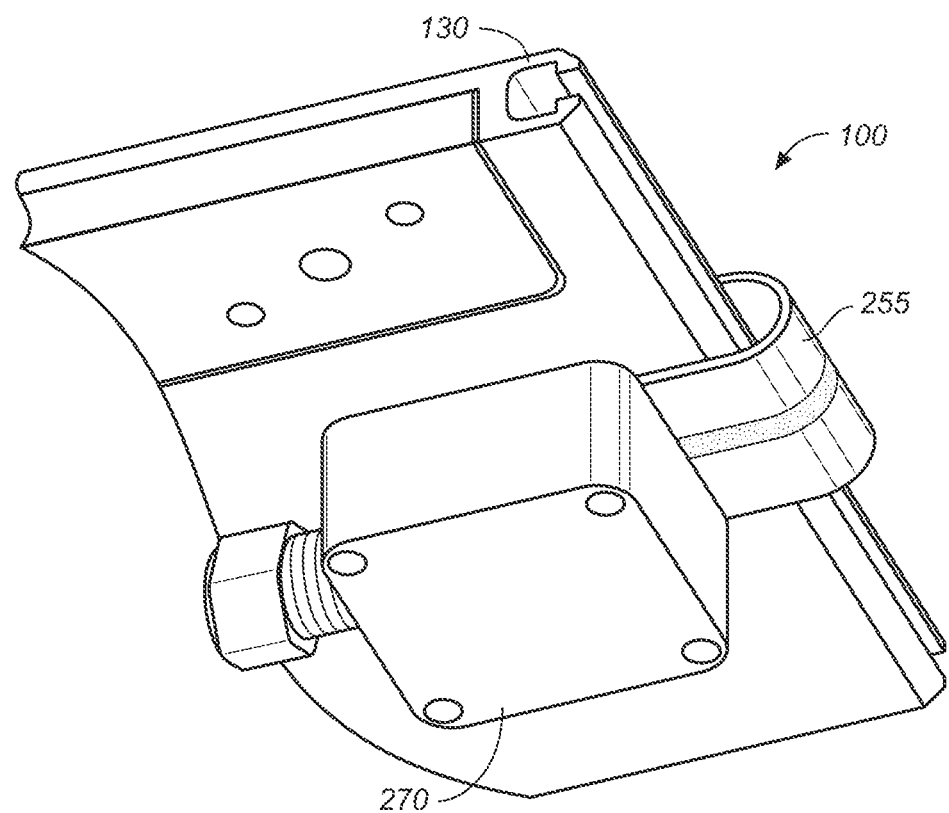

Referring now to FIG. 5B, for example, as well as to FIGS. 6A-6C, in some variations receiver 100 comprises one or more laminate structure interconnects 255 as electrically insulated interconnects electrically connecting solar cells 110 on a front (illuminated) surface of receiver 100 to one or more junction/diode boxes 270 on a rear (unilluminated) surface of receiver 100. In the illustrated example, interconnect 255 has a laminate structure comprising a first electrically insulating layer 280, an adhesive layer 290 disposed on insulating layer 280, an electrical interconnect 260 disposed on adhesive layer 280, a second adhesive layer 300 disposed on electrical interconnect 260, and a second insulating layer 310 disposed on adhesive layer 300. The adhesive layers hold the laminate structure together. Insulating layers 280 and 310 prevent inadvertent electrical contact between interconnect 260 and other portions of receiver 100.

Interconnect 260 extends beyond the other layers of laminate structure interconnect 255 to allow interconnect 260 to be electrically connected at one end to solar cells 110 (e.g., via bus bar 175) and electrically connected at another end to, e.g., a junction/diode box. In the illustrated example, one end portion of interconnect 260 extending beyond the other layers of laminate structure interconnect 255 is sandwiched, with solar cells 110 and their associated electrical interconnects, between adhesive layers 230 and 240 of laminate stack 120. An end portion of laminate structure interconnect 255 from which interconnect 260 protrudes may also be sandwiched between layers 230 and 240 of laminate stack 120 so that layers of laminate stack 120 and layers in laminate structure 255 overlap by, for example, about 5 mm, about 8 mm, about 12 mm, about 15 mm, about 20 mm, about 25 mm, or greater than about 25 mm. In some variations, the overlap is about 21 mm.

In some variations, each of insulating layers 280 and 310 has a thickness of about 50 μm to about 400 μm, or about 50 μm to about 125 μm, or about 100 μm to about 400 μm and is or includes an ETFE fluoropolymer such as, for example, Tefzel®, available from Dupont™; each of adhesive layers 290 and 300 has a thickness of about 200 μm to about 500 μm and is or includes any of the adhesive materials disclosed above for use in laminate stack 120; and interconnect 260 is formed from a copper ribbon conventionally tinned with solder.

In some variations in which laminate structure interconnect 255 includes ETFE (e.g., Tefzel) outer layers, these layers may be pre-treated with a conventional corona etching process on both sides of both layers (e.g., sheets), prior to assembly of laminate structure 255, to promote adhesion to layers in laminate structure 255 and to layers in stack 120.

In other variations, laminate structure interconnect 255 may include additional or fewer layers or may substitute different materials and/or thicknesses for one or more of the layers. Although in the illustrated example laminate structure interconnect 255 includes only a single electrical interconnect 260, in other variations laminate structure interconnect 255 may include two, three, four, or more interconnects 260. Laminate structure interconnect 255 may include as many interconnects 260 as necessary, for example, to electrically connect solar cells 110 to junction boxes and/or bypass diodes in configurations as described herein or as known to one of ordinary skill in the art.

In some variations, laminate structure interconnect 255 is formed prior to laminate stack 120, for example, by stacking the constituent layers of laminate structure interconnect 255 in the order described above and then heating them in a conventional laminator apparatus. In some such variations, lamination (i.e., formation) of interconnect 255 occurs at temperatures no greater than about 100° C. End portions of the resulting laminate, including an end portion of interconnect 260, may then be interleaved with layers from which laminate stack 120 is to be formed, and the resulting stack then laminated as described above with respect to stack 120. In other variations, the constituent layers of laminate structure interconnect 255 are stacked in the illustrated order and interleaved with the constituent layers of stack 120, also in the illustrated order, and then the resulting stack is laminated as above with respect to stack 120.

Referring now to FIGS. 6A-6C, laminate structure interconnect 255 may be bent to wrap around an edge of substrate 130 to allow laminate structure interconnect 255 to reach junction/diode box 270 and thus allow interconnect 260 to electrically connect solar cells 110 on the front side of receiver 100 with electrical components in junction/diode box 270 on the rear surface of receiver 100. Junction/diode box 270 may be mounted on the rear surface of receiver 100 with an adhesive or with screws or other mechanical connectors, for example, or by any other suitable means described herein or known to one of ordinary skill in the art. In some variations, laminate structure interconnect 255 is attached to substrate 130 with a silicone adhesive (e.g., PV804 available from Dow Corning®) and/or tape (e.g., VHB tape available from 3M™). Such attachment may be, for example, sufficient to prevent moisture from condensing on surfaces between interconnect 255 and substrate 130 and/or sufficient to provide a good heat conduction path between interconnect 255 and cooled substrate 130.

Receiver 100 is described in this specification as having an illuminated front side and an unilluminated rear or back side. It should be understood that these characterizations are meant to indicate that concentrated solar radiation may be intentionally directed to the (illuminated) front side, but not intentionally directed to the (unilluminated) back or rear side. Nevertheless, the back or rear side of receiver 100 may be illuminated by direct (not concentrated) solar radiation, and may be inadvertently illuminated by concentrated solar radiation. Laminate structure interconnect 255, described above, may also be exposed to direct solar radiation and/or inadvertently illuminated by concentrated solar radiation.

Figure 7A:
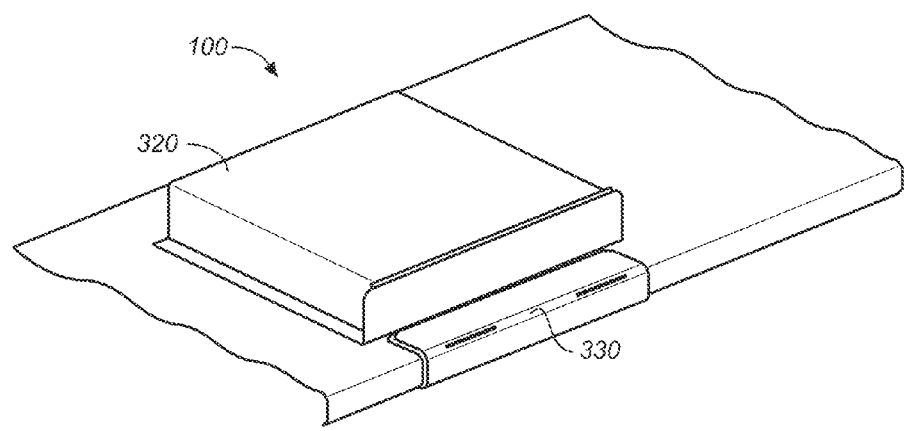
FIGS. 7A and 7B show an example use of shields to protect a junction/diode box, and an electrical interconnection between the junction/diode box and solar cells on an opposite face of a solar energy receiver, from solar radiation concentrated on the receiver.
Figure 7B:
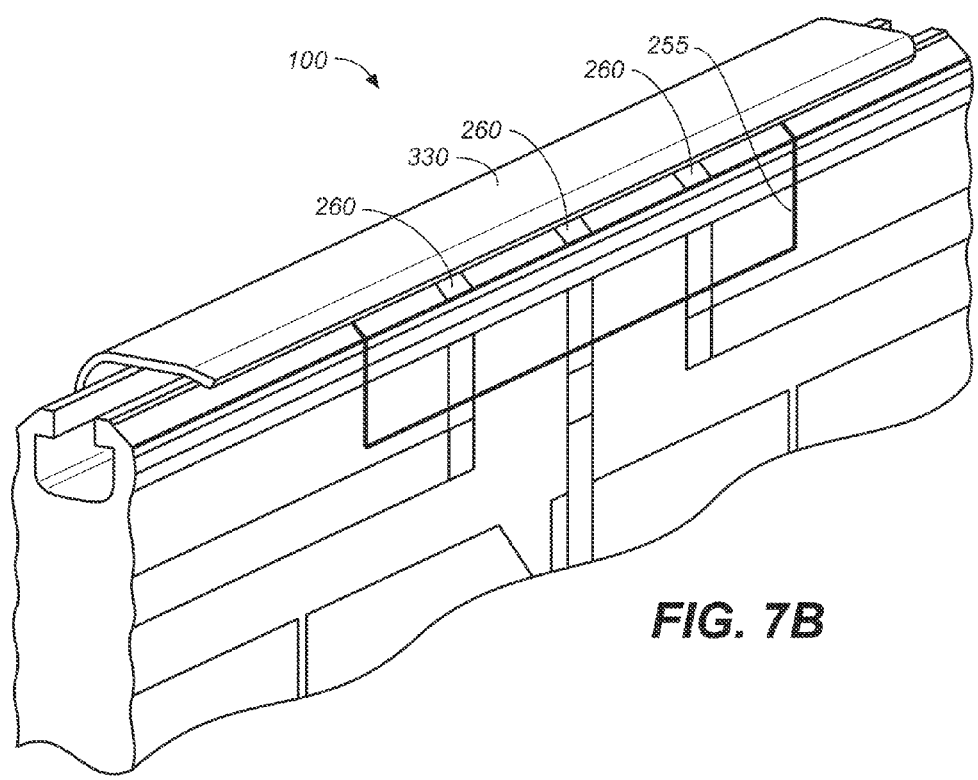

Referring now to FIGS. 1B, 7A, and 7B, in some variations one or more junction/diode boxes and/or electrical interconnects (e.g., interconnect 255 of FIGS. 6A-6C) are covered and thus shielded from illumination by direct or concentrated solar radiation by, respectively, junction/diode box shield 320 and/or interconnect shield 330.

Shields 320 and 330 may be formed, for example, from sheet metal, metal foil, adhesive metal foil, metal tape, or from a metalized plastic and may be attached to receiver 100 with, for example, any suitable adhesive (e.g., Dow Corning® PV804), tape (e.g., 3M™ VHB™ tape), or mechanical fastener. The metal in such metal sheets, foils, tapes, or metalized plastics may be or comprise, for example, aluminum (anodized, or not) or steel. Junction/diode box shield 320 may have the form of a box, for example. Interconnect shield 330 may have, for example, an approximately "L" shape, with the long portion on the rear surface of receiver 100 and the short portion wrapping around a side of receiver 100. Shields 320 and 330 may be configured to maintain a small gap of about 1.5 mm between the shield and the shielded component (e.g., junction/diode box or interconnect) to prevent a shield heated by (e.g., concentrated) solar radiation from damaging the shielded component. In other variations, a heat conducting adhesive (e.g., PV804) may be used to couple the shield, the shielded component, and cooled substrate 130 in order to prevent such damage.

Figure 8:
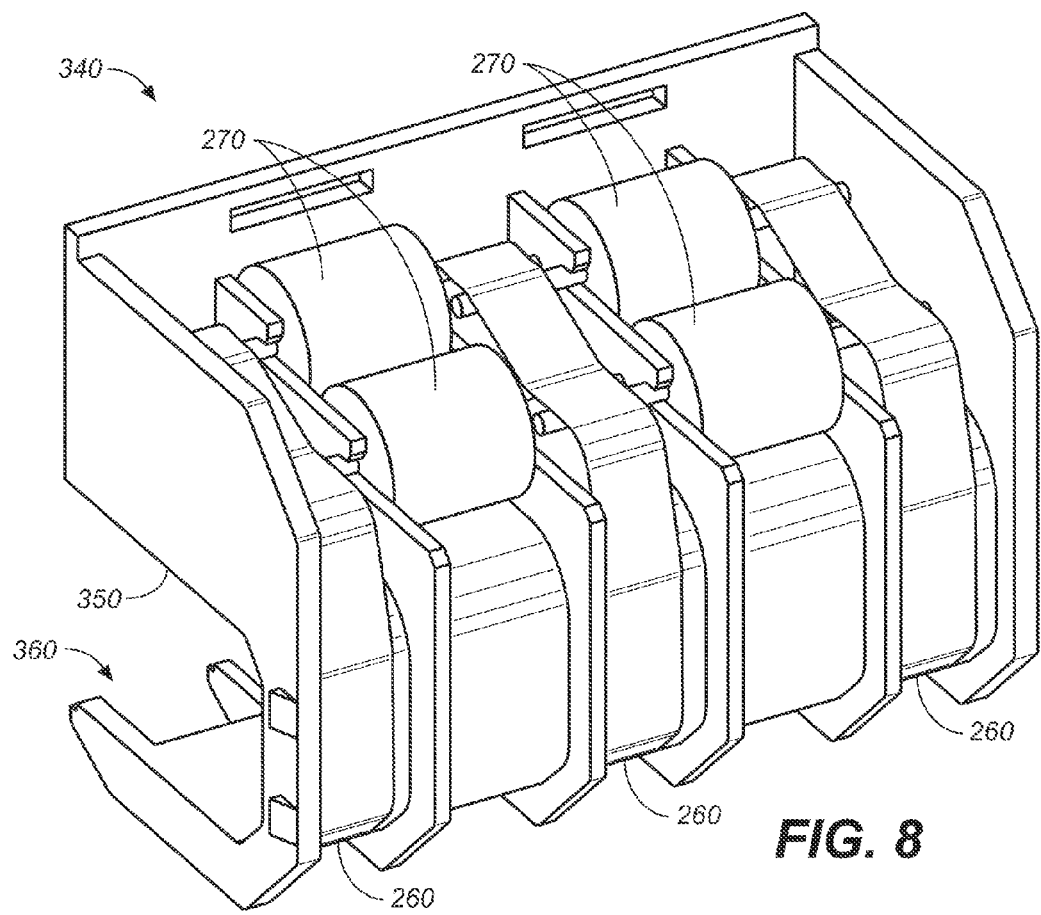
FIG. 8 shows an example junction/diode box comprising a slot dimensioned to fit around an edge of a solar energy receiver.

Referring now to FIG. 8, in another variation a junction/diode box 340 comprises a C-shaped portion 350 defining a slot 360 dimensioned to fit around (and optionally, clip on to) an edge of substrate 130 to locate bypass diodes 270 on a back (unilluminated) side of receiver 100. Interconnects 260 connect, e.g., diodes 270 in box 340 to bus bars and/or other electrical interconnects associated with solar cells 110. Such electrical connection to solar cells 110 may be accomplished, for example, through slits or openings in upper layers of laminations stack 120 (FIG. 5A, slits or openings not shown). Junction/diode box 340 may be formed, for example, from an engineering thermoplastic such as poly(p-phenylene oxide) (PPO) or similar material, from a metal, or from any other suitable material described herein or known to one of ordinary skill in the art. Junction/diode box 340 in FIG. 8 is shown with its lid or cover off. In use, a metal or plastic lid may be attached to box 340 to enclose the diodes and interconnects. In some variations, junction/diode box 340 may be shielded from solar radiation by an (e.g., sheet metal) outer box.

Figure 9:
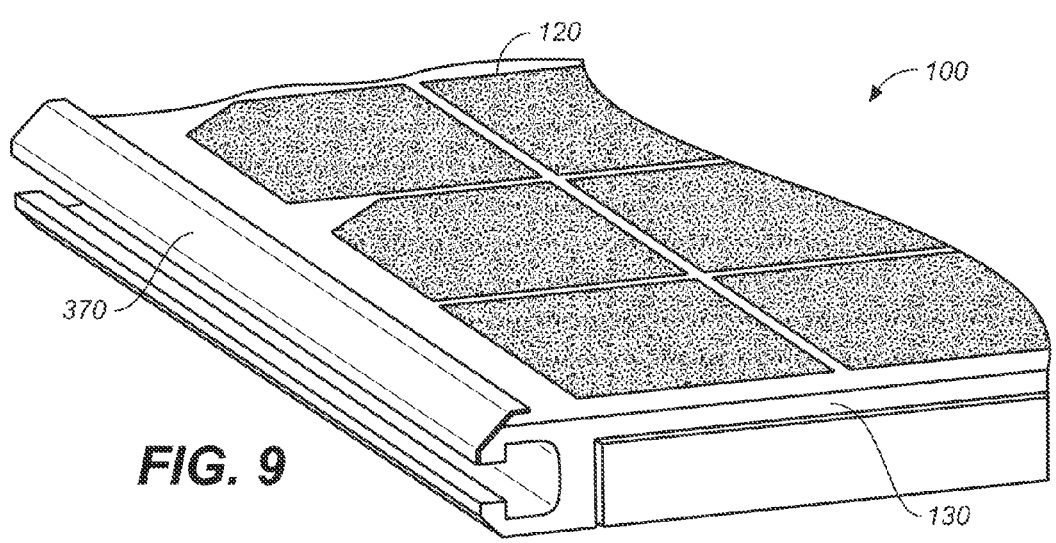
FIG. 9 shows an example use of a tape to seal an edge of a laminate disposed on a substrate in a solar energy receiver.

Referring now to FIG. 9, in some variations some or all edges of laminate structure 120 that would otherwise be exposed to the ambient environment are sealed. In the illustrated example, an edge of laminate structure 120 is sealed with a strip of tape 370 overlapping and adhering to laminate structure 120 and a side portion of substrate 130. Suitable tapes for this purpose may include, for example, 3M™ Aluminum Foil Tape 425. Tape 370 may overlap both the laminate structure and unlaminated portions of substrate 130 by, for example, about 5 mm, about 10 mm, or more than about 10 mm.

As noted above with reference to FIG. 2A, substrate 130 of receiver 100 comprises coolant channels allowing coolant to be flowed through substrate 130 to collect heat from, and thus cool, solar cells 110. Any suitable arrangement of coolant channels, and any suitable coolant, may be used in receiver 100. In some variations, the coolant is or comprises water, ethylene glycol, or a mixture (e.g., equal parts by volume) of water and ethylene glycol.

The number and arrangement of the coolant channels may be selected, for example, to maintain temperature uniformity among solar cells 110 in directions transverse to the long axis of receiver 100, to minimize a change in temperature of solar cells 110 between opposite ends of receiver 100 along its long axis, to reduce a pressure drop for coolant flow between an inlet to and an outlet from the receiver, and/or to maintain support for front and back surfaces of substrate 130 (e.g., with ribs 137 shown in FIG. 2A) to reduce deformation of those surfaces under pressure occurring during operation (from coolant flow) or during lamination of substrate 130.

In some variations, substrate 130 comprises one, two, three, four, five, or more than five coolant channels running the length of substrate 130 parallel to its long axis. The channels may have, for example, approximately rectangular, approximately elliptical, or approximately circular cross sections, or any other suitably shaped cross section. Substrates comprising such combinations of number and shape of coolant channel may be formed, for example, from aluminum, aluminum alloys, or other suitable material by, for example, an extrusion process. In some variations, substrate 130 comprises three channels of approximately rectangular cross section having cross-sectional dimensions of about 55 mm by about 7.5 mm.

Flow of coolant through channels in substrate 130 may be controlled, in some variations, by orifices. In some variations, receiver 100 comprises a separate orifice ahead of (in the coolant flow path) and in series with each coolant channel. The orifices may be connected in parallel to a single coolant feed tube or conduit, for example. Such orifices may have, for example, a diameter (or largest dimension) of about 3 mm to about 8 mm. In some variations, the orifices have circular cross sections with diameters of about 4.7 mm. The ratio of the hydraulic diameter (4·cross-sectional area/cross-sectional perimeter) of a coolant channel to that of an orifice ahead of and in series with the channel in the coolant flow path may be, for example, about 2 to about 3, or greater than about 3. In some variations, the ratio is about 2.8. A pressure drop across each orifice during operation may be, for example, about 2 times greater than, or more than about 2 times greater than, a pressure drop across its corresponding coolant channel. In some variations, a pressure drop across each orifice during operation may be, for example, about five times greater than a pressure drop across its corresponding coolant channel.

The orifices may be provided, for example, as orifices all in a single gasket in a seal at a coolant input end of substrate 130, as orifices in two or more gaskets (e.g., a separate gasket for each orifice) in one or more seals at a coolant input end of substrate 130, as orifices in one or more plugs at a coolant input end of substrate 130, or in any other suitable manner described herein or known to one of ordinary skill in the art.

Coolant may be delivered to the coolant channels, through orifices where used, by separate coolant feed tubes or conduits for each channel. Alternatively, coolant may be delivered by one or more coolant feed tubes or conduits to one or more coolant manifolds which distribute the coolant to the individual coolant channels.

Figure 10B:
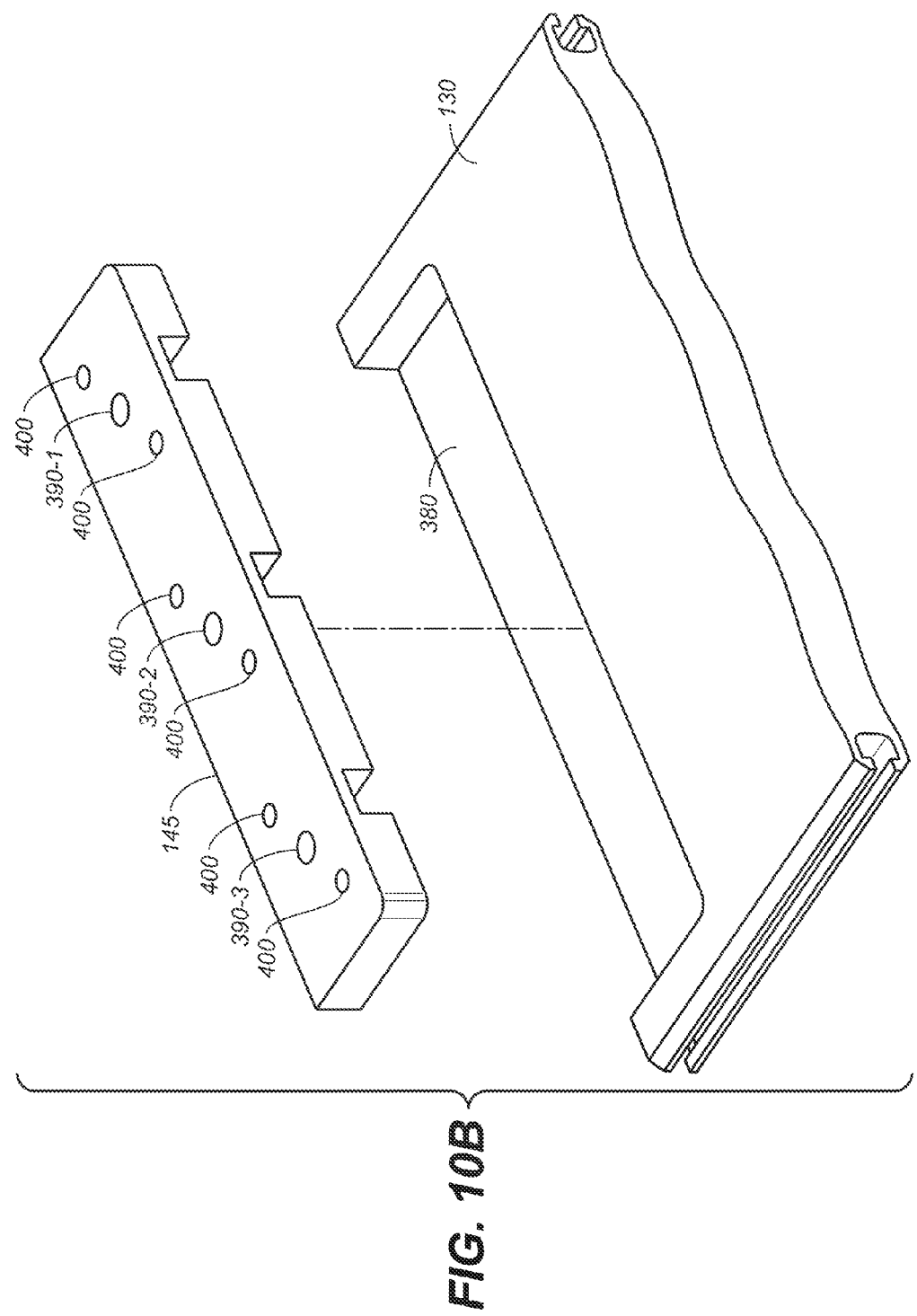

Referring now to FIGS. 10A and 10B (as well as to FIGS. 1B and 2B), in one variation an end cap 145 fits into a (e.g., three sided) slot 380 in substrate 130 to provide fluid paths 390-1, 390-2, and 390-3 to, respectively, coolant channels 135-1, 135-2, and 135-3 and to otherwise seal the end of substrate 130. End cap 145 may be machined or cast, for example, and may be formed from aluminum, aluminum alloys, copper, steel, stainless steel, fiberglass, ceramics, or any other suitable material. End cap 145 may be attached to substrate 130 by, for example, compression fitting, welding (e.g., aluminum welding), brazing, dip brazing, soldering, gluing, or any suitable method described herein or known to one of ordinary skill in the art. End cap 145 may further comprise optional threaded holes 400 by which a fluid manifold (discussed below) may be mounted to end cap 145. Any suitable number and size of such threaded holes (and corresponding bolts, screws, or other threaded fasteners) may be used.

Figure 10D:
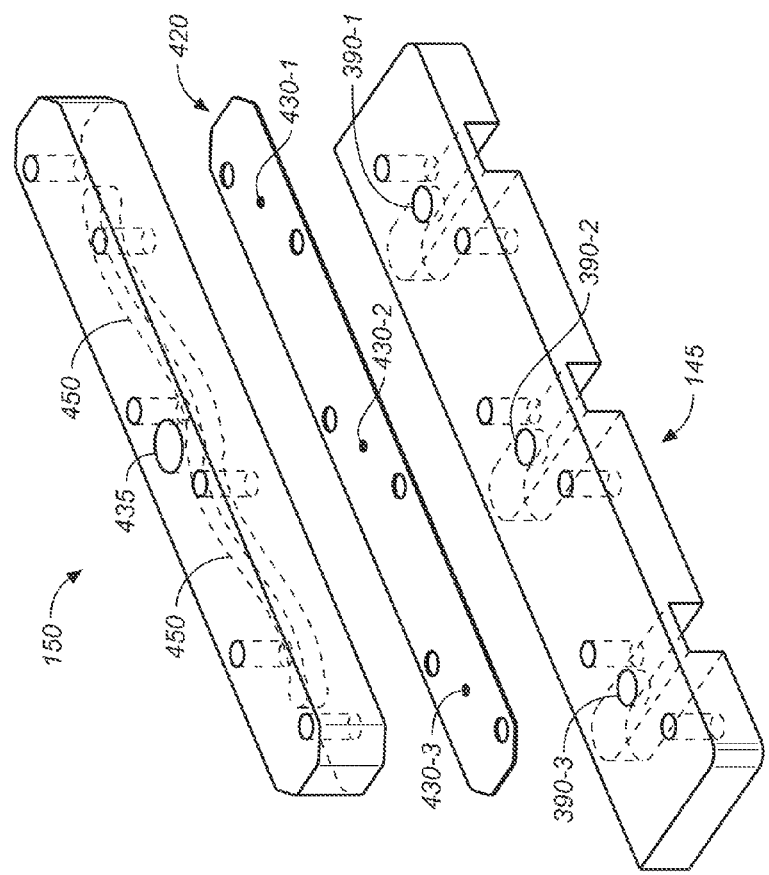

Referring now to FIGS. 10C and 10D (as well as to FIG. 1B), in one example a seal 410 to substrate 130 is formed between end cap 145 and substrate 130 by any of the attachment methods (e.g., compression fitting, aluminum welding, dip brazing, soldering) described above. In the illustrated example, a fluid manifold 150 is mounted to end cap 145 with threaded fasteners 417 engaging threaded holes 400. A gasket 420 between manifold 150 and end cap 145 seals their interface. Gasket 420 comprises orifices 430-1, 430-2, and 430-3 controlling the flow of coolant from manifold 150 through, respectively, fluid paths 390-1, 390-2, and 390-3 and thus into and through, respectively, coolant channels 135-1, 135-2, and 135-3. Manifold 150 comprises a threaded hole 435 by which a coolant interconnect (e.g., feed) tube 155 may be connected to manifold 150 with e.g., compression fittings 445, and channels 450 which deliver fluid to orifices 430-1 and 430-3. FIG. 10E shows substrate 130, end cap 145, manifold 150, fluid interconnect 155, and fittings 445 in an assembled configuration, according to some variations.

Manifold 150 may be machined or cast, for example, and may be formed, for example, from aluminum, aluminum alloys, PPO, fluoropolymers (e.g., Teflon®), silicone, zinc, or any other suitable material. Though manifold 150 in the illustrated example is attached to end cap 145 with threaded fasteners, any other suitable method of attachment described herein or known to one of ordinary skill in the art may be used. Manifold 150 may be attached to end cap 145 by welding, brazing, or gluing, for example. Gasket 420 may be formed, for example, from a silicone or a fluoropolymer elastomer (e.g., Viton®) by a die-cutting process, for example. Feed tube 155 may be, for example, a 0.25 inch diameter tube, a 0.375 inch diameter tube, or any other suitable diameter tube and may be formed from aluminum, copper, plastic (e.g., cross-linked polyethylene (PEX)), or any other suitable material. Plastic tubing used for feed tube 155 may be optionally wrapped in silicone or aluminum foil. Fittings 445 may be, for example, conventional pipe fittings of suitable size for the tube.

Although the example of FIGS. 10C and 10D utilizes three orifices controlling coolant flow through, respectively, three fluid paths in end cap 145 and then through, respectively, three coolant channels in substrate 130, other numbers and combinations of orifices, fluid flow paths, and coolant channels may be used. Some variations may utilize two orifices controlling coolant flow through, respectively, two fluid paths in end cap 145 and then through, respectively, two coolant channels in substrate 130. Some other variations may utilize four orifices controlling coolant flow through, respectively, four fluid paths in end cap 145 and then through, respectively, four coolant channels in substrate 130.

Although the discussion above has been with respect to the flow of coolant into and through receiver 100, the same or similar types of assemblies (e.g., comprising an end cap, a fluid manifold, and a fluid interconnect) may be used as a coolant outlet from receiver 100. The outlet coolant flow path need not include any flow controlling orifice or orifices inducing a large pressure drop, however. In some variations, coolant is output from receiver 100 through an assembly essentially identical to an assembly through which coolant is input to receiver 100, apart from the absence of any flow control orifice in the outlet inducing a large pressure drop.

In some variations, the entire coolant fluid flow path through receiver 100 is formed from a same material such as, for example, aluminum or an aluminum alloy.

Figure 11:
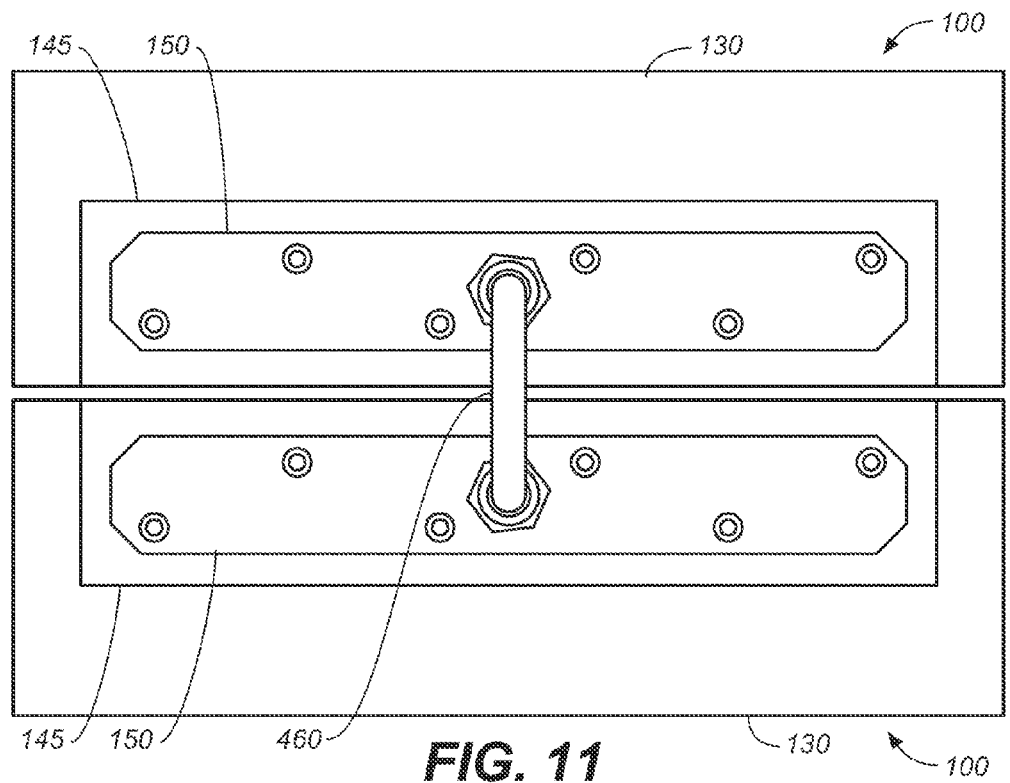
FIG. 11 shows an example fluid interconnection between two solar energy receivers.

As noted above, two or more receivers 100 may be positioned, e.g., end-to-end and interconnected to form a larger receiver. Referring now to FIG. 11, in some variations two receivers 100 are positioned end-to-end with a fluid interconnection tube 460 interconnecting coolant channels in the receivers. Fluid interconnection may be via end fluid manifolds 150 and end caps 145, as illustrated in FIG. 11, or by any other suitable manner of delivering coolant to coolant channels in the substrates 130 described herein or known to one of ordinary skill in the art. Fluid interconnect tube 460 may be formed from any of the materials disclosed above for fluid interconnection tubes 155, for example. In some variations, fluid interconnection tube 460 between receivers 100 provides strain relief. Such strain relief may accommodate, for example, thermal expansion of receivers 100 during operation.

Figure 12:
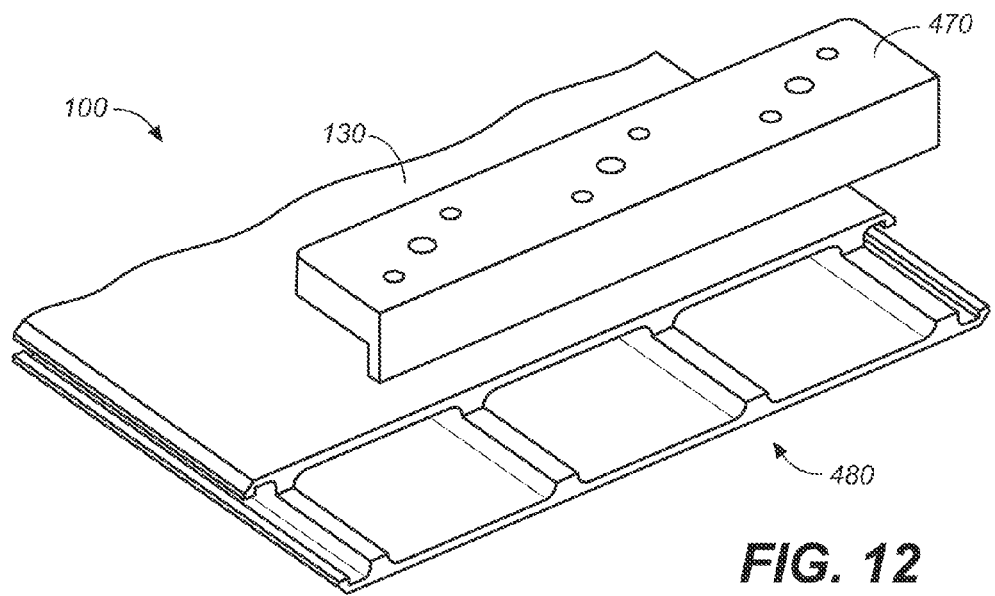
FIG. 12 shows another example assembly that provides for flow of a coolant fluid into and through coolant channels in a substrate in a solar energy receiver.

FIG. 12 shows another example providing for flow of coolant fluid into and through coolant channels in substrate 130. In this example, an end cap 470 having an L-shaped cross section fits onto and over a portion 480 of substrate 130 from which the rear surface is absent (e.g., removed by saw cut). End cap 470 may be attached to substrate 130 by any of the methods described above (e.g., aluminum weld). A fluid manifold and fluid interconnect similar or identical to any of those described above may be mounted on end cap 470 by any of the methods described above.

Some variations do not utilize a fluid manifold to distribute coolant from an inlet to multiple coolant channels in substrate 130, but instead use multiple inlets each delivering coolant directly to corresponding individual channels in substrate 130. Referring to FIG. 13, for example, in some variations two, three, or more fluid interconnect tubes 490 are coupled to an end cap 500 (attached to substrate 130) by fittings 510. Each interconnect tube 490 is in fluid communication with a different one of a plurality of coolant channels in substrate 130 through a separate flow path in end cap 500. In some variations, coolant flow through one or more of the coolant channels is controlled by one or more orifices located in the corresponding flow paths through end cap 500. In other variations, flow control orifices are not used. In some variations, a receiver having separate fluid interconnects for each coolant channel in substrate 130 as just described, and including a flow control orifice for each coolant channel in substrate 130, is fluidly coupled in series with one or more otherwise similar receivers that do not utilize any flow control orifices.

Other methods for sealing or plugging ends of coolant channels in substrate 130 may also be used. Ends of coolant channels may be sealed, for example, with tapered plugs formed from compliant materials (e.g., plastics or epoxies) into shapes that conform with and may be introduced (e.g., wedged) into the ends of the channels to form a seal, or with plugs that may introduced into the channels to form gasket or o-ring seals. In variations in which the ends of coolant channels in substrate 130 are sealed with plugs that do not provide for introducing coolant into the channels through the plugs, coolant may be introduced into the coolant channels, for example, through interconnects fluidly coupled to the coolant channels through (e.g., tube fittings in or a fluid manifold on) the rear (unilluminated) surface of the substrate. Such interconnects, tube fittings, and fluid manifolds may be similar to, and be positioned similarly to, those described above.

Figure 14A:
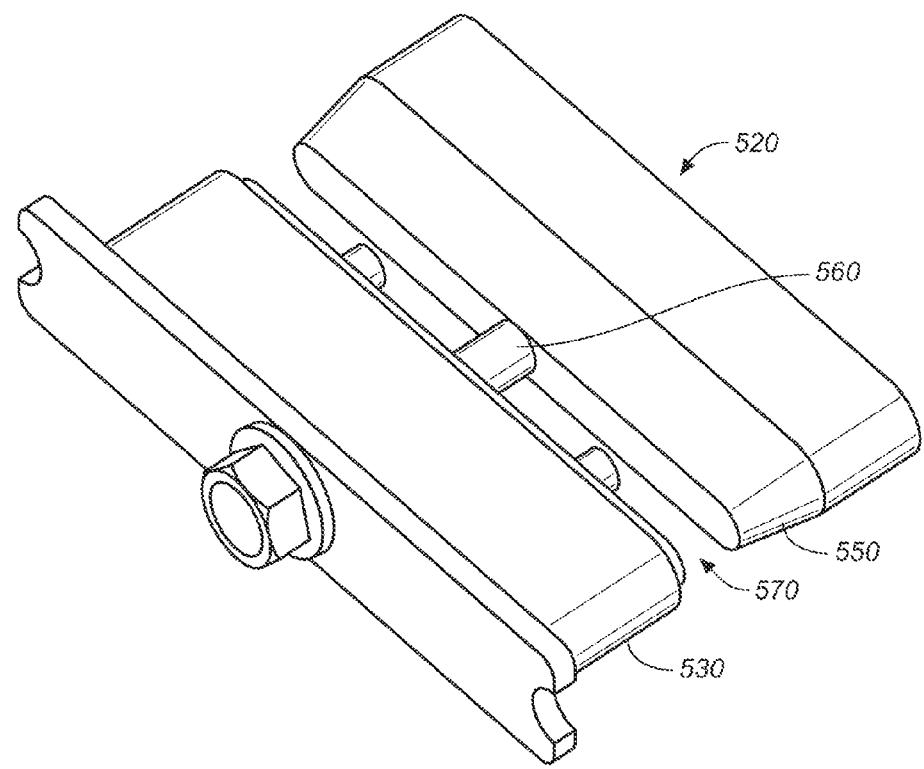
FIGS. 14A and 14B show an example plug that may be used to plug the ends of coolant fluid channels in a substrate in a solar energy receiver.
Figure 14B:
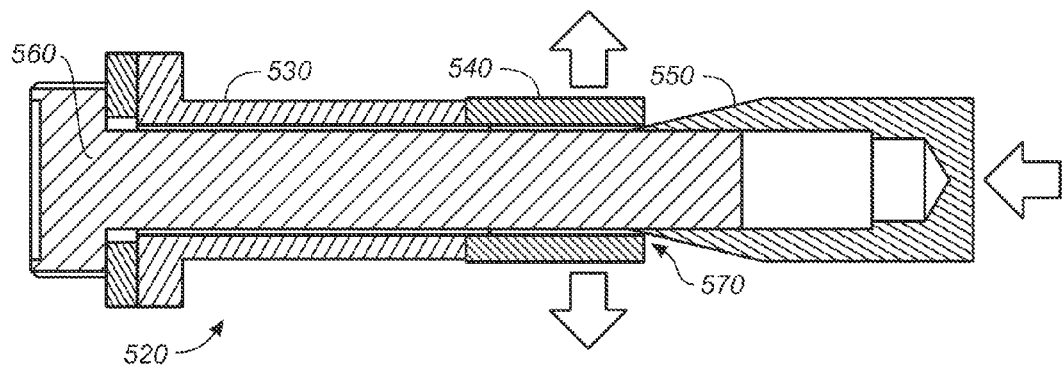

Referring now to FIGS. 14A and 14B, in some variations a compression plug 520 may be inserted into and used to seal an end of a coolant channel in substrate 130. Compression plug 520 comprises a plug portion 530, an optional gasket 540 (not shown in FIG. 14A), a wedge portion 550, and a threaded rod (e.g., screw) 560 by which the wedge portion 550 may be drawn into an interior end portion 570 of plug portion 530 and/or gasket 540 to force interior end portion 570 and/or gasket 540 outward and into contact with walls of a coolant channel (not shown) to seal the coolant channel. To form such a seal, the compression plug is inserted into the end of a coolant channel in uncompressed form, and then wedge portion 550 is drawn toward plug portion 530 until a sufficient seal has been achieved.

FIGS. 15A-15E illustrate several example arrangements for fluid (e.g., coolant) flow through an elongated receiver or through a series of fluidly coupled (e.g., elongated) receivers. Any other suitable arrangement may be used, as well.

Figure 15A:
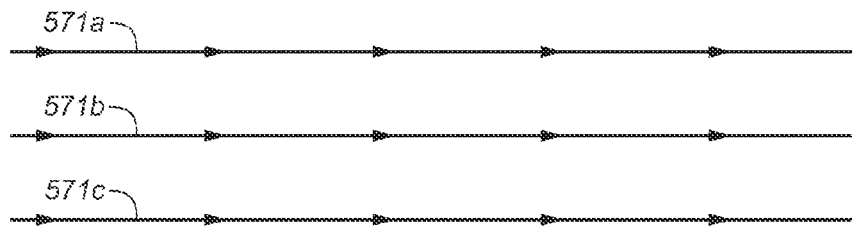
FIGS. 15A-15E show example arrangements of fluid flow paths through a receiver or series of fluidly coupled receivers.

In the example of FIG. 15A, coolant enters the receiver or receivers at one end at an initial temperature, flows in a single direction along a plurality of approximately parallel paths 571a-571c oriented approximately parallel to the long axis of the receiver or series of fluidly coupled receivers, and then (when solar radiation is concentrated on the receiver or receivers) exits at the opposite end of the receiver or receivers at a higher final temperature. Each of paths 571a-571c may represent, for example, flow through a single fluid channel or flow through two or more fluid channels in a receiver. Although three parallel fluid paths are shown, in some variations a receiver comprises only a single channel, two parallel channels, or more than three parallel channels.

Figure 15B:
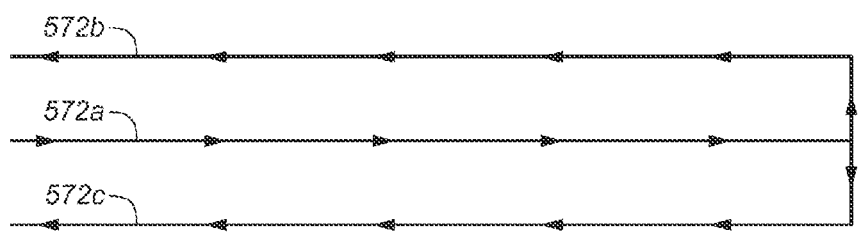

In the arrangement of FIG. 15B, coolant enters the receiver or series of receivers at one end at an initial temperature, flows to the other end along an approximately centrally located path 572a oriented approximately parallel to the long axis of the receiver or series of receivers, and then returns along the receiver or receivers in the opposite direction along outer approximately parallel paths 572b and 572c oriented approximately parallel to the long axis of the receiver or receivers to exit the receiver or receivers at (when solar radiation is concentrated on the receiver or receivers) a higher final temperature. In this arrangement, when solar radiation is concentrated on the receiver or receivers, coolant flowing through the central path is cooler than coolant flowing through the outer paths. As in the example of FIG. 15A, each of paths 572a-572c may represent, for example, flow through a single fluid channel or flow through two or more fluid channels.

Figure 15C:
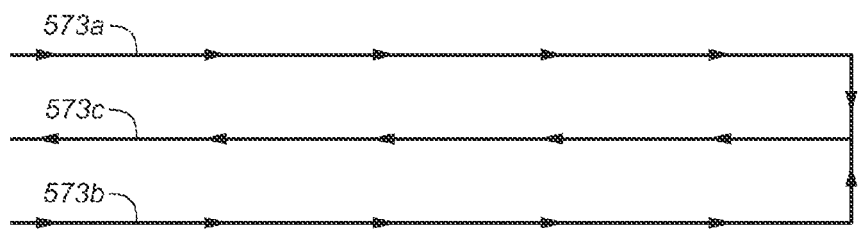

In the arrangement of FIG. 15C, coolant enters the receiver or series of receivers at one end at an initial temperature, flows to the other end along parallel outer paths 573a, 573b oriented approximately parallel to the long axis of the receiver, and then returns along approximately centrally located path 573c oriented approximately parallel to the long axis of the receiver or series of receivers to exit the receiver or receivers at (when solar radiation is concentrated on the receiver or receivers) a higher final temperature. In this arrangement, when solar radiation is concentrated on the receiver or receivers, coolant flowing through the central path is warmer than coolant flowing through the outer paths. Each of paths 573a-573c may represent, for example, flow through a single fluid channel or flow through two or more fluid channels.

In some variations, solar radiation is concentrated onto the receiver or receivers with a transverse intensity distribution (intensity distribution approximately perpendicular to a receiver long axis) that is greater at the center of the receiver than at the outer portions of the receiver. In the example of FIG. 15B, the concentrated solar radiation intensity on a receiver may be, for example, greater along flow path 572a than along flow paths 572b, 572c. In the example of FIG. 15C, the concentrated solar radiation intensity on a receiver may be, for example greater along flow path 573c than along flow paths 573a, 573b.

Figure 15D:

In the arrangement illustrated in FIG. 15D, coolant enters the receiver or series of receivers at one end at an initial temperature, flows to the other end along a first path 574a oriented approximately parallel to a long axis of the receiver or receivers, and then returns in the opposite direction along second path 574b oriented approximately parallel to the long axis of the receiver or receivers to exit the receiver or receivers at (when solar radiation is concentrated on the receiver or receivers) a higher final temperature. Each of paths 574a and 574b may represent, for example, flow through a single fluid channel or flow through two or more fluid channels.

Figure 15E:
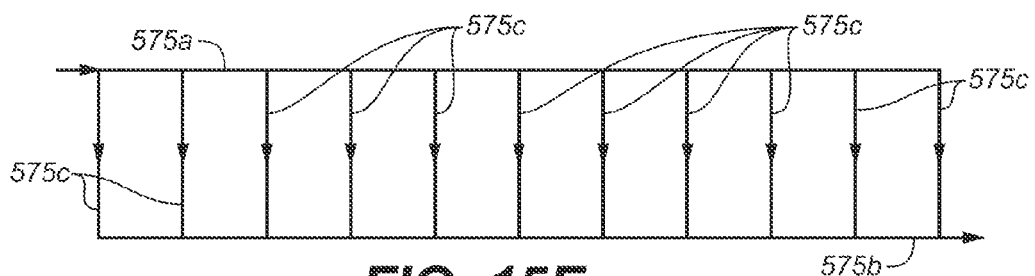

In the arrangement illustrated in FIG. 15E, coolant enters the receiver or series of receivers at one end at an initial temperature, flows toward the opposite end along a first outer path 575a oriented approximately parallel to a long axis of the receiver or receivers, flows through a plurality of transverse paths 575c oriented approximately perpendicular to the long axis of the receiver or receivers to second outer path 575b (which is also oriented approximately parallel to a long axis of the receiver or receivers), and then flows through second outer path 575b to exit the receiver or receivers at (when solar radiation is concentrated on the receiver or receivers) a higher temperature. Although FIG. 15E shows a particular number of flow paths 575c, more or fewer may be utilized as suitable. Each of paths 575a-575c may represent, for example, flow through a single channel or flow through two or more fluid channels.

In some variations two or more receivers (e.g., receivers 100) may be arranged and mechanically connected to form a V shape with the receivers oriented with their solar cells on the outer (i.e., lower) surfaces of the V. Such a V-shape arrangement may provide additional stiffness, and may also position the receivers to be more effectively illuminated by concentrated solar radiation. The V-shape receiver arrangement may be positioned, for example, above one or more reflectors that concentrate solar radiation onto the outer (i.e., lower) surfaces of the V. For example, one or more reflectors may concentrate solar radiation onto the lower surface of one arm of the V, and one or more other reflectors may concentrate solar radiation onto the outer (i.e., lower) surface of the other arm of the V.

Solar cells disposed on a first receiver forming one arm, or part of one arm, of such a V-shaped receiver structure may be electrically connected, for example, in series or in parallel with those on a second receiver forming the other arm, or part of the other arm, of the V-shape. Coolant may flow, for example, in series or in parallel through the first and second receivers. Hence, coolant may be input to and output from the V-shaped assembly of receivers at the same end (series flow) or at opposite ends (parallel flow).

Some variations utilize two or more receivers arranged to form a V shape, with a first receiver forming one arm, or part of one arm, comprising actively cooled solar cells and a second receiver forming the other arm, or part of the other arm, not comprising solar cells but providing for heat capture in a flowing coolant fluid. The receiver not comprising solar cells may be, for example, substantially similar to other receivers disclosed herein except for the absence of solar cells (and, e.g., related lamination structures and electronic components). In some variations, all or a portion of the front surface (i.e., the surface on which solar radiation is concentrated) of the receiver not comprising solar cells may be coated, painted (e.g., with black paint), or otherwise treated to increase absorption of concentrated solar radiation).

In yet other variations, two or more receivers are arranged to form a V shape, as described above, with none of the receivers comprising solar cells. The receivers may be used to capture heat in a flowing coolant. The receivers may be, for example, substantially similar to other receivers disclosed herein except for the absence of solar cells (and, e.g., related lamination structures and electronic components). In some variations, all or a portion of the front surfaces of the receivers on which solar radiation is concentrated may be coated, painted (e.g., with black paint) or otherwise treated to increase absorption of concentrated solar radiation).

In variations such as those just described, the receiver comprising solar cells may be used to generate electricity and capture heat in a coolant fluid as previously described, and the second receiver may be used to capture additional heat in the coolant fluid. If the two receivers are fluidly coupled in series, the first receiver may generate electricity and heat coolant to a first temperature (e.g., a temperature at which the solar cells continue to have a desired efficiency), and the second (booster) receiver may be used to further heat (boost) the coolant to a higher (e.g., commercially more valuable) temperature at which solar cells would not operate efficiently or might be destroyed.

Figure 16A:
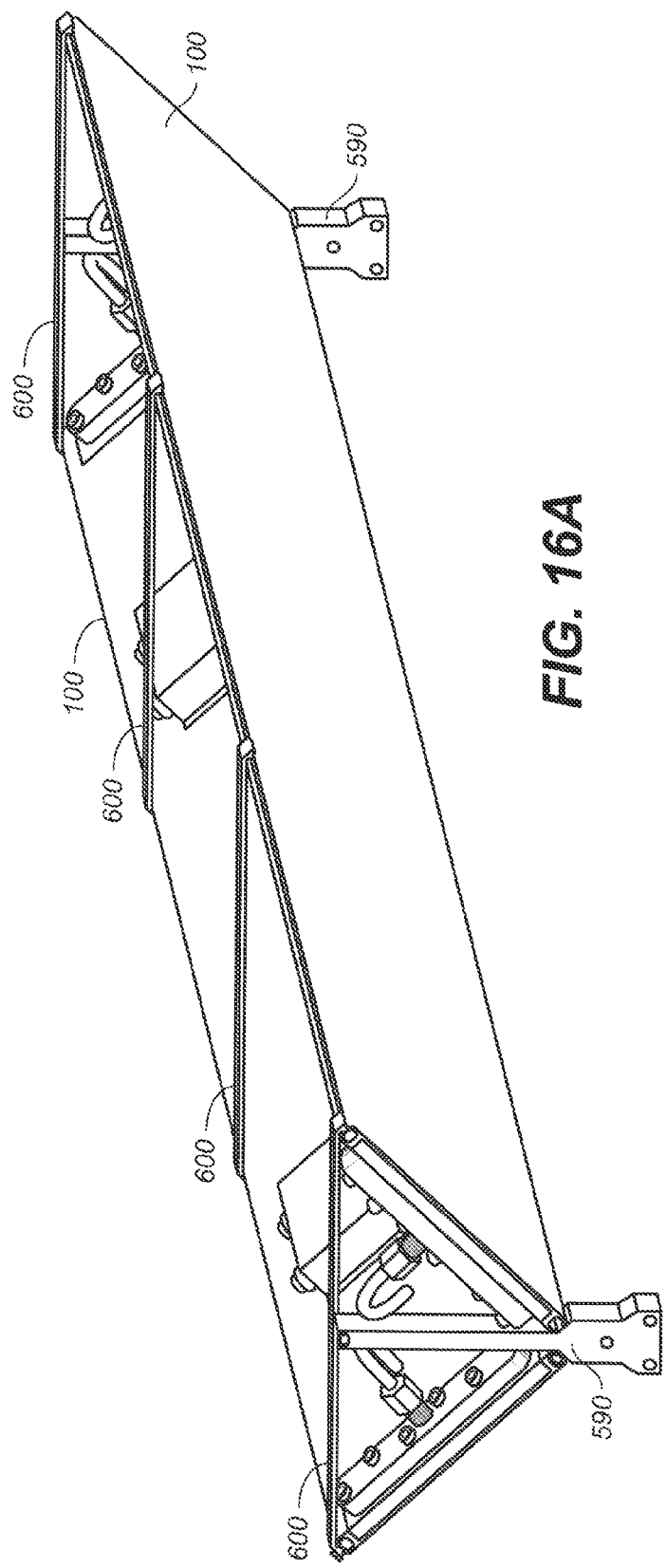
Figure 16C:
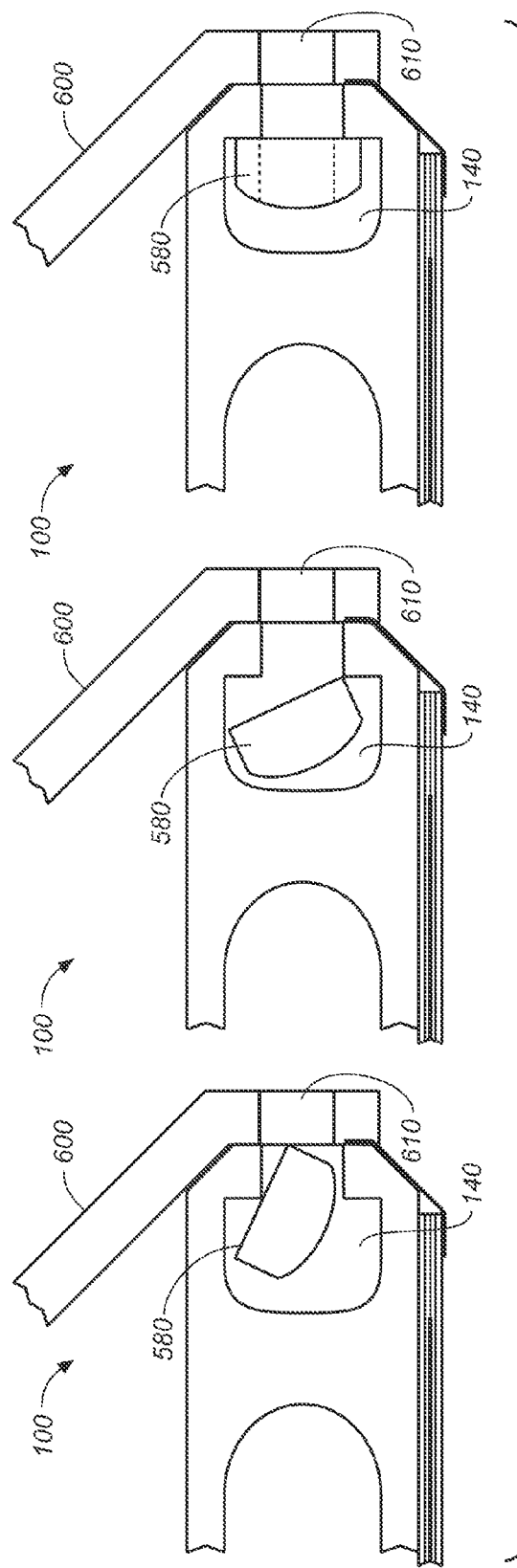

In the example of FIGS. 16A-16C, two receivers 100 are oriented with their long axes parallel to each other and with each receiver rotated around its long axis by about 45° from the horizontal such that the two receivers form an approximately V shape (with an intersecting angle between them of about 90°) with their solar cells facing downward. T-slots 140 on lower edges of the receivers engage fasteners (e.g., a nut and/or bolt) 580 on a vertical support 590 to attach the receivers to the vertical support. T-slots 140 on upper edges of the receivers engage fasteners (e.g. a nut and or bolt) 580 located at ends of transverse brackets 600 to attach the receivers to the brackets and thereby to each other.

Although FIG. 16A shows a bracket 600 located at each end of receivers 100 and two brackets at intermediate locations between the ends of the receivers, more or fewer brackets may be used and brackets may be placed in any suitable location. In some variations, brackets are placed at intervals of about 0.5 to about 1.5 meters (e.g., about 0.6 meters, about 0.7 meters, or about 0.8 meters) along receivers 100.

FIG. 16C shows a sequence of three diagrams depicting the introduction of a nut 580 into a t-slot 140 in a receiver 100, and its rotation inside t-slot 140 into alignment with an opening of t-slot 140 and a through-hole 610 in a bracket 600. A bolt or other threaded fastener (not shown) may then engage nut 580 through hole 610 to attach bracket 610 to receiver 100.

As noted earlier in this specification, in some variations a receiver may be illuminated by concentrated solar radiation (e.g., from below) on a front surface comprising solar cells and also be illuminated directly by the sun with un-concentrated solar radiation (e.g., from above) on a rear surface. To take advantage of the un-concentrated solar radiation incident on the receiver, in some variations a receiver may comprise solar cells on its rear surface as well as on its front surface. The rear surface solar cells may generate additional electricity from un-concentrated solar radiation. Such solar cells may be applied to the rear surface of the receiver in a lamination structure and using a lamination process similar or identical to that described above, for example. The rear surface cells may be applied at the same time as the front surface cells, for example. Also to take advantage of the un-concentrated solar radiation, in some variations all or a portion of the rear surface of a receiver (e.g., a portion not comprising solar cells) may be coated, painted (e.g., with black paint), or otherwise treated to increase absorption of un-concentrated solar radiation by the rear surface of the receiver and thereby increase the amount of heat collected by coolant flowing through the receiver.

Figure 17A:
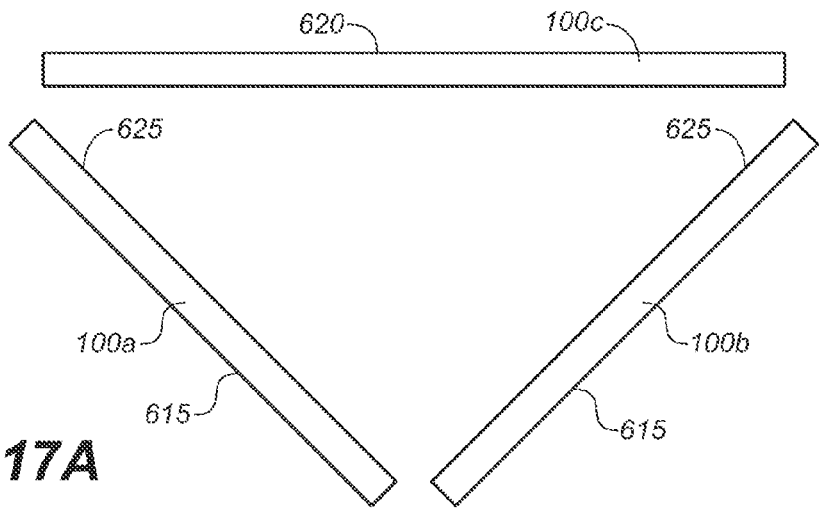
FIGS. 17A-17H show example arrangements in which a receiver or receivers may generate additional electricity, capture or retain additional heat, or both.

FIGS. 17A-17H illustrate other variations in which a receiver or arrangement of receivers may generate additional electricity, capture or retain additional heat, or generate additional electricity and capture or retain additional heat. Referring to FIG. 17A, in some variations two receivers 100a, 100b form a V-shape structure as previously described, for example, and a third (e.g., identical or substantially similar) receiver 100c is positioned (e.g., using brackets or other structure, not shown) horizontally above the other two receivers to form, in combination with the other receivers, a (for example) substantially triangular shape. Receivers 100a and 100b may be, for example, identical or substantially similar to variations of receivers 100 described above. In use, solar radiation may be concentrated onto outer (i.e., lower) surfaces 615 of receivers 100a, 100b.

Receiver 100c may close and (optionally) seal the top of the V-shape by making mechanical contact (e.g., via a gasket or other sealing material) with the upper ends of receivers 100a and 100b. Alternatively, as in the illustrated example, there may be gaps between the ends of receiver 100c and the upper ends of receivers 100a and 100b.

In some variations, receiver 100c comprises solar cells on its upper surface 620 that generate additional electricity from un-concentrated solar radiation. Such solar cells may be applied to upper surface 620 in a lamination structure and using a lamination process similar or identical to that described above, for example. In some of those variations, receiver 100c further comprises coolant channels (e.g., as described above for other receivers disclosed herein) through which coolant flows to collect additional heat from the incident un-concentrated solar radiation. In yet other variations, receiver 100c does not comprise solar cells on its upper surface, but coolant flowing through receiver 100c (e.g., as described above for other receivers disclosed herein) collects additional heat from incident un-concentrated solar radiation. In these variations, all or a portion (e.g., a portion not comprising solar cells) of the upper surface 615 of receiver 100c on which un-concentrated solar radiation is incident may be coated, painted (e.g., with black paint) or otherwise treated to increase absorption of un-concentrated solar radiation and thereby increase the amount of heat collected by coolant flowing through receiver 100c.

Receiver 100c, positioned above the V-shape arrangement of receivers 100a and 100b, may reduce wind flow along or against the upper surfaces 625 of receivers 100a and 100b and otherwise tend to produce a region of relatively still air within the (e.g., triangularly shaped) arrangement of receivers. This may reduce heat loss through the upper surfaces of receivers 100a and 100b.

Still referring to FIG. 17A, in some variations a cover (e.g., plate or sheet) of a material that is substantially transparent to solar radiation (e.g., to a substantial portion of visible and infrared solar radiation) is positioned horizontally above receivers 100a and 100b in place of receiver 100c. The cover may be formed from or comprise, for example, glass, low-iron glass, and/or plastics. The cover may, for example, have a laminated structure, and/or be glazed or coated to provide a suitable combination of strength and transparency. In some variations, the cover may transmit a substantial portion of the visible and/or infrared portion of the solar spectrum but block most or essentially all of the ultraviolet portion of the solar spectrum that might otherwise damage or degrade material used in junction boxes, cables, and other components on or of the receiver. Such selective transparency may result, for example, from a coating or lamination layer on or in the cover.

The transparent cover may close and (optionally) seal the top of the V-shape by making mechanical contact (e.g., via a gasket or other sealing material) with the upper ends of receivers 100a and 100b. Alternatively, there may be gaps between the ends of the transparent cover and the upper ends of receivers 100a and 100b. Although FIG. 17A depicts a flat structure (e.g., receiver or cover) 100c above receivers 100a and 100b, a cover or receiver so located need not be flat and may instead have, for example, a dome shape, a peaked shaped, or any other suitable shape.

Such a transparent cover positioned in this manner may, as described above with respect to variations employing receiver 100c, tend to produce a region of relatively still air within the resulting (e.g., triangularly shaped) arrangement and thus reduce heat loss through the upper surfaces 625 of receivers 100a and 100b. In addition, un-concentrated solar radiation passing through the transparent cover may be absorbed by upper surfaces 625 of receivers 100a and 100b to further heat coolant passed through the receivers. In some variations, upper surfaces 625 of receivers 100a and 100b comprise solar cells that generate additional electricity from the incident un-concentrated radiation. In some variations, all or a portion (e.g., a portion not comprising solar cells) of the upper surfaces 625 of receivers 100a and 100b may be coated, painted (e.g., with black paint) or otherwise treated to increase absorption of un-concentrated solar radiation and thereby increase the amount of heat collected by the receivers.

In yet other variations, an opaque or substantially opaque cover (e.g., plate or sheet) of a material (e.g., aluminum, galvanized steel, plastic) not substantially transparent to solar radiation is positioned horizontally above receivers 100a and 100b in place of receiver 100c. The cover may close and (optionally) seal the top of the V-shape by making mechanical contact (e.g., via a gasket or other sealing material) with the upper ends of receivers 100a and 100b. Alternatively, there may be gaps between the cover and the upper ends of receivers 100a and 100b. The cover may be, for example, flat, dome-shaped, peak-shaped, or any other suitable shape.

Such a cover positioned in this manner may, as described above, tend to produce a region of relatively still air within the resulting (e.g., triangularly shaped) arrangement and thus reduce heat loss through the upper surfaces 625 of receivers 100a and 100b. In some of these variations, all or a portion of the upper surface of the cover positioned above receivers 100a and 100b may be coated, painted (e.g., with black paint), or otherwise treated to increase absorption of un-concentrated solar radiation incident on it. This may heat air within the (e.g., triangularly shaped) arrangement and thereby increase the amount of heat collected by coolant flowing through receivers 100a and 100b.

In some variations the rear surface (i.e., the surface not illuminated by concentrated solar radiation) of a receiver is glazed with a layer of a material (e.g., a glass or plastic) substantially transparent to solar radiation to reduce heat loss from the surface and/or increase heat collection from un-concentrated solar radiation incident on that surface. Some variations may also comprise an air gap between the glaze and the rear surface of the receiver, which may further enhance heat retention and collection. Two or more of such glazed receivers may be arranged in a V-shape.

Figure 17B:
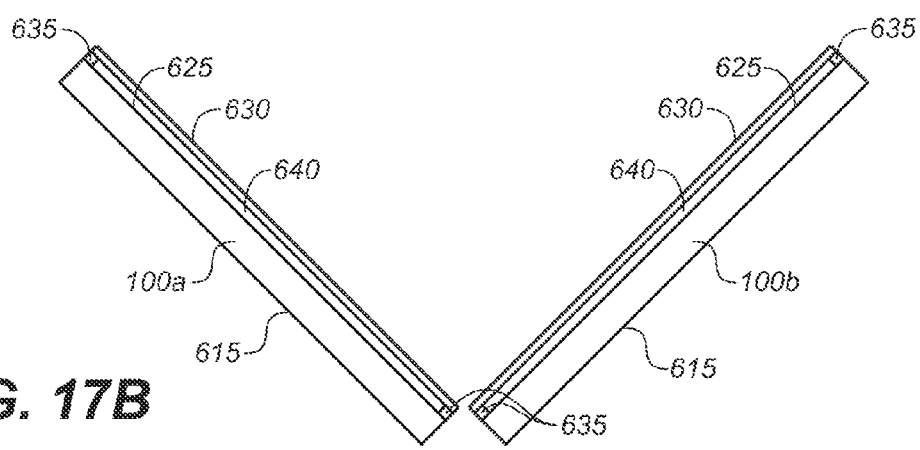

Referring now to FIG. 17B, for example, in some variations two receivers 100a, 100b arranged in a V-shape as described above each comprise a layer 630 of material that is substantially transparent to solar radiation. Layer 630 may comprise multiple (e.g., laminated) layers, for example. Suitable materials for layer 630 may include, for example, glass, low-iron glass, ETFE, EVA, silicones, and mixtures, composites, and lamination structures thereof. Layer 630 is positioned substantially parallel to receiver surface 625 and, optionally, spaced apart from surface 625 by spacers 635 to form an air gap 640. Layer 630 may be, for example, about 0.1 mm to about 10 mm thick. Air gap 640, if present, may be, for example, about 1 mm to about 10 mm thick.

In some variations in which layer 630 is spaced apart from surface 625, layer 630 may be formed from or comprise, for example, glass or low-iron glass and may be, for example, about 1.0 mm to about 6.0 mm, or about 3.0 mm to about 6.0 mm (e.g., about 3.2 mm) thick. In some variations in which layer 630 is spaced apart from surface 625, layer 630 may be formed from or comprise, for example, ETFE and may be, for example, about 0.1 mm to about 1.0 mm, or about 0.1 to about 0.5 mm thick. In some variations not including air gap 640, layer 630 may be formed from or comprise, for example, glass, low-iron glass, ETFE, EVA, silicones, and mixtures, composites, and lamination structures thereof and may be, for example, about 0.1 mm to about 10.0 mm, or about 0.1 mm to about 6.0 mm, or about 0.1 mm to about 3.0 mm, or about 0.1 mm to about 1.0 mm, or about 0.1 mm to about 0.5 mm thick.

In some variations not comprising air gap 640, layer 630 comprises an EVA layer bonded to surface 625, and an ETFE layer bonded to the EVA layer. In some of those variations, the EVA layer is about 0.45 mm thick and the ETFE layer is about 0.20 mm thick. In some variations not comprising air gap 640, layer 630 comprises an EVA layer about 1 mm to about 10 mm, about 1 mm to about 5 mm, about 5 mm to about 10 mm, or about 3 mm to about 7 mm thick.

In some variations, a layer 630 may comprise one or more anti-reflective coatings or be otherwise treated or configured to enhance transmission of solar radiation through layer 630.

The example glazed receivers just described with reference to FIG. 17B, and similar variations, may also be used in arrangements (e.g., singly) other than the V-shaped arrangement shown.

Figure 17C:
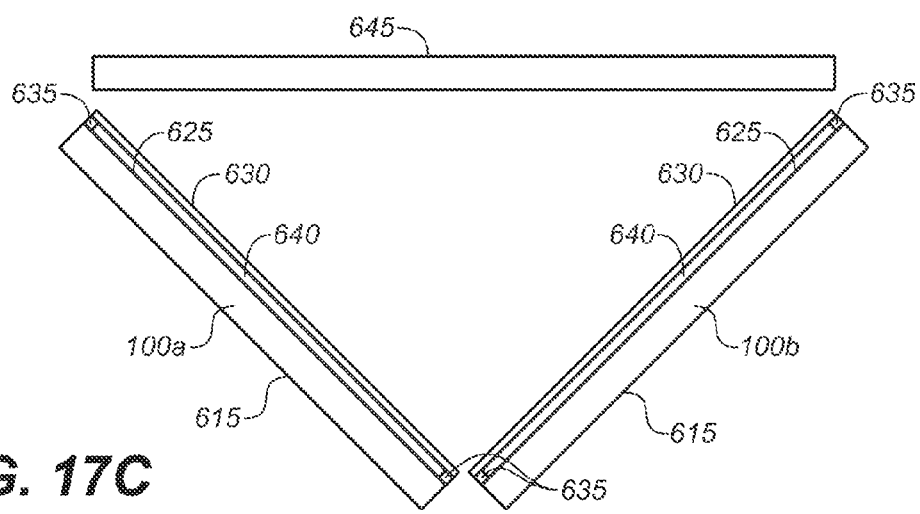

Referring now to FIG. 17C, in some variations a transparent cover 645 as described above is positioned horizontally above glazed receivers 100a and 100b to form, in combination with the receivers, a (for example) substantially triangular shape. The transparent cover may close and (optionally) seal the top of the V-shape by making mechanical contact (e.g., via a gasket or other sealing material) with the upper ends of receivers 100a and 100b. Alternatively, there may be gaps between the ends of the transparent cover and the upper ends of receivers 100a and 100b. The presence of transparent cover 645 may further reduce heat loss through, and/or enhance heat collection through, surfaces 625 of the receivers.

Layer 630 shown in FIG. 17C may have, for example, structures, compositions, and thicknesses, and be spaced apart from surface 625, as described in any of the above variations (e.g., with respect to FIG. 17B).

Figure 17D:
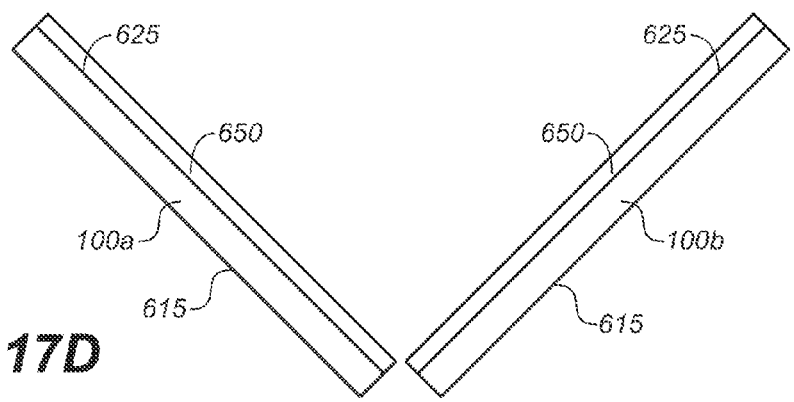

In some variations a receiver comprises a layer of insulation disposed on its rear surface (i.e., the surface not illuminated by concentrated solar radiation). The layer of insulation reduces heat loss through that rear surface. Two or more such insulated receivers may be arranged in a V-shape. Referring to FIG. 17D, for example, in some variations two receivers 100a, 100b arranged in a V-shape as described above each comprise a layer 650 of insulation disposed on its rear surface 625.

Layer 650 may be or comprise, for example, closed cell foams, fiberglass, woven fiberglass, fiberglass mats with foil sheets, and fiberglass and resin sheets, or combinations thereof. Layer 650 may have a thickness, for example, of about 5 mm to about 10 mm, or about 5 mm to about 20 mm, or about 5 mm to about 50 mm. Layer 650 may be optionally spaced apart from surface 625 (spacers not shown) to form an air gap having a thickness, for example, of about 0.5 mm to about 10 mm, or about 0.5 mm to about 2.0 mm.

In some variations insulation layer 650 may be applied, for example, as preformed strips, sheets, or other structures attached by adhesive or fasteners, for example, to the receiver surfaces. In other variations the insulation may be applied, for example, as a (e.g., sprayed-on) foam that adheres to the receiver surface.

In some variations, layer 650 is formed from or comprises one or more sheets of closed cell foam available under the product name AP/Armaflex® from Armacell LLC. In some of these variations, the one or more sheets of closed cell foam have a total thickness of about 5 mm to about 20 mm (e.g., about 12 mm). In some variations, layer 650 comprises one or more sheets formed from fiberglass and resin. The one or more fiberglass/resin sheet or sheets may be spaced apart from surface 625 to form an air gap having a thickness, for example, of about 0.5 mm to about 10 mm, or about 0.5 mm to about 2.0 mm.

Although insulation layer 650 is shown as having a uniform thickness and a smooth outer surface, in some variations (e.g., where the insulation is applied as a foam) the insulation layer may have a varying thickness and an irregular outer surface.

Figure 17E:
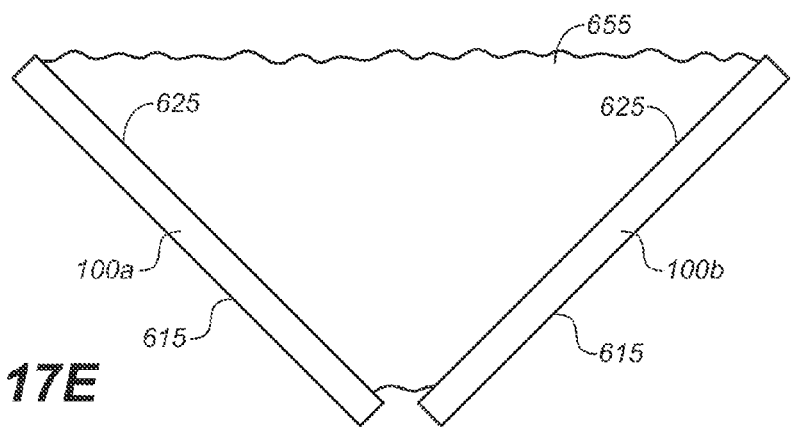

Referring now to FIG. 17E, in some variations all of, or a substantial portion of, the volume between two receivers 100a, 100b arranged in a V-shape is filled with insulation 655. Insulation 655 may be or comprise, for example, any of the insulating material discussed above with respect to FIG. 17D. In some variations, insulation 655 may be or comprise a preformed block of (e.g., closed cell foam) insulation having a substantially triangular cross section that is (optionally) attached by an adhesive to the receivers or otherwise secured in place. In some variations, insulation 655 may be or comprise insulation applied as a (e.g., sprayed-on) foam.

Figure 17F:
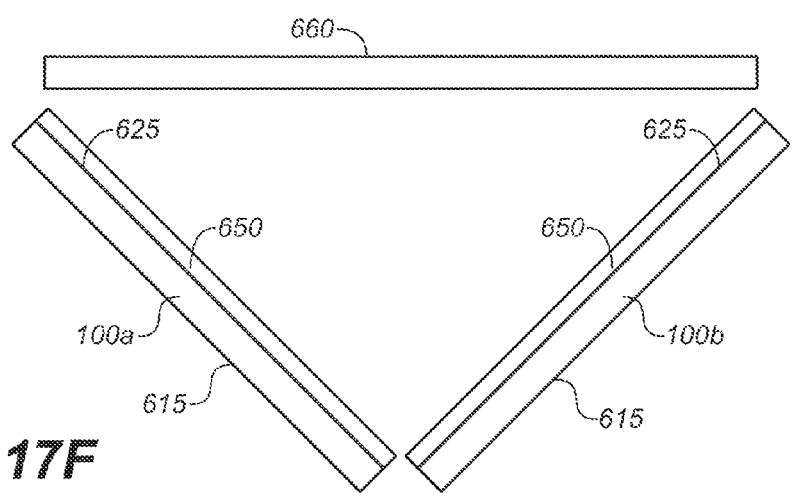

Referring now to FIG. 17F, in some variations a cover 660 is positioned horizontally above two insulated receivers 100a, 100b to form, in combination with the receivers, a (for example) substantially triangular shape. Cover 660 may be substantially transparent, opaque, or substantially opaque to solar radiation as described in any of the above variations. Cover 660 may close and (optionally) seal the top of the V-shape by making mechanical contact (e.g., via a gasket or other sealing material) with the upper ends of receivers 100a and 100b. Alternatively, there may be gaps between the ends of the transparent cover and the upper ends of receivers 100a and 100b. Cover 660 may further reduce heat loss through surface 625 of the receiver. In variations in which cover 660 is opaque, substantially opaque, and/or otherwise blocks a sufficient portion of the ultraviolet component of the solar spectrum, cover 660 may allow use of insulation 650 that would otherwise be degraded by that ultraviolet radiation.

Insulating layer 650 shown in FIG. 17F may have, for example, structures, compositions, and thicknesses, and be spaced apart from surface 625, as described in any of the above variations (e.g., with respect to FIG. 17D).

In some variations, cover 660 is formed from glass or low-iron glass and insulation layers 650 are or comprise closed cell foam insulation. In some of these variations, insulation layers 650 are, for example, about 5 mm to about 20 mm, or about 5 mm to about 10 mm, or about 12 mm thick, and cover 660 is, for example, about 1 mm to about 10 mm, or about 3 mm to about 6 mm thick. The closed cell foam insulation in these variations may be, for example, AP/Armaflex® insulation available from Armacell LLC.

Figure 17G:
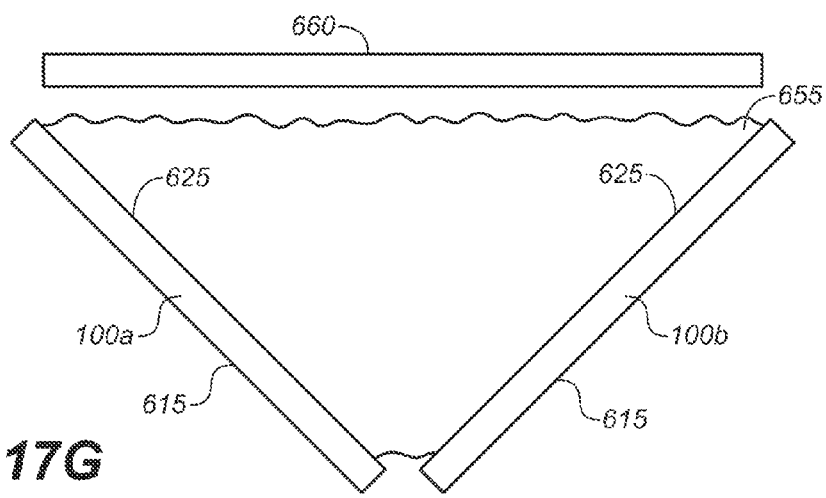

Referring now to FIG. 17G, in some variations a cover 660 (e.g., as described above) is positioned horizontally above two receivers 100a, 100b to form, in combination with the receivers, a (for example) substantially triangular shape. All of, or a substantial portion of, the volume between receivers 100a, 100b is filled with insulation 655. In some variations, insulation 655 may be or comprise a preformed block of insulation having a substantially triangular cross section that is (optionally) attached by an adhesive to the receivers or otherwise secured in place. In some variations, insulation 655 may be or comprise insulation applied as a (e.g., sprayed-on) foam. Cover 660 may close and (optionally) seal the top of the V-shape by making mechanical contact (e.g., via a gasket or other sealing material) with the upper ends of receivers 100a and 100b. Alternatively, there may be gaps between the ends of the transparent cover and the upper ends of receivers 100a and 100b. The presence of cover 660 may further reduce heat loss through surfaces 625 of the receivers, and may allow use of insulation 650 that would be degraded by an ultraviolet component of un-concentrated solar radiation blocked by cover 660.

A receiver may also lose heat through its front surface (i.e., the surface illuminated by concentrated solar radiation). In some variations the front surface of a receiver is glazed with a layer of material (e.g., a glass or plastic) substantially transparent to solar radiation to reduce heat loss from the surface and/or to increase heat collection from concentrated solar radiation incident on that surface. Some variations may also comprise an air gap between the glaze and the front surface of the receiver, which may further enhance heat retention and collection. Two or more of such glazed receivers may be arranged in a V-shape.

Figure 17H:
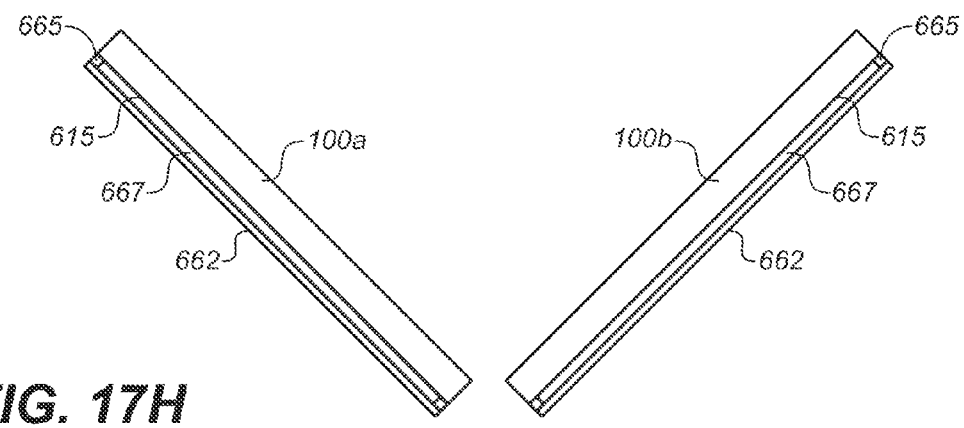

Referring now to FIG. 17H, for example, in some variations two receivers 100a, 100b arranged in a V-shape as described above each comprise a layer 662 of material that is substantially transparent to solar radiation. Layer 662 may comprise multiple (e.g., laminated) layers, for example. Suitable materials for layer 662 may include, for example, glass, low-iron glass, ETFE, EVA, silicones, and mixtures, composites, and lamination structures thereof. Layer 662 is positioned substantially parallel to receiver surface 615 and, optionally, spaced apart from surface 615 by spacers 665 to form an air gap 667. Layer 662 may be, for example, about 0.1 mm to about 10 mm thick. Air gap 667, if present, may be, for example, about 1 mm to about 10 mm thick.

In some variations in which layer 662 is spaced apart from surface 615, layer 662 may be formed from or comprise, for example, glass or low-iron glass and may be, for example, about 1.0 mm to about 6.0 mm, or about 3.0 mm to about 6.0 mm (e.g., about 3.2 mm) thick. In some variations in which layer 662 is spaced apart from surface 615, layer 662 may be formed from or comprise, for example, ETFE and may be, for example, about 0.1 mm to about 1.0 mm, or about 0.1 to about 0.5 mm thick. In some variations not including air gap 667, layer 662 may be formed from or comprise, for example, glass, low-iron glass, ETFE, EVA, silicones, and mixtures, composites, and lamination structures thereof and may be, for example, about 0.1 mm to about 10.0 mm, or about 0.1 mm to about 6.0 mm, or about 0.1 mm to about 3.0 mm, or about 0.1 mm to about 1.0 mm, or about 0.1 mm to about 0.5 mm thick. In some variations not comprising air gap 667, layer 662 comprises an EVA layer bonded to surface 615, and an ETFE layer bonded to the EVA layer. In some of those variations, the EVA layer is about 0.45 mm thick and the ETFE layer is about 0.20 mm thick. In some variations not comprising air gap 667, layer 662 comprises an EVA layer about 1 mm to about 10 mm, about 1 mm to about 5 mm, about 5 mm to about 10 mm, or about 3 mm to about 7 mm thick.

In some variations, a layer 662 may comprise one or more anti-reflective coatings or be otherwise treated or configured to enhance transmission of solar radiation through layer 662 to surface 615.

The example glazed receivers just described with reference to FIG. 17H, and similar variations, may also be used in arrangements (e.g., singly) other than the V-shaped arrangement shown.

Receivers comprising glazed front surfaces may be used in any suitable combination with the features of the variations described above with respect to FIGS. 17A-17G. In particular, receivers described with respect to those figures may comprise, in some variations, glazing on their front surfaces 615 as just described with respect to FIG. 17H.

Figure 18:
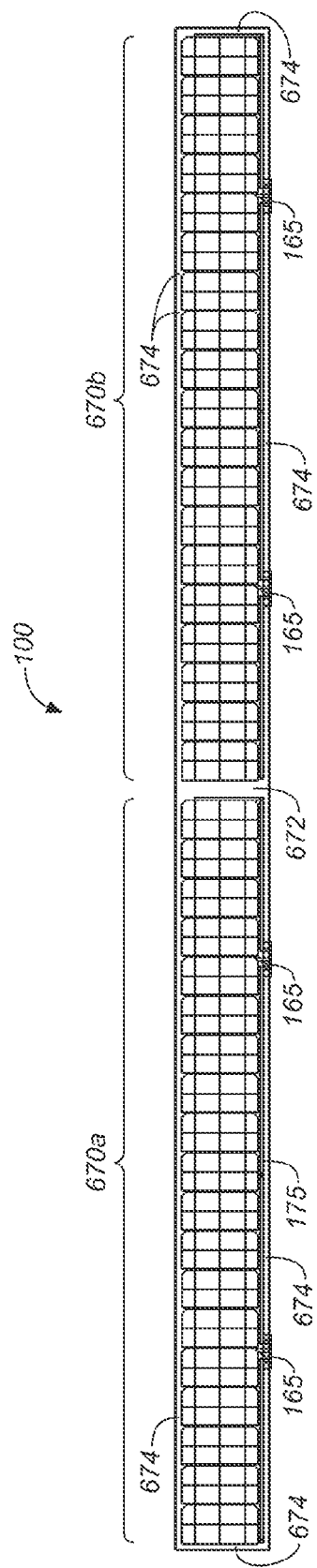
FIG. 18 shows an example receiver in which some or all portions not comprising solar cells of front surface of the receiver may be coated, painted, or otherwise treated to increase absorption of concentrated solar radiation).

In some variations, some or all of those portions not comprising solar cells of the front surface (i.e., the surface on which solar radiation is concentrated) of a receiver may be coated, painted (e.g., with black paint), or otherwise treated to increase absorption of concentrated solar radiation. Referring now to FIG. 18, in one variation a receiver comprises two strings 670a and 670b of solar cells. A portion 672 of the front surface of the receiver positioned between the two strings of cells may be coated, painted (e.g., with black paint), or otherwise treated to increase absorption of solar radiation and thus collection of heat. Alternatively, or additionally, portions 674 of the front surface on the periphery of the solar cells may be similarly coated, painted, or otherwise treated. In some variations, receivers comprising front surfaces coated, painted, or otherwise treated in this manner may also comprise glazing of the front surface as described above.

Receivers described with respect to FIGS. 17A-17H may comprise, in some variations, receivers including front surfaces coated, painted, or otherwise treated to increase absorption of solar radiation as just described with respect to FIG. 18.

Figure 19:
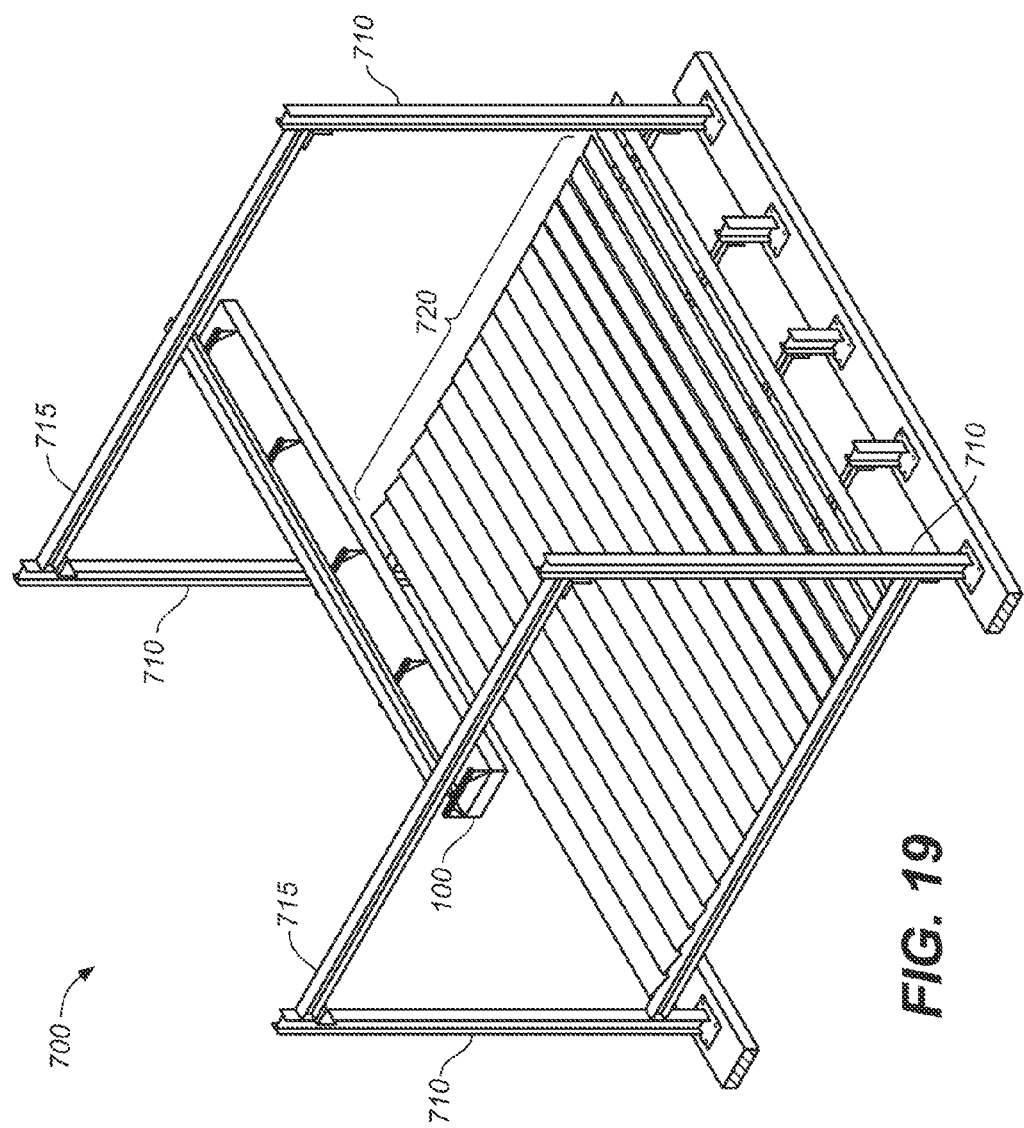
FIG. 19 shows an example linear Fresnel solar energy collector.

Referring now to FIG. 19, in some variations receivers as disclosed herein may be used in linear Fresnel solar energy collection systems such as, for example linear Fresnel solar energy collector 700. Linear Fresnel solar energy collector 700 comprises a receiver 100 elevated by vertical supports 710 and cross beams 715 above reflector rows 720 arranged parallel to and beneath receiver 100. Each of the individual reflector rows is configured to rotate about its own pivot axes, which is parallel to its long axis and hence parallel to receiver 100. By such rotation the reflector rows may be oriented to reflect solar radiation from the sun to a linear focus along receiver 100. The reflectors may be flat or have, for example, parabolic or approximately parabolic curvature with focal lengths of approximately the distance from the reflector center lines to the center line of the lower surface of receiver 100. Although in the illustrated example solar energy collector 700 is shown as comprising a horizontally oriented receiver 100, some other variations may comprise instead two receivers oriented to form a V-shape as described above.

One of ordinary skill in the art will recognize that linear Fresnel collectors are known in the art, and that features of the support structures and the general arrangement of the reflectors with respect to the receiver are intended as schematic illustrations representing numerous configurations known in the art.

Figure 20:
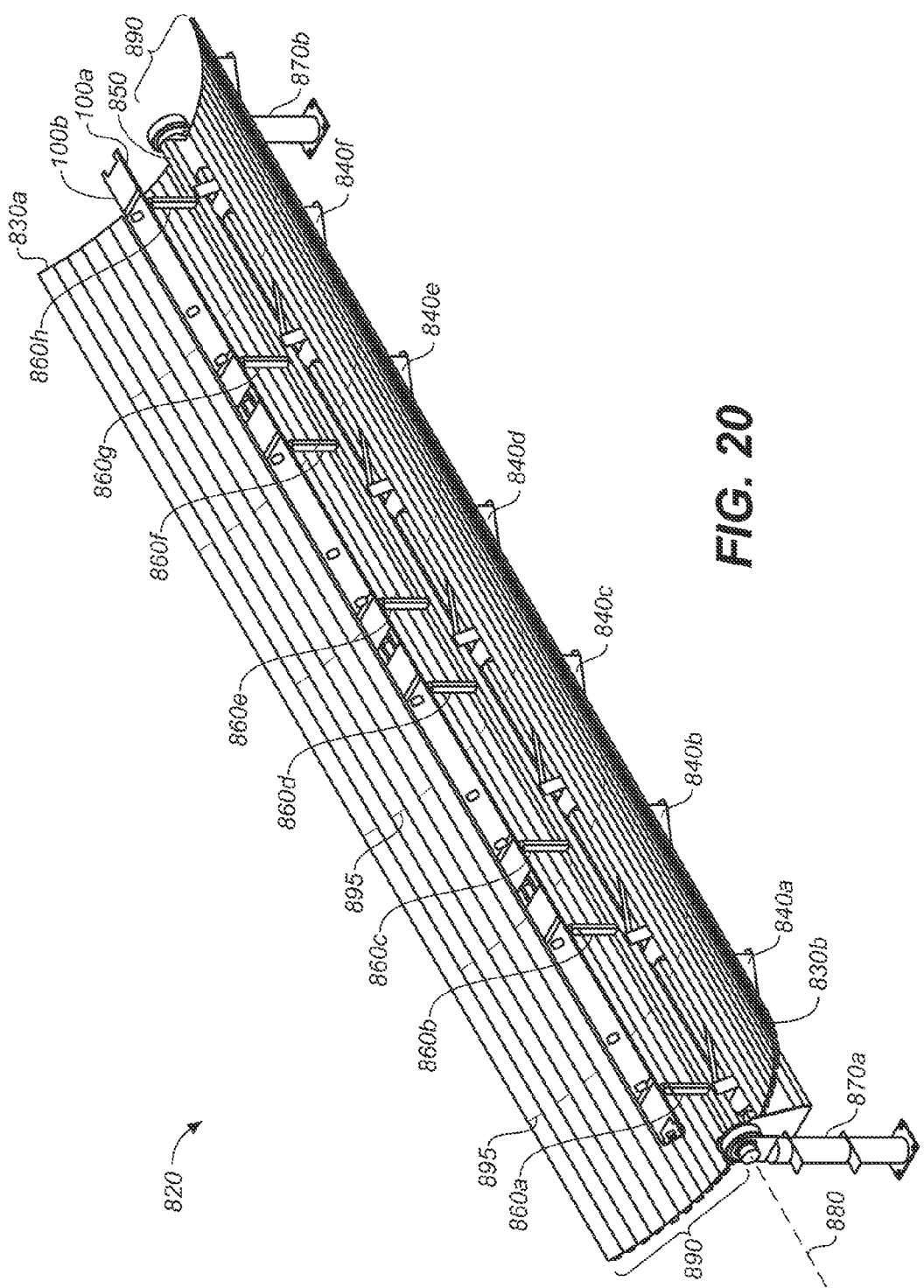
FIG. 20 shows an example trough solar energy collector.

Referring now to FIG. 20, in some variations receivers as disclosed herein may be used in trough solar energy collection systems such as, for example trough solar energy collector 820. Trough solar energy collector 820 comprises linearly extending reflectors 830a and 830b supported by transverse supports 840a-840f and attached thereby to longitudinally extending shaft 850. Linearly extending receivers 100a and 100b, arranged in a V-shape as described above, for example, are attached to and positioned above shaft 850 by vertical supports 860a-860h to locate receiver 100a at approximately a linear focus of reflector 830a and to locate receiver 100b at approximately a linear focus of reflector 830b.

Shaft 850 is pivotably attached to support posts 870a, 870b at ends of collector 820, allowing reflectors 830a and 830b to rotate together with receivers 100a and 100b around pivot axis 880 to orient reflectors 830a and 830b to reflect solar radiation from the sun to, respectively, receivers 100a and 100b.

Reflectors 830a and 830b each comprise a plurality of linearly extending flat mirrors 890 supported by supports 840a-840f to approximate a parabolic curvature. The aspect ratio (length divided by width) of flat mirrors 690 in the surface of reflectors 630a, 630b may be, for example, about 10:1, about 20:1, about 30:1, about 40:1, about 50:1, about 60:1, about 70:1, about 80:1, about 90:1, about 100:1, about 110:1, about 120:1, or more than about 120:1. In some variations, mirrors 890 may be assembled from shorter length mirrors, having lengths as short as about 1 meter, positioned end to end.

Joints or gaps 895 between mirrors 890 may be non-reflective and hence cast dark "shadows" on the receivers. In some variations (as illustrated, for example), mirrors 890 are arranged to stagger positions of some or all of joints or gaps 895. In the illustrated example, joints or gaps between mirrors in adjacent rows of mirrors are not next to each other, i.e., they are staggered. Such staggering of joints or gaps between mirrors may spread the shadows cast by the joints or gaps along the receiver and consequently reduce the magnitude of any non-uniformity in the illumination of the receivers resulting from those shadows.

Although FIG. 20 shows trough solar energy collector 820 comprising particular numbers of receiver supports, reflector supports, posts, and flat mirrors, these components may be present in greater or lesser numbers than as shown. Also, although trough solar energy collector 820 in the illustrated example comprises two receivers 100 oriented to form a V shape, other variations may comprise instead one or more horizontally oriented receivers 100 running parallel to rotation axis 880.

FIG. 21A shows in plan view an example arrangement in which receivers 100a, 100b associated with a first solar energy 900a collector are fluidly coupled by a conduit 910 to receivers 100c, 100d associated with a second solar energy collector 900b. Receivers 100a and 100b may be arranged to form a V-shape, as may receivers 100c and 100d. FIG. 21B similarly shows in plan view an arrangement in which receiver 100e associated with a first solar energy collector 900a is fluidly coupled by a conduit 910 to receiver 100f associated with a second solar energy collector 900b. Receivers 100a-100f may be or comprise, for example, any suitable receiver disclosed herein. The solar energy collectors may be or comprise, for example, linear Fresnel or trough-type solar energy collectors. The details of the solar energy collectors (e.g., reflectors and other components) are not shown. Conduit 910 in these examples allows coolant from one solar energy collector to be transferred to the other for further heating, for example.

In some variations, conduit 910 is glazed, e.g., enclosed in a substantially transparent outer tube or shell 920, with an optional air gap between the conduit and the outer tube or shell. Tube or shell 920 may be formed, for example, from glass or plastic. Glazing conduit 910 may enhance retention of heat in coolant flowing through conduit 910, and may also provide for further collection of heat from solar radiation incident on conduit 910. In some variations in which conduit 910 is glazed, conduit 910 is coated, painted (e.g., with black paint) or otherwise treated to increase absorption of solar radiation. Such treating, coating, or painting of conduit 910 to increase absorption of solar radiation may also be utilized in variations in which conduit 910 is not glazed.

In some variations, conduit 910 is insulated to enhance retention of heat. Any suitable insulation may be used.

In some variations, conduit 910 is a straight connection (e.g., as shown) between adjacent solar energy collectors, with the conduit located at approximately the height of the receivers to which it connects and thus at approximately the height of linear foci of the reflectors in the solar energy collectors. In such variations, concentrated solar radiation may be incident on and absorbed by conduit 910. In some such variations, solar energy collectors 900a, 900b are configured and oriented such that, over time (e.g., during the course of a day or a year), solar radiation concentrated by reflectors in the solar energy collectors walks onto conduit 910 or off of conduit 910. This can occur, for example, as the angle of the sun above the horizon varies during the course of a day or a year and the linear foci of reflectors oriented in a North-South direction moves along a North-South axis. In some variations, conduit 910 may receive greater concentrated solar radiation during the winter than during the summer. In some variations, as the angle of the sun above the horizon decreases (e.g., during the course of a day or a year), concentrated solar radiation walks off conduit 910 onto an adjacent end of a receiver.

Receivers as disclosed herein comprising solar cells may be used in combination with inverters that convert DC current generated by the solar cells to AC current and/or with DC to DC converters. In some variations, DC current from two or more receivers is aggregated and converted to AC current by a single central inverter, which also chooses a working power (voltage-current) point to maximize aggregated power produced by the system. Suitable central inverters may include, for example, central inverters available from Xantrex Technologies, Inc., PV Powered, Inc., and Solectria Renewables LLC.

In some variations, one or more receivers as disclosed herein each comprise a microinverter that converts DC current generated in the individual receiver to AC current, and chooses a working point to maximize power produced by the individual receiver. Suitable microinverters may include, for example, microinverters available from Enphase Energy, Inc., and Solar Bridge Technologies, Inc.

In some variations, one or more receivers as disclosed herein each comprise a DC to DC converter that converts DC current generated in the individual receiver at one voltage level to current at another voltage level. The DC to DC converters may be electrically coupled to, and optionally controlled by, a central inverter that converts aggregated DC current from the DC to DC converters to AC current. The DC to DC converters and central receiver together choose working points for the receivers to maximize aggregated power produced by the system. Suitable DC to DC converters may include, for example, DC to DC converters available from SolarEdge Technologies, Inc.

In some variations, a solar energy collector comprises two or more receivers on which different intensities of concentrated solar radiation may be incident during operation. For example, in some variations a solar energy collector comprises two or more receivers mechanically coupled to form a V-shape, as disclosed above, with each receiver illuminated by a different reflector or set of reflectors and consequently possibly illuminated by different intensities of solar radiation. In some such variations, each receiver comprises a different microinverter, or is connected to a different central inverter, than the other.

This disclosure is illustrative and not limiting. Further modifications will be apparent to one skilled in the art in light of this disclosure and are intended to fall within the scope of the appended claims. U.S. patent application Ser. No. 12/622, 416 titled "Receiver For Concentrating Photovoltaic-Thermal System" is incorporated herein by reference in its entirety. All other publications and patent applications cited in the specification are also incorporated herein by reference in their entirety.

What is claimed is:

1. A solar energy collector comprising:
a rotation shaft,
a reflector comprising a plurality of linearly elongated flat mirrors having their long axes oriented parallel to the rotation shaft and supported by supports extending transversely from the rotation shaft to approximate a parabolic trough, the reflector having a linear focus oriented parallel to the rotation shaft; and
a linearly elongated receiver oriented with its long axis parallel to the rotation shaft and fixed in position with respect to the reflector above the rotation shaft, the linearly elongated receiver comprising a linearly elongated substrate having front and rear flat surfaces on opposite sides of the substrate with the front surface oriented horizontally above the rotation shaft at or at about the linear focus of the trough reflector and facing the reflector, a plurality of solar cells disposed on the front surface of the substrate, and one or more coolant channels extending through the substrate parallel to the receiver's long axis;
wherein the reflector and the receiver rotate together about a pivot axis defined by the rotation shaft to orient the reflector to concentrate solar radiation onto the solar cells.

2. The solar energy collector of claim 1, comprising thermal insulation disposed on the back surface of the substrate.

3. The solar energy collector of claim 2, comprising a layer of material substantially transparent to solar radiation adjacent to and spaced apart from the solar cells to form an insulating air gap.

4. The solar energy collector of claim 3, wherein a portion of the front surface of the substrate does not comprise solar cells, and at least some of that portion is coated, painted, or otherwise treated to increase absorption of solar radiation.

5. The solar energy collector of claim 2, wherein a portion of the front surface of the substrate does not comprise solar cells, and at least some of that portion is coated, painted, or otherwise treated to increase absorption of solar radiation.

6. The solar energy collector of claim 1, comprising a layer of material substantially transparent to solar radiation disposed adjacent to and spaced apart from the rear surface of the substrate to form an insulating air gap.

7. The solar energy collector of claim 6, comprising a layer of material substantially transparent to solar radiation disposed adjacent to and spaced apart from the solar cells to form an insulating air gap.

8. The solar energy collector of claim 6, wherein the rear surface is coated, painted, or otherwise treated to increase absorption of solar radiation.

9. The solar energy collector of claim 8, comprising a layer of material substantially transparent to solar radiation disposed adjacent to and spaced apart from the solar cells to form an insulating air gap.

10. The solar energy collector of claim 9, wherein a portion of the front surface does not comprise solar cells, and at least some of that portion is coated, painted, or otherwise treated to increase absorption of solar radiation.

11. The solar energy collector of claim 6, wherein a portion of the front surface does not comprise solar cells, and at least some of that portion is coated, painted, or otherwise treated to increase absorption of solar radiation.

12. The solar energy collector of claim 1, wherein the rear surface is coated, painted, or otherwise treated to increase absorption of solar radiation.

13. The solar energy collector of claim 12, comprising a layer of material substantially transparent to solar radiation disposed adjacent to and spaced apart from the solar cells to form an insulating air gap.

14. The solar energy collector of claim 13, wherein a portion of the front surface does not comprise solar cells, and at least some of that portion is coated, painted, or otherwise treated to increase absorption of solar radiation.

15. The solar energy collector of claim 12, wherein a portion of the front surface does not comprise solar cells, and at least some of that portion is coated, painted, or otherwise treated to increase absorption of solar radiation.

16. The solar energy collector of claim 1, comprising a layer of material substantially transparent to solar radiation disposed adjacent to and spaced apart from the solar cells to form an insulating air gap, wherein a portion of the front surface of the substrate does not comprise solar cells, and at least some of that portion is coated, painted, or otherwise treated to increase absorption of solar radiation.

17. The solar energy collector of claim 1, wherein a portion of the front surface of the substrate does not comprise solar cells, and at least some of that portion is coated, painted, or otherwise treated to increase absorption of solar radiation.

18. The solar energy collector of claim 17, wherein the plurality of solar cells comprises a first string of solar cells and a second string of solar cells disposed on the front surface of the substrate with a gap between the first string and the second string, and at least a portion of the surface in the gap is coated, painted, or otherwise treated to increase absorption of solar radiation.

19. The solar energy collector of claim 1, wherein the solar cells comprise electrical contacts that are illuminated by concentrated solar radiation in operation of the solar energy collector, wherein some or all of the electrical contacts are coated, painted, or otherwise treated to increase absorption of solar radiation.

20. The solar energy collector of claim 19, wherein a portion of the front surface of the substrate does not comprise solar cells, and at least some of that portion is coated, painted, or otherwise treated to increase absorption of solar radiation.

21. The solar energy collector of claim 20, comprising a layer of material substantially transparent to solar radiation disposed adjacent to and spaced apart from the solar cells to form an insulating air gap.

22. The solar energy collector of claim 19, comprising a layer of material substantially transparent to solar radiation disposed adjacent to and spaced apart from the solar cells to form an insulating air gap.

* * * * *